(12) United States Patent
Ju et al.

(10) Patent No.: US 11,296,081 B2
(45) Date of Patent: Apr. 5, 2022

(54) INTEGRATION OF SILICON CHANNEL NANOSTRUCTURES AND SILICON-GERMANIUM CHANNEL NANOSTRUCTURES

(71) Applicant: Taiwan Semiconductor Manufacturing Company Limited, Hsinchu (TW)

(72) Inventors: Shi Ning Ju, Hsinchu (TW); Kuo-Cheng Chiang, Zhubei (TW); Chih-Hao Wang, Baoshan Township (TW); Kuan-Lun Cheng, Hsinchu (TW); Guan-Lin Chen, Baoshan Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/910,488

(22) Filed: Jun. 24, 2020

(65) Prior Publication Data
US 2021/0407993 A1    Dec. 30, 2021

(51) Int. Cl.
| H01L 27/088 | (2006.01) |
| H01L 29/417 | (2006.01) |
| H01L 29/78 | (2006.01) |
| H01L 29/16 | (2006.01) |
| H01L 29/06 | (2006.01) |
| H01L 29/66 | (2006.01) |

(52) U.S. Cl.
CPC ...... *H01L 27/0886* (2013.01); *H01L 29/0653* (2013.01); *H01L 29/0665* (2013.01); *H01L 29/16* (2013.01); *H01L 29/41791* (2013.01); *H01L 29/66795* (2013.01); *H01L 29/785* (2013.01); *H01L 2029/7858* (2013.01)

(58) Field of Classification Search
CPC ........... H01L 29/785; H01L 2029/7858; H01L 29/0653; H01L 29/78696; H01L 29/42392
See application file for complete search history.

(56) References Cited

U.S. PATENT DOCUMENTS

2017/0194480 A1 *   7/2017   Chen ................ H01L 29/66545

* cited by examiner

*Primary Examiner* — Changhyun Yi
(74) *Attorney, Agent, or Firm* — The Marbury Law Group, PLLC

(57) ABSTRACT

A first gate-all-around (GAA) transistor and a second GAA transistor may be formed on a substrate. The first GAA transistor includes at least one silicon plate, a first gate structure, a first source region, and a first drain region. The second GAA transistor includes at least one silicon-germanium plate, a second gate structure, a second source region, and a second drain region. The first GAA transistor may be an n-type field effect transistor, and the second GAA transistor may be a p-type field effect transistor. The gate electrodes of the first gate structure and the second gate structure may include a same conductive material. Each silicon plate and each silicon-germanium plate may be single crystalline and may have a same crystallographic orientation for each Miller index.

20 Claims, 67 Drawing Sheets

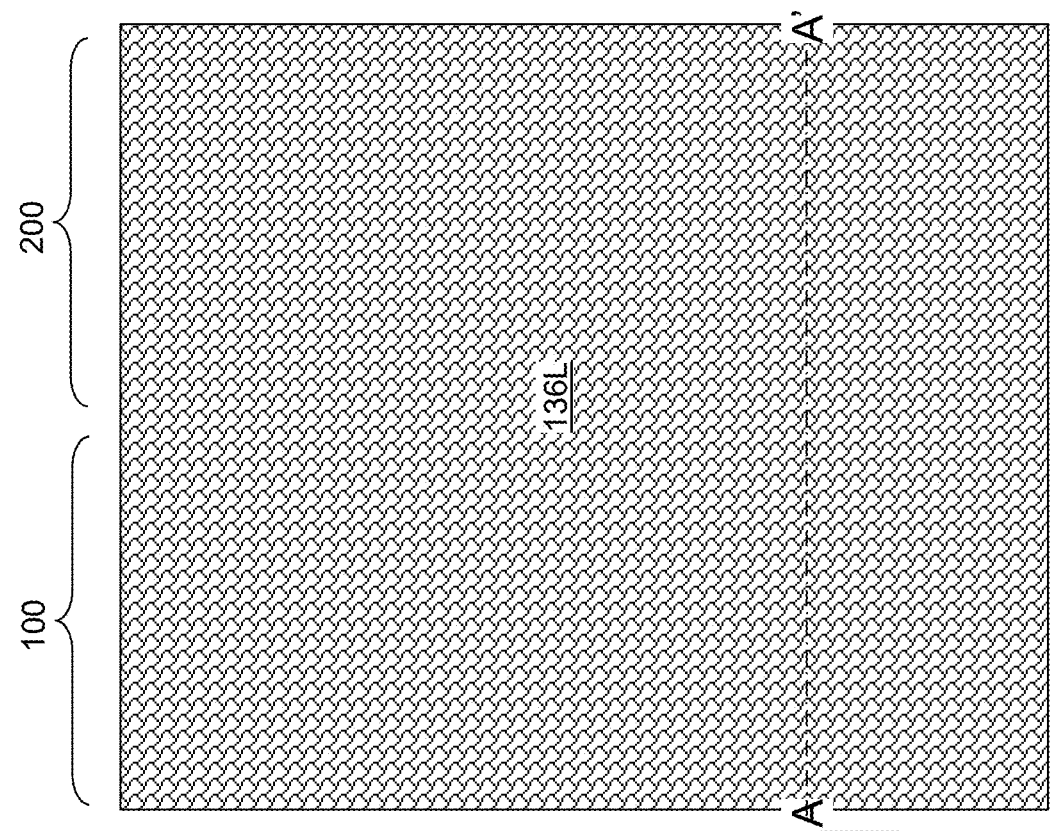
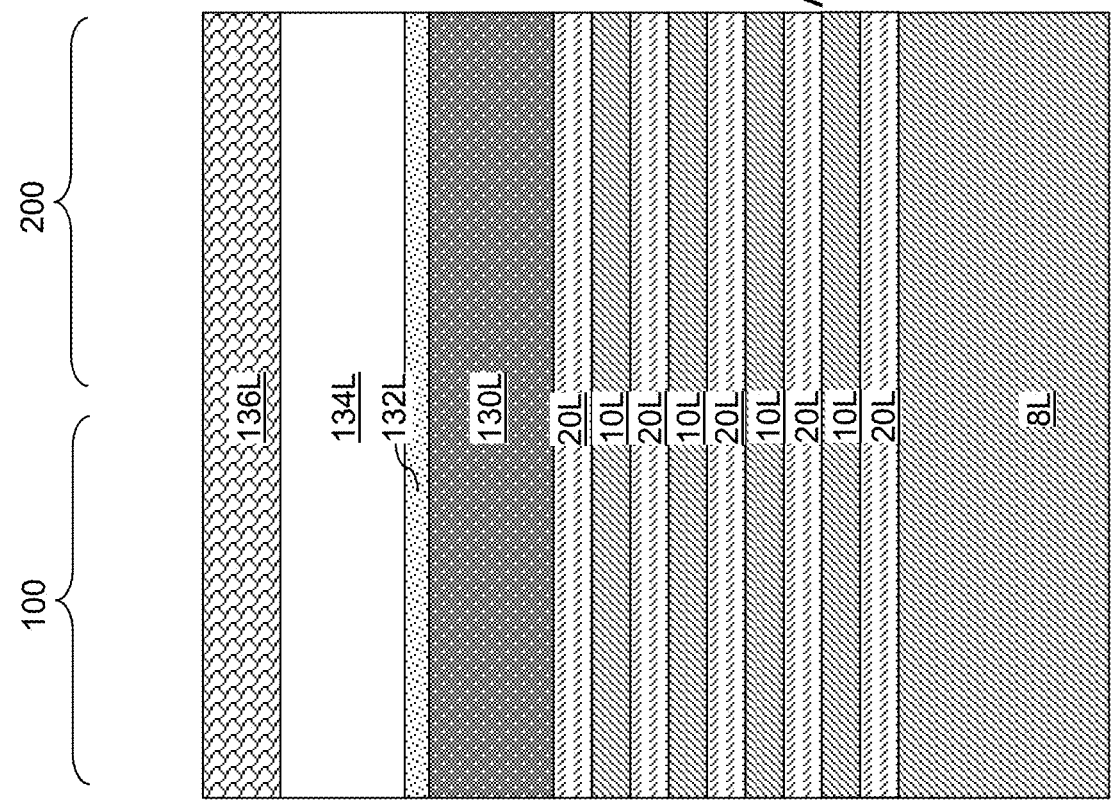

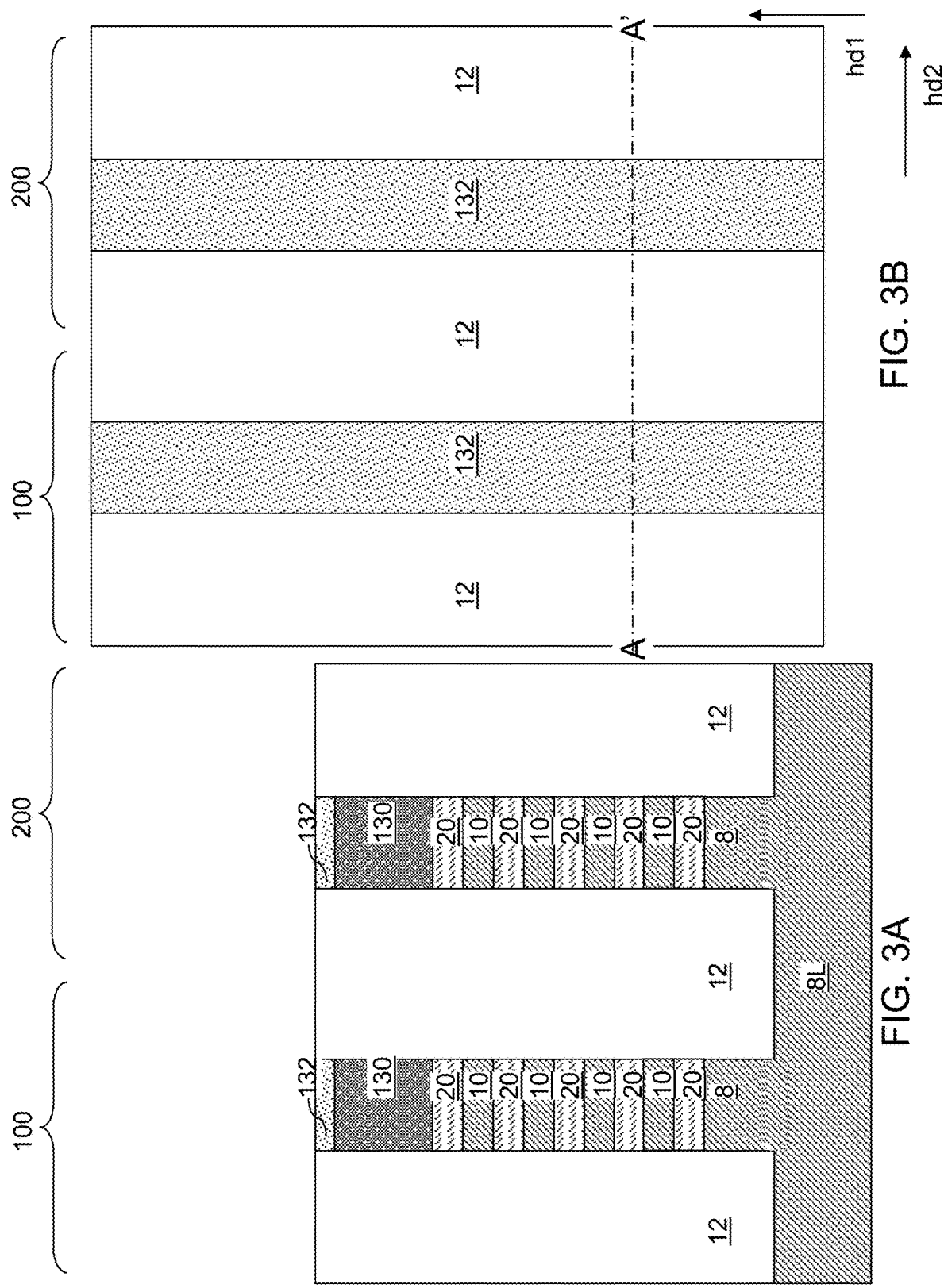

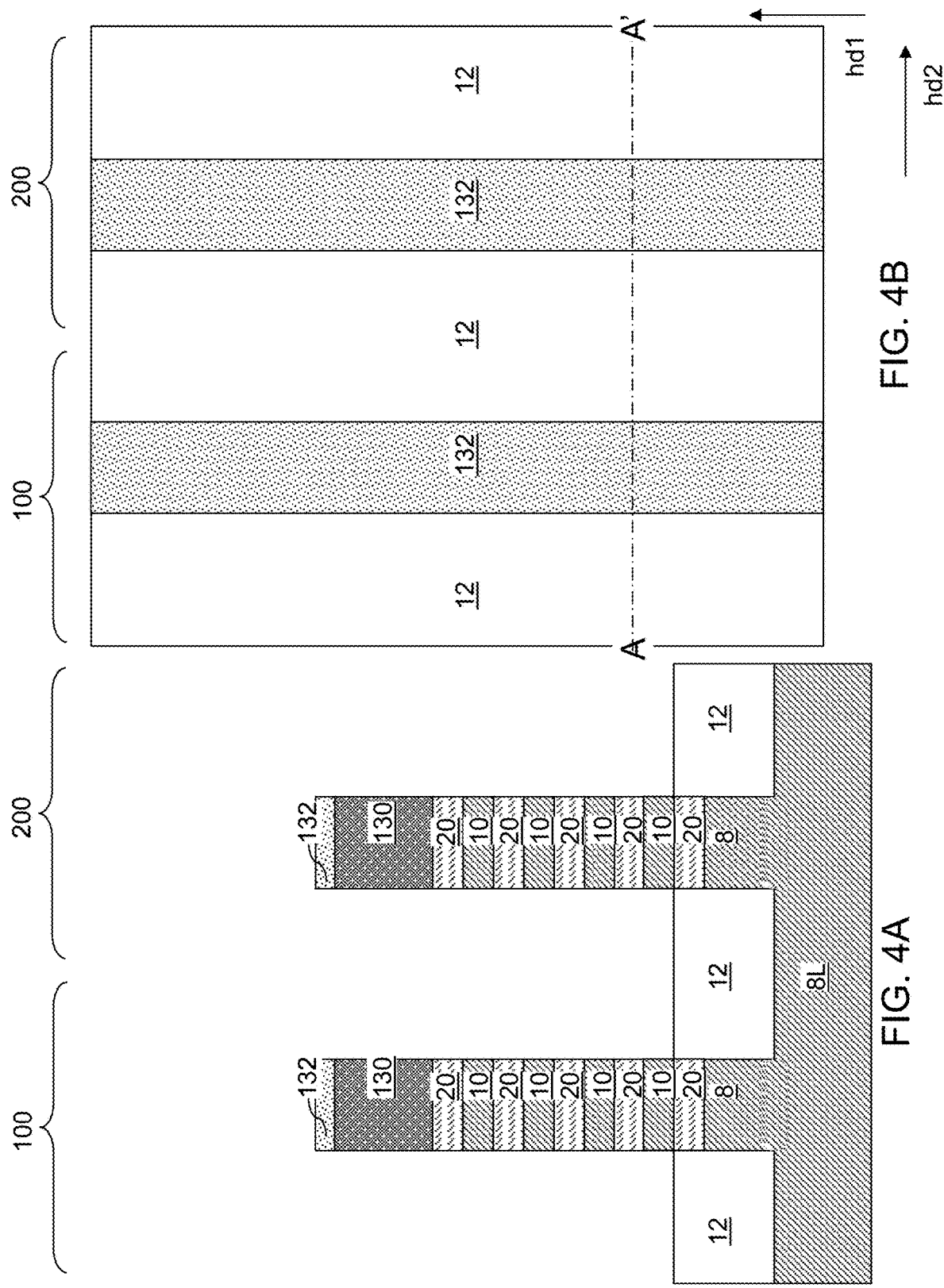

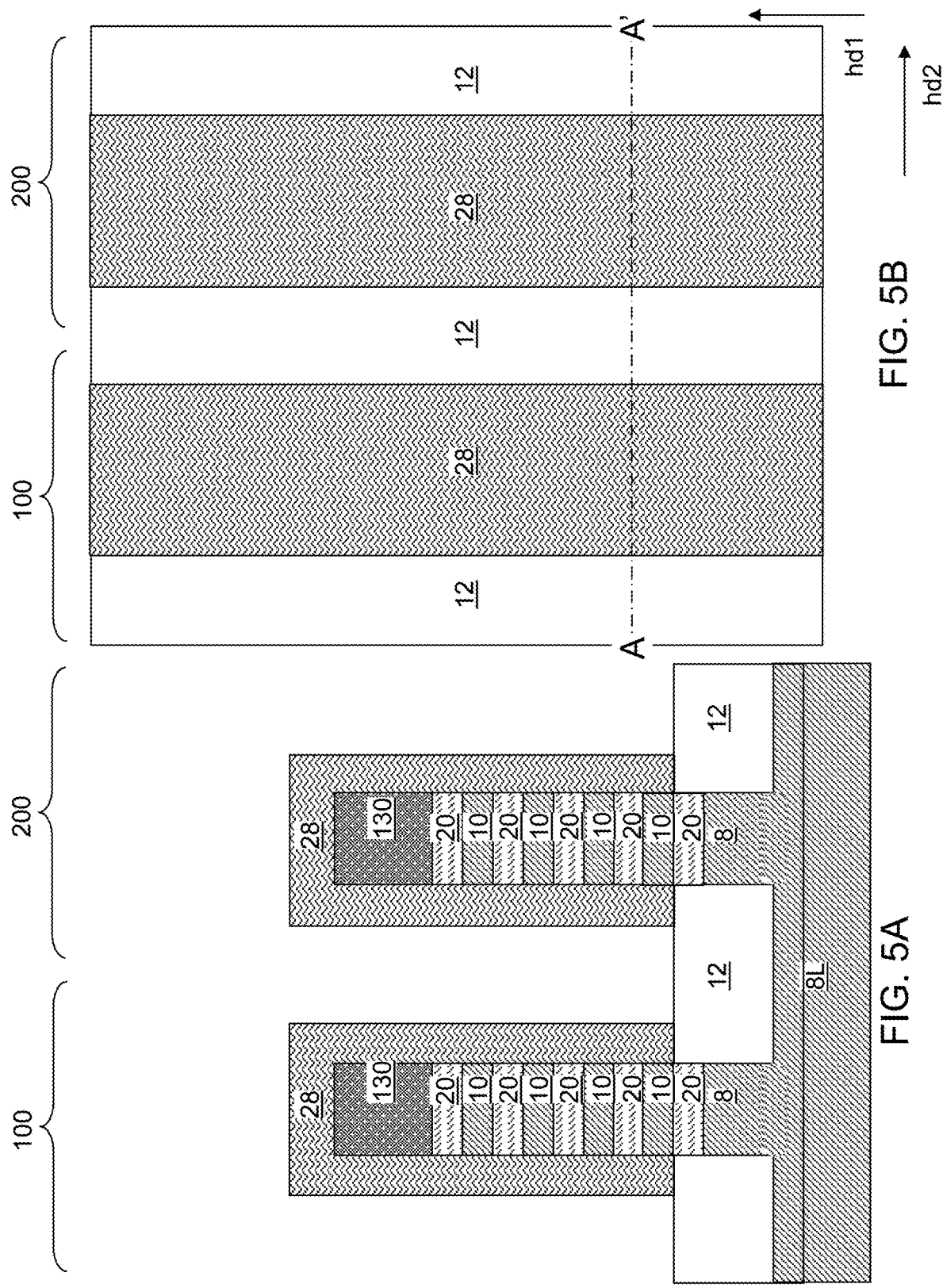

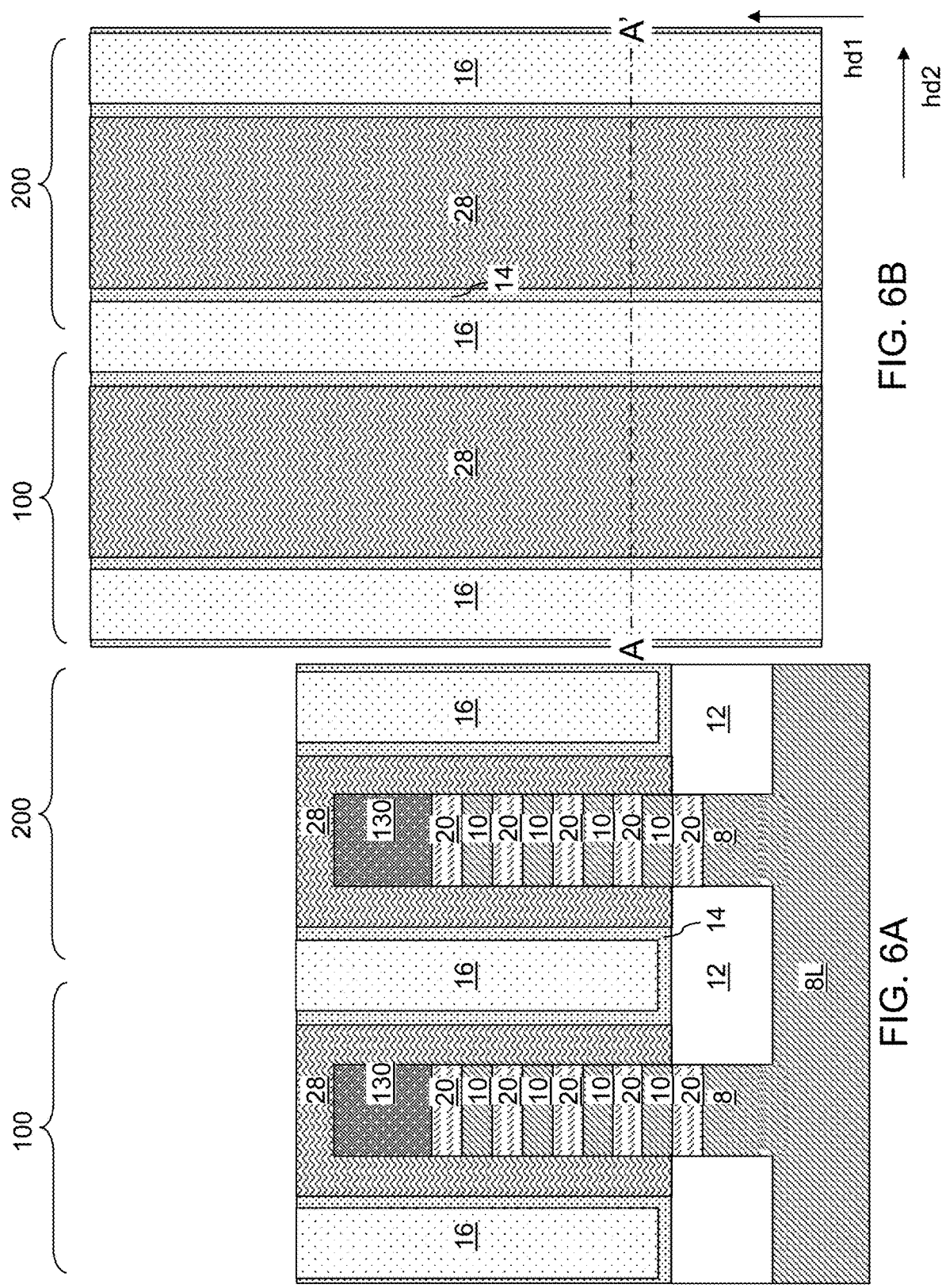

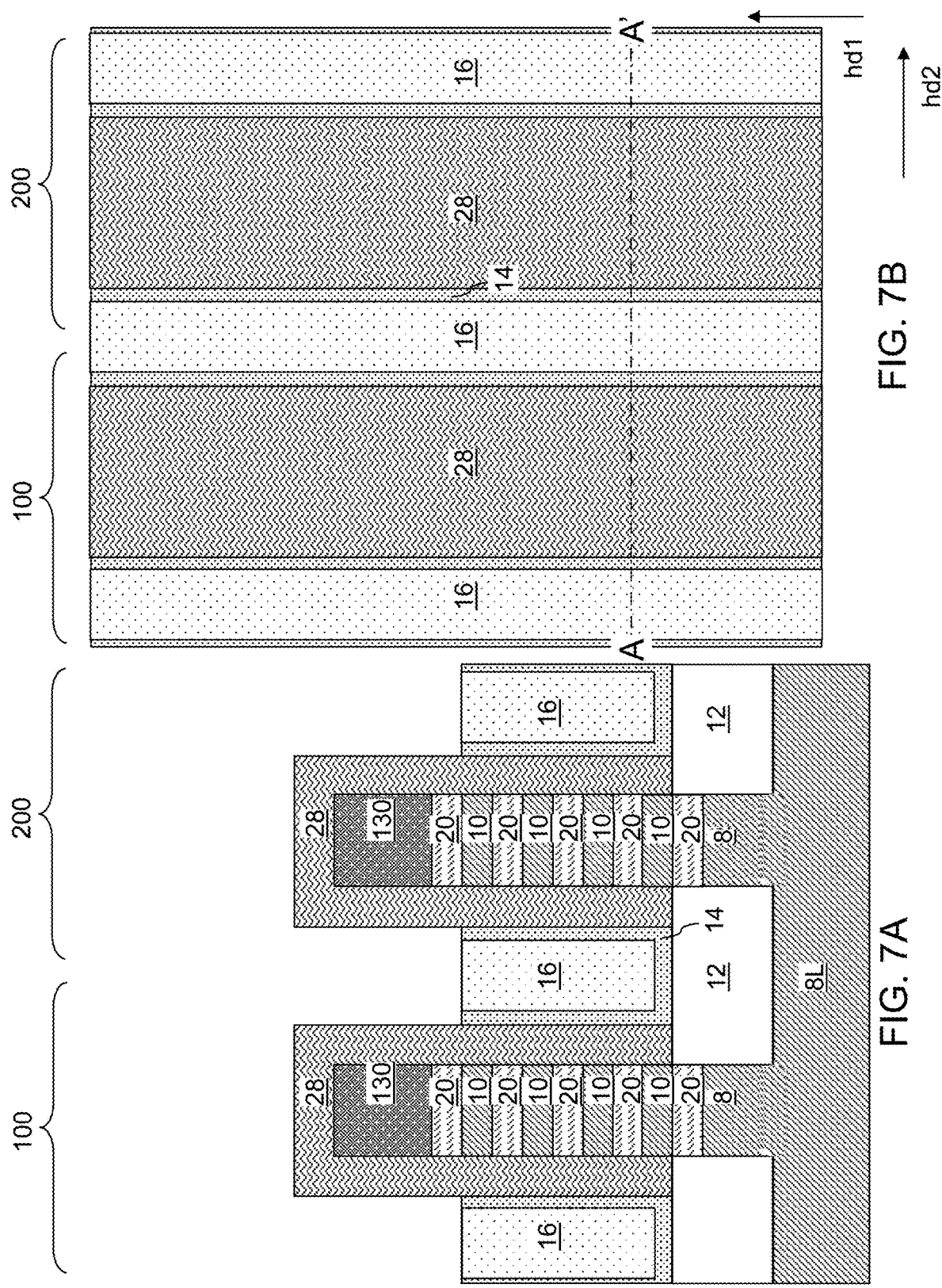

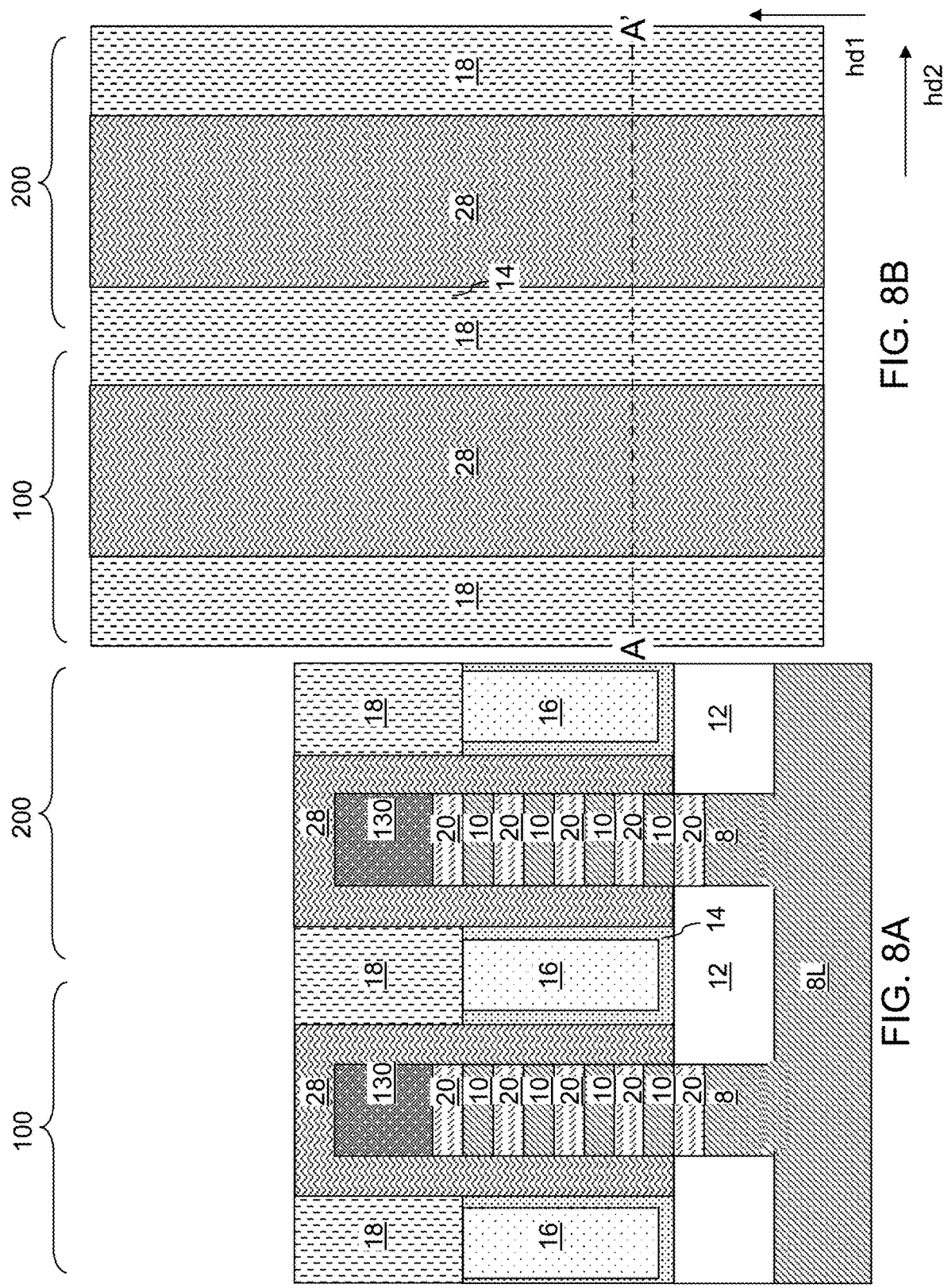

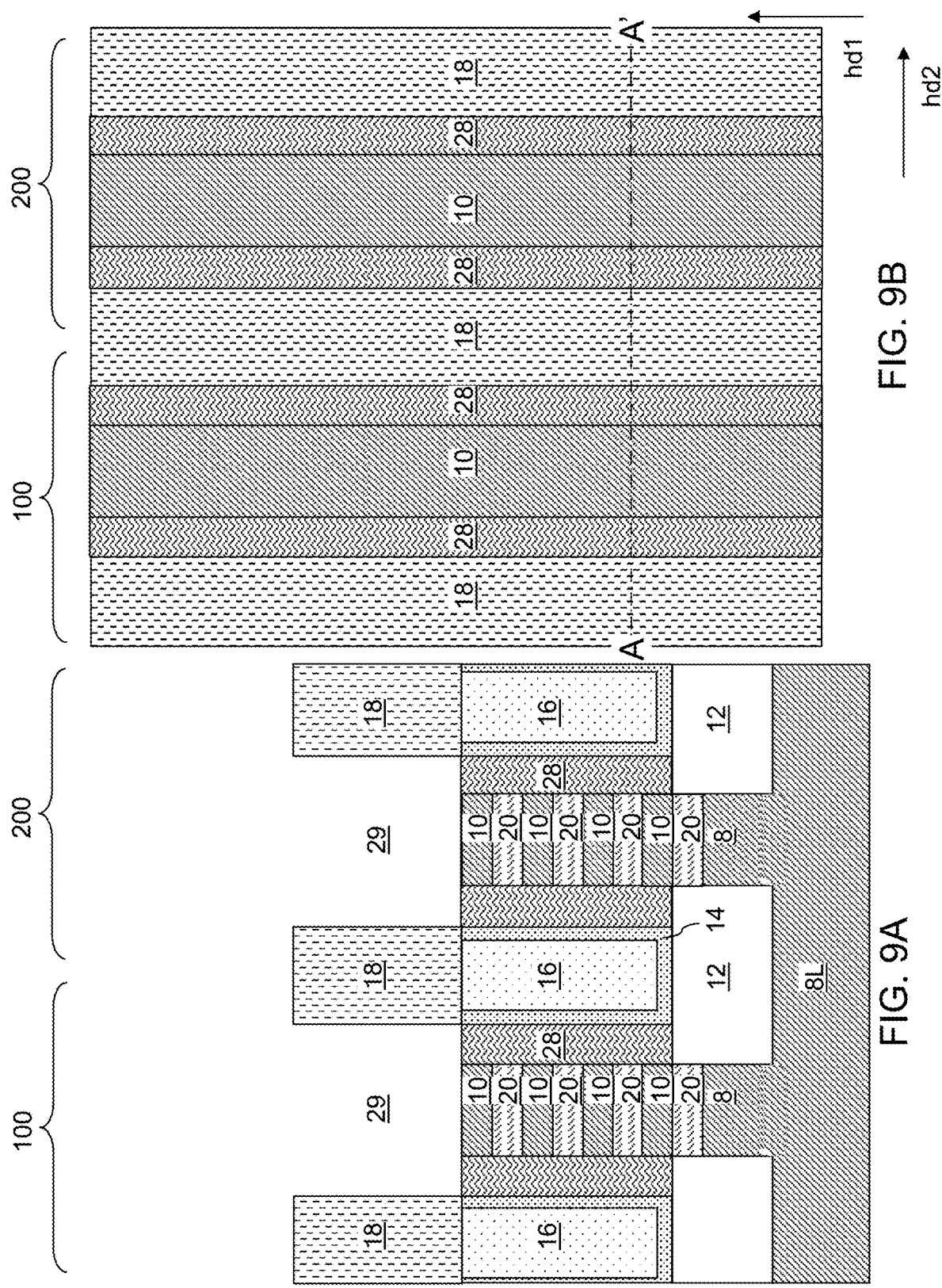

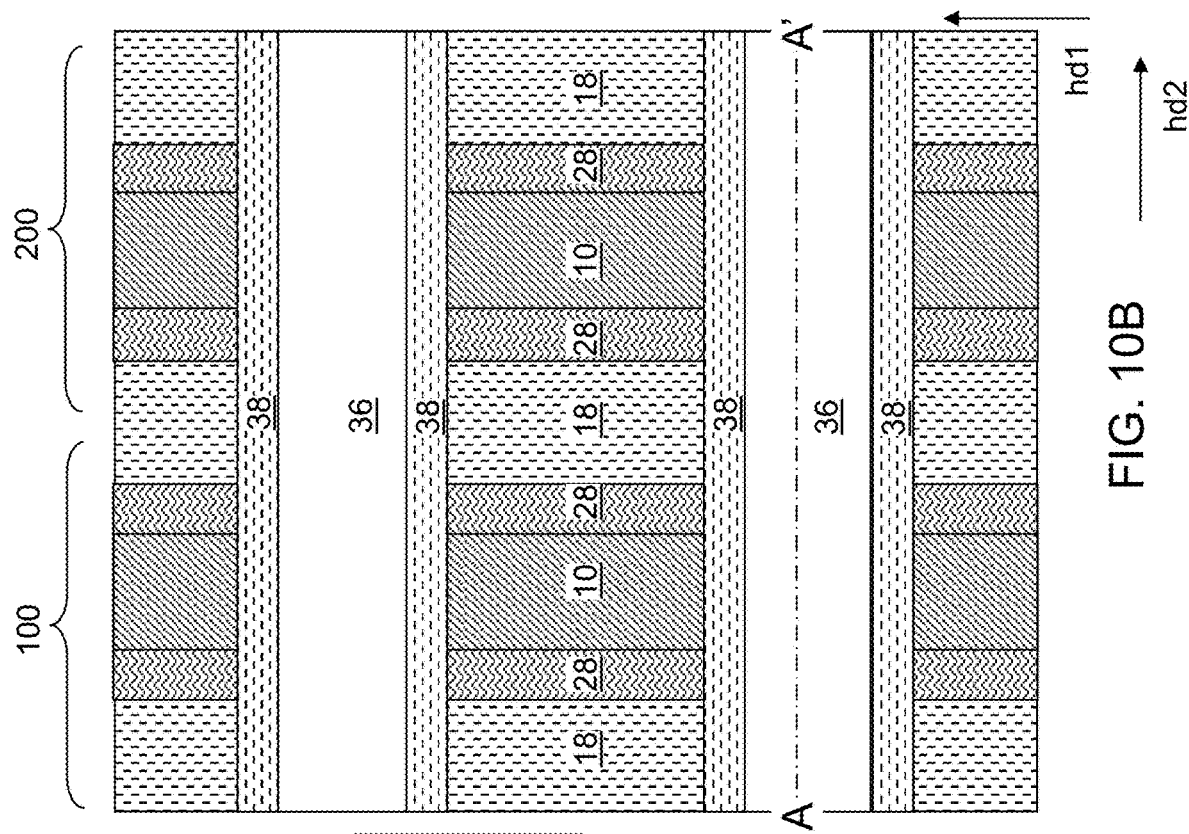
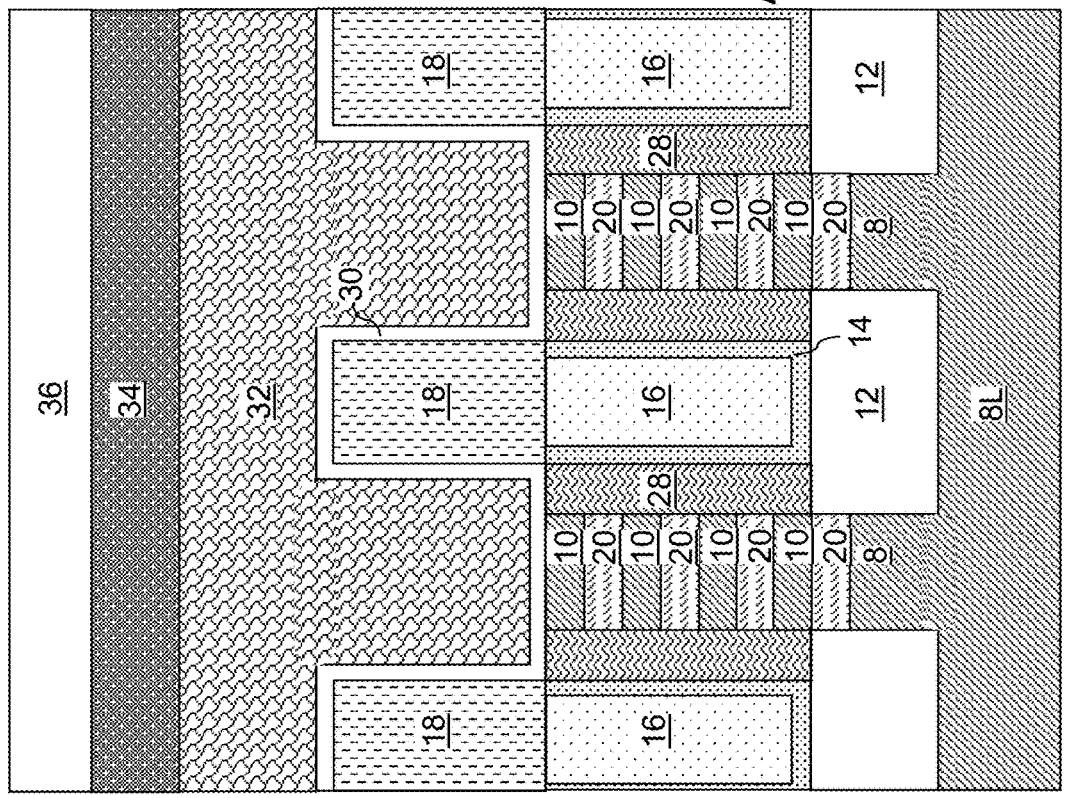
FIG. 10A
FIG. 10B

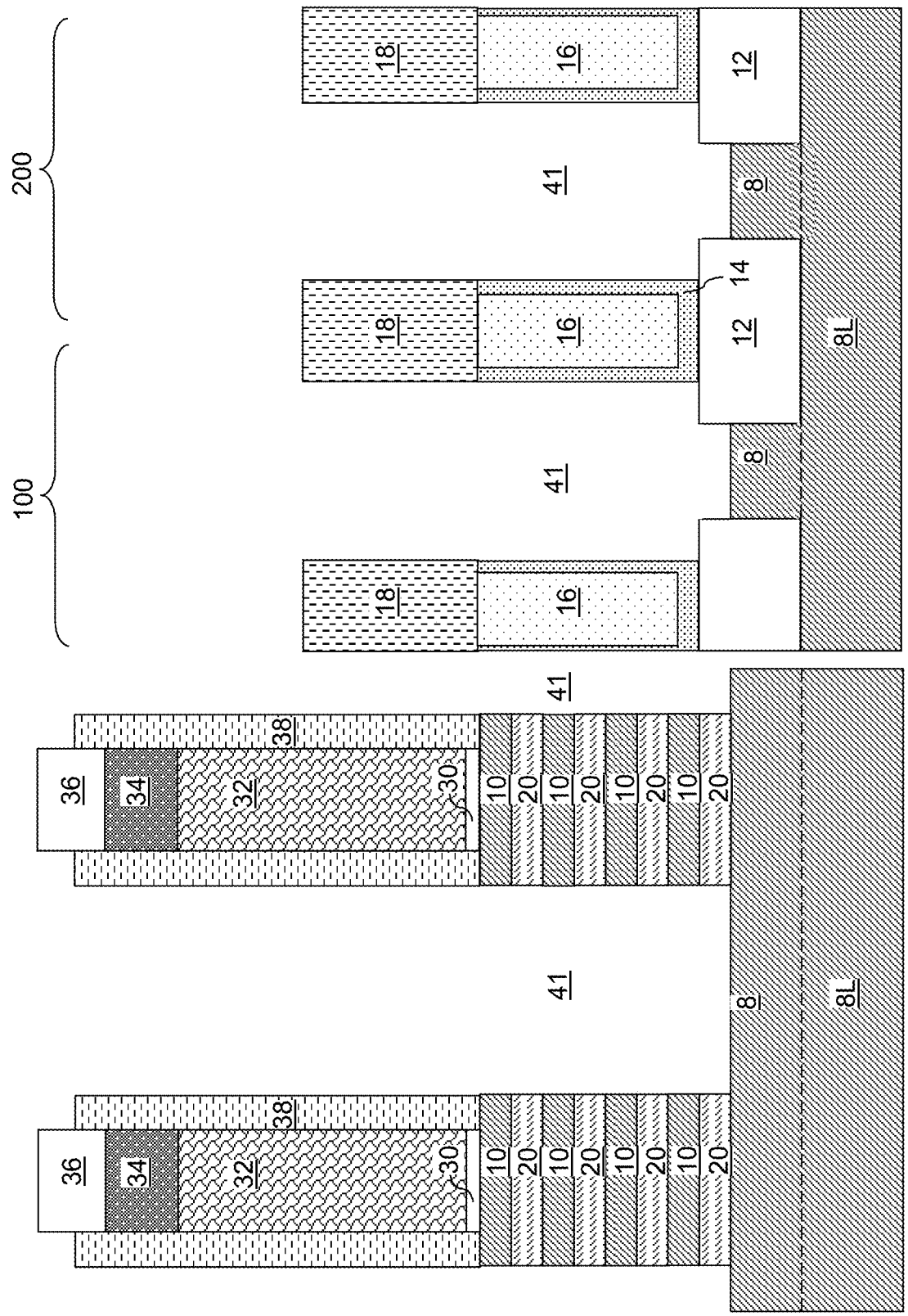

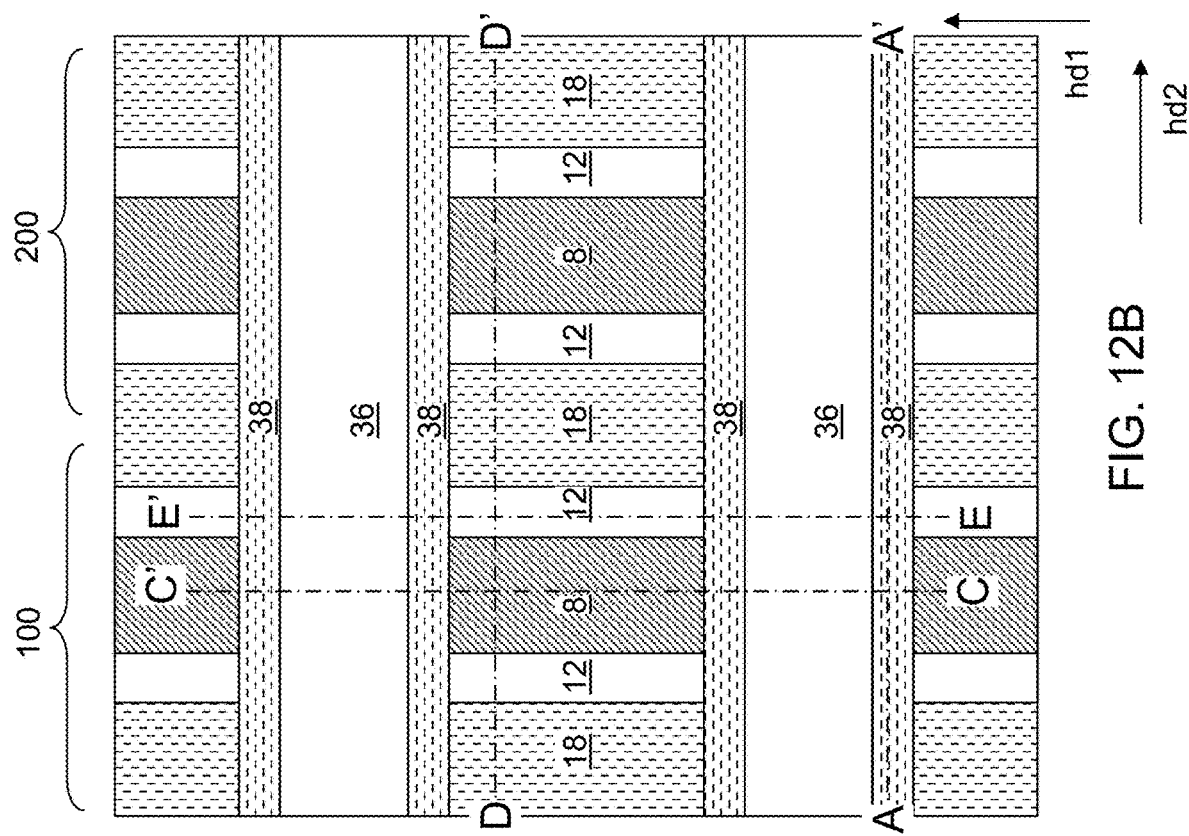
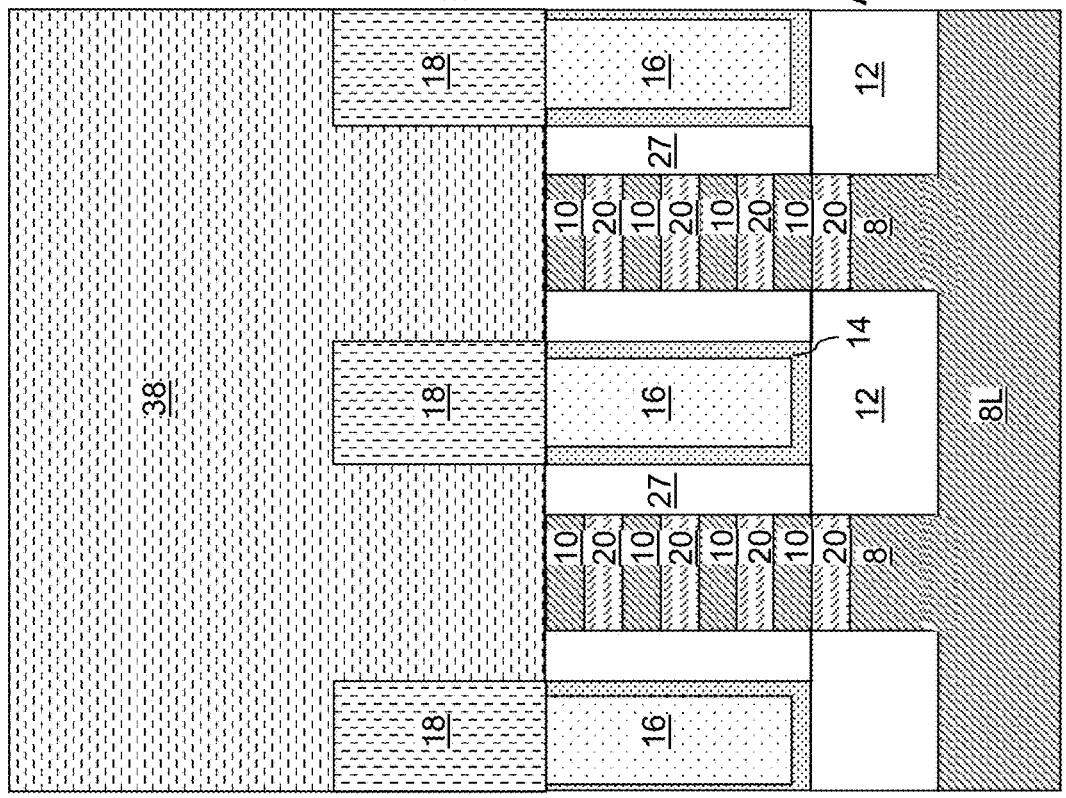
FIG. 12B
FIG. 12A

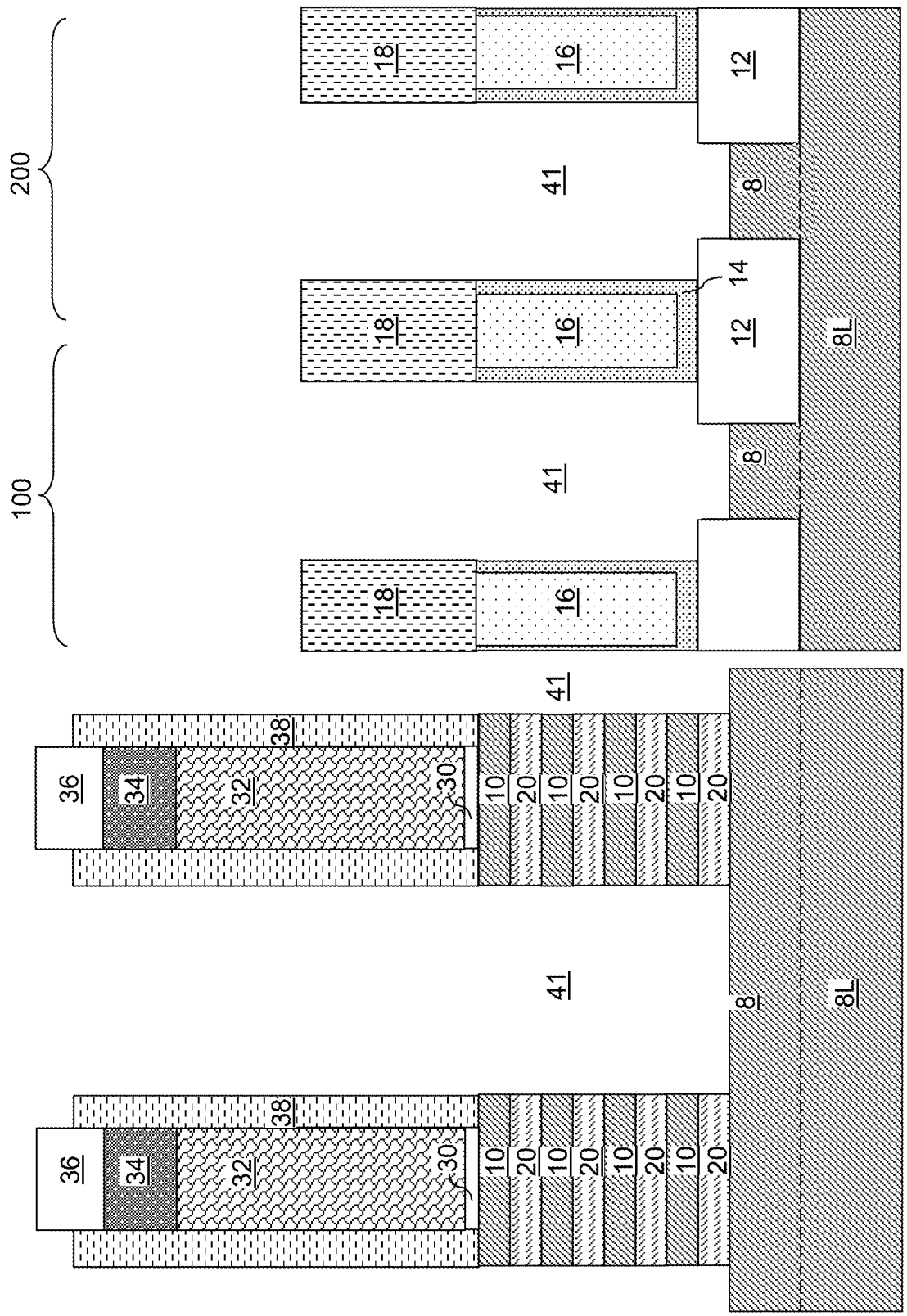

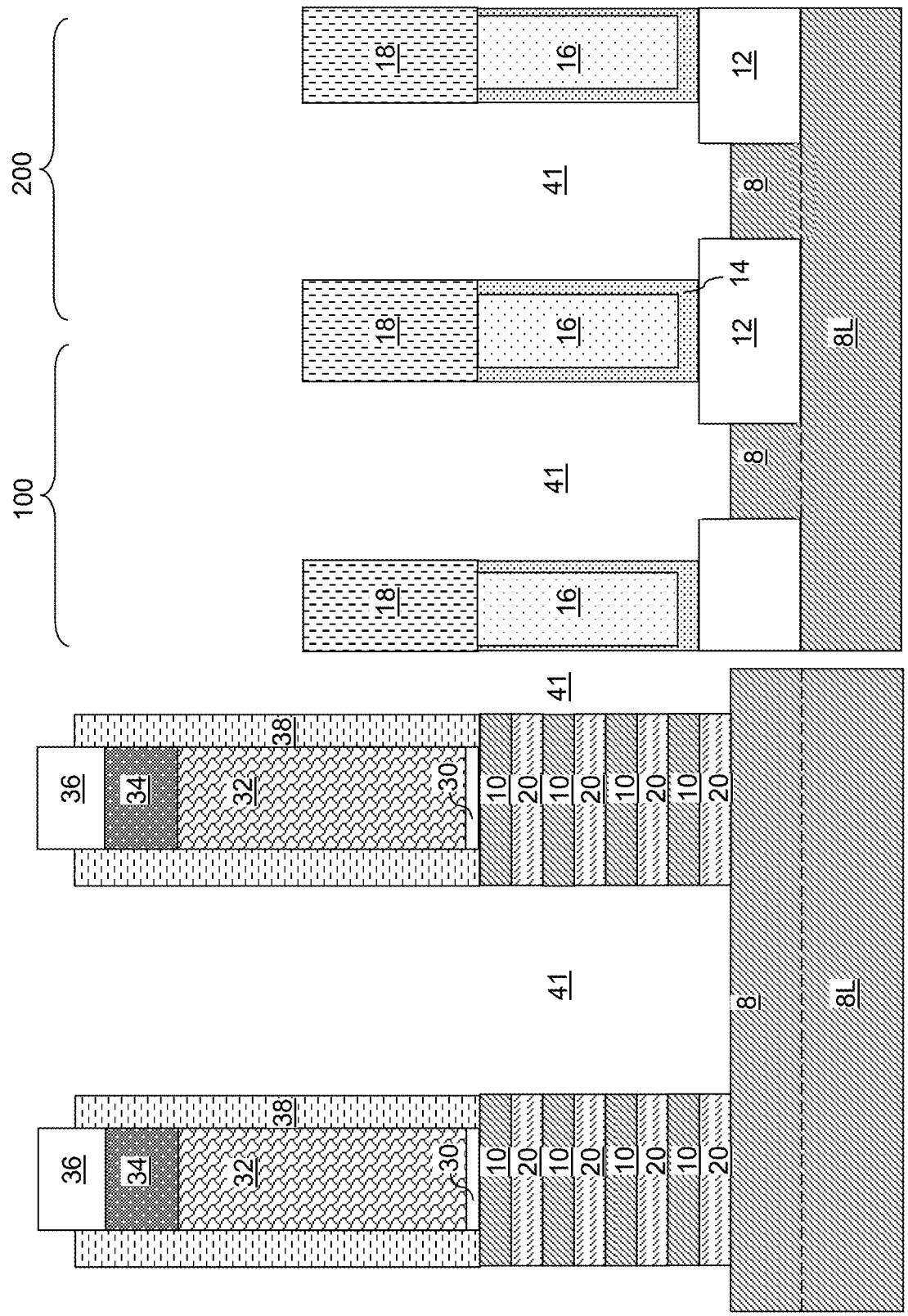

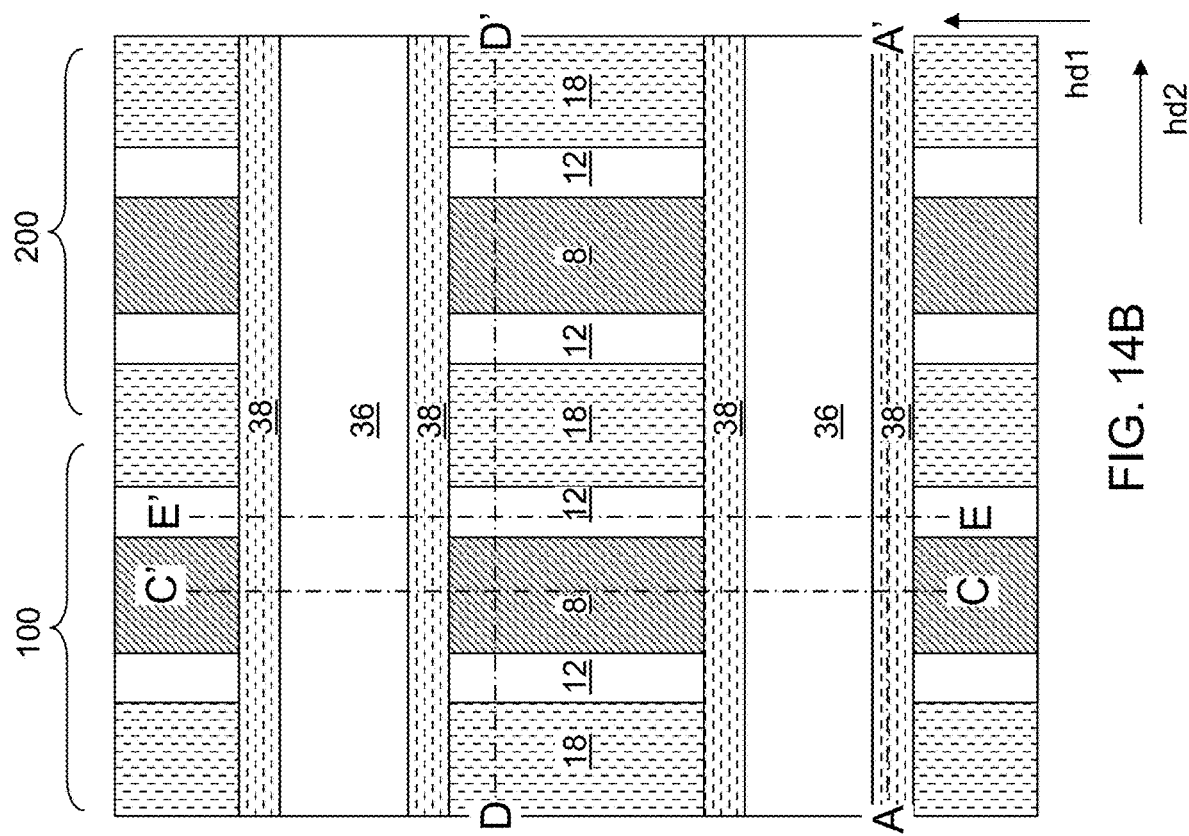
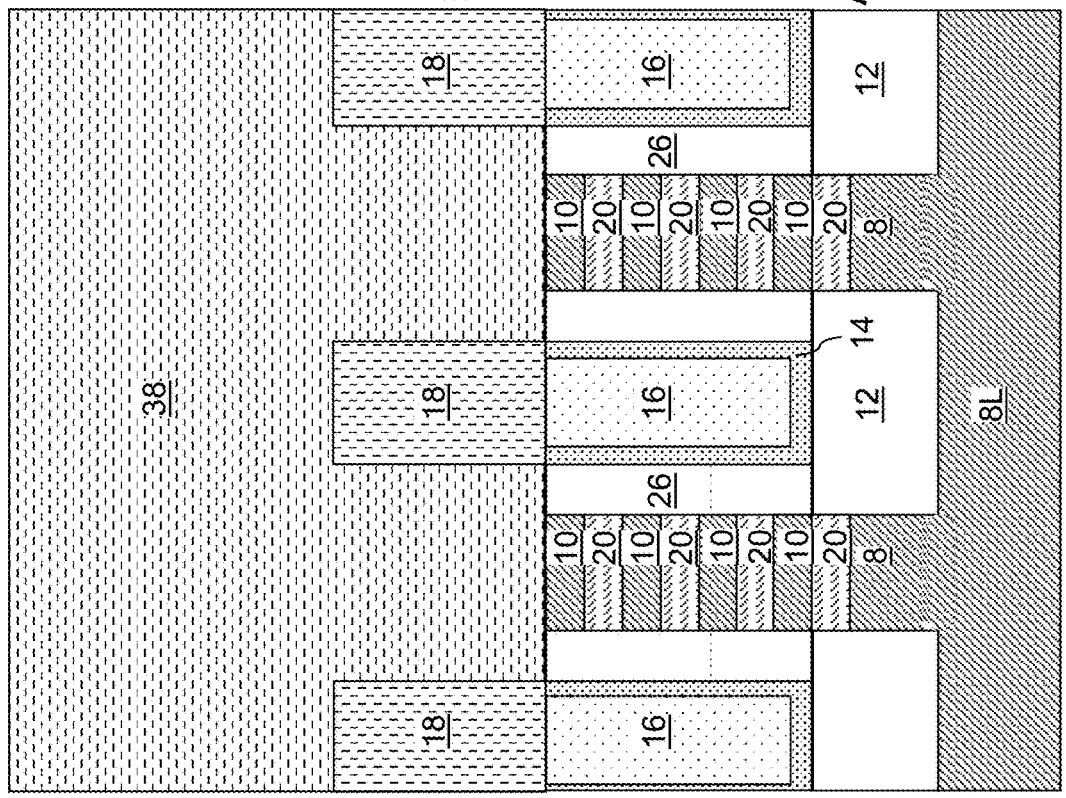
FIG. 14B
FIG. 14A

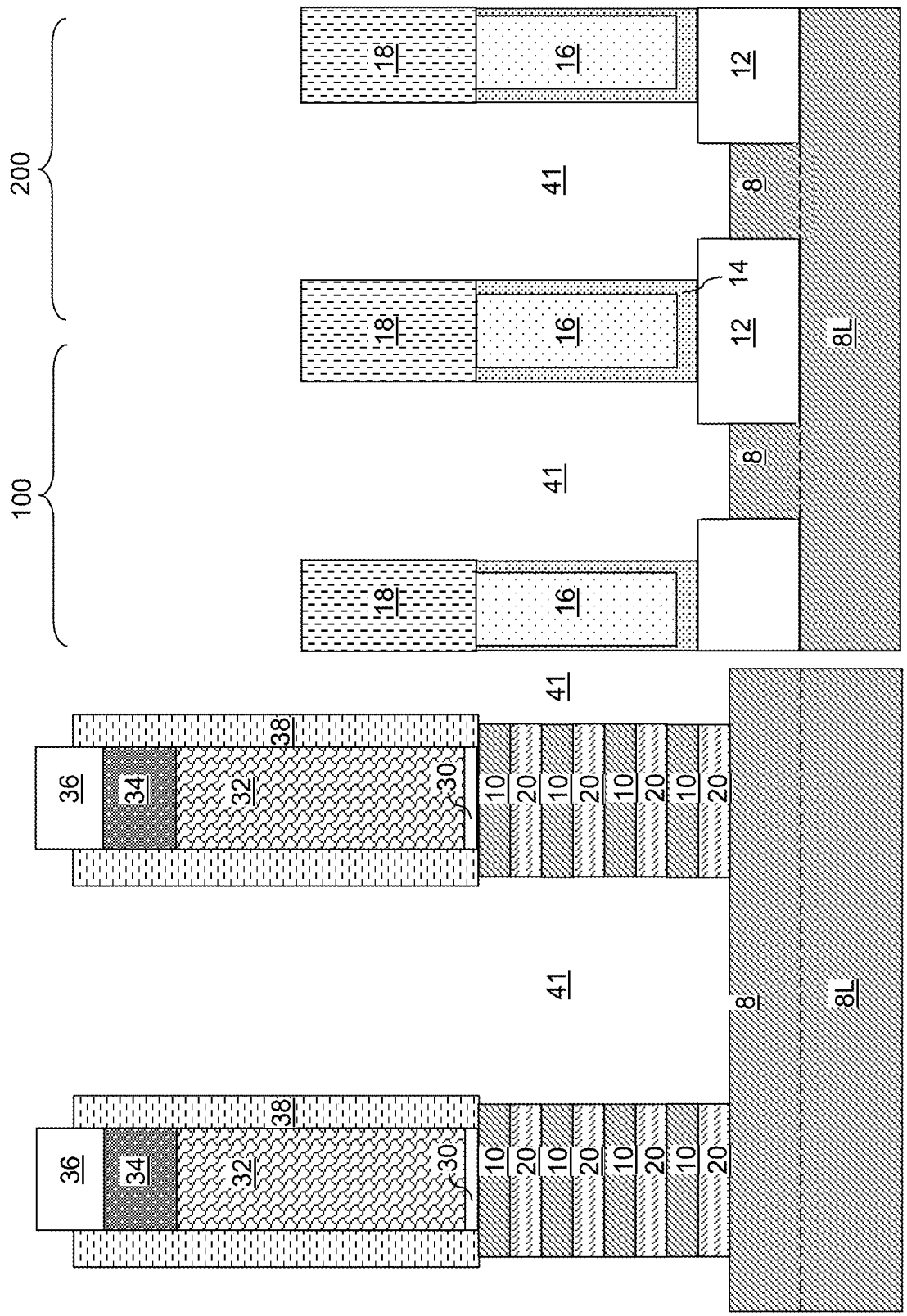

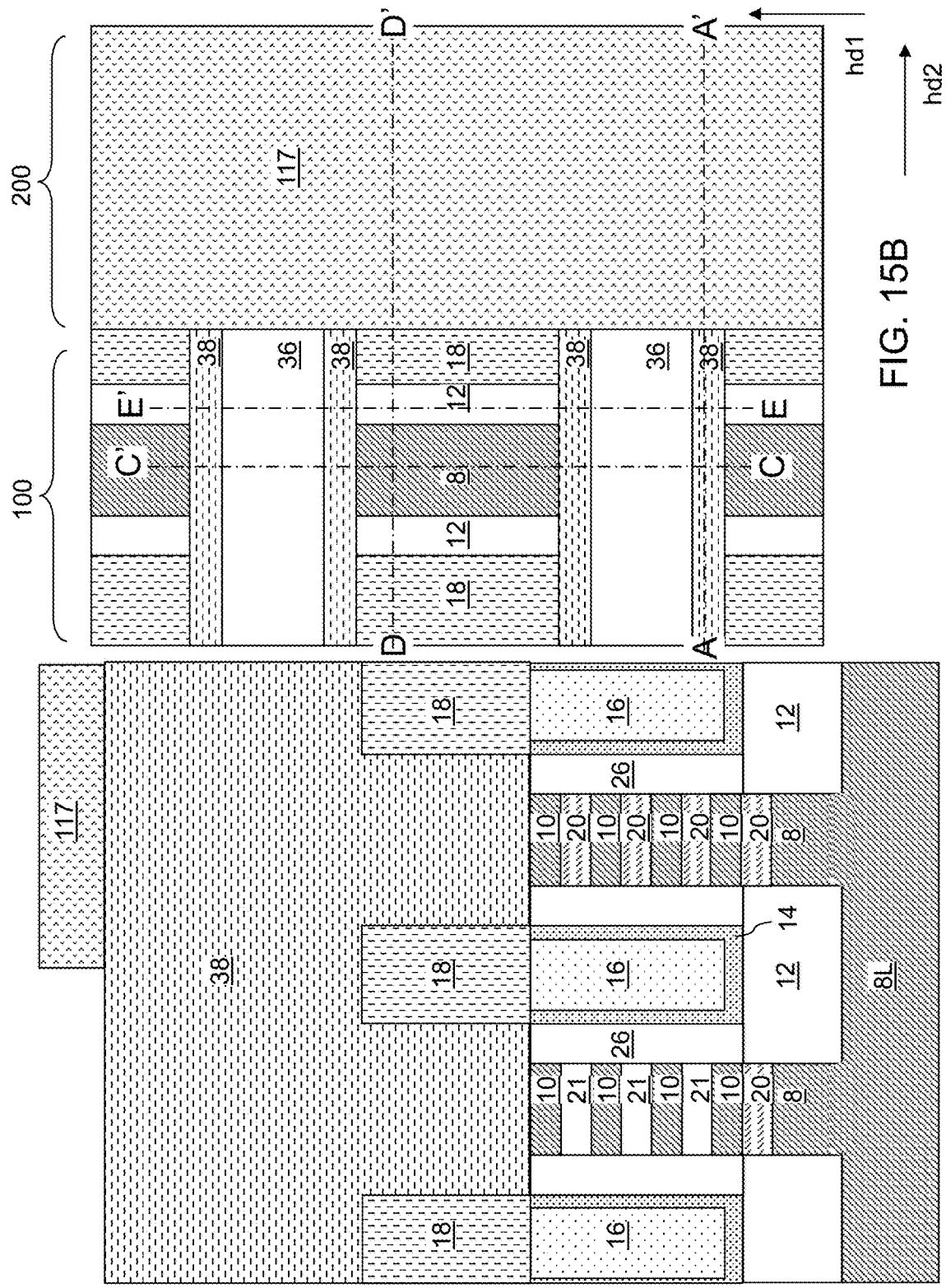

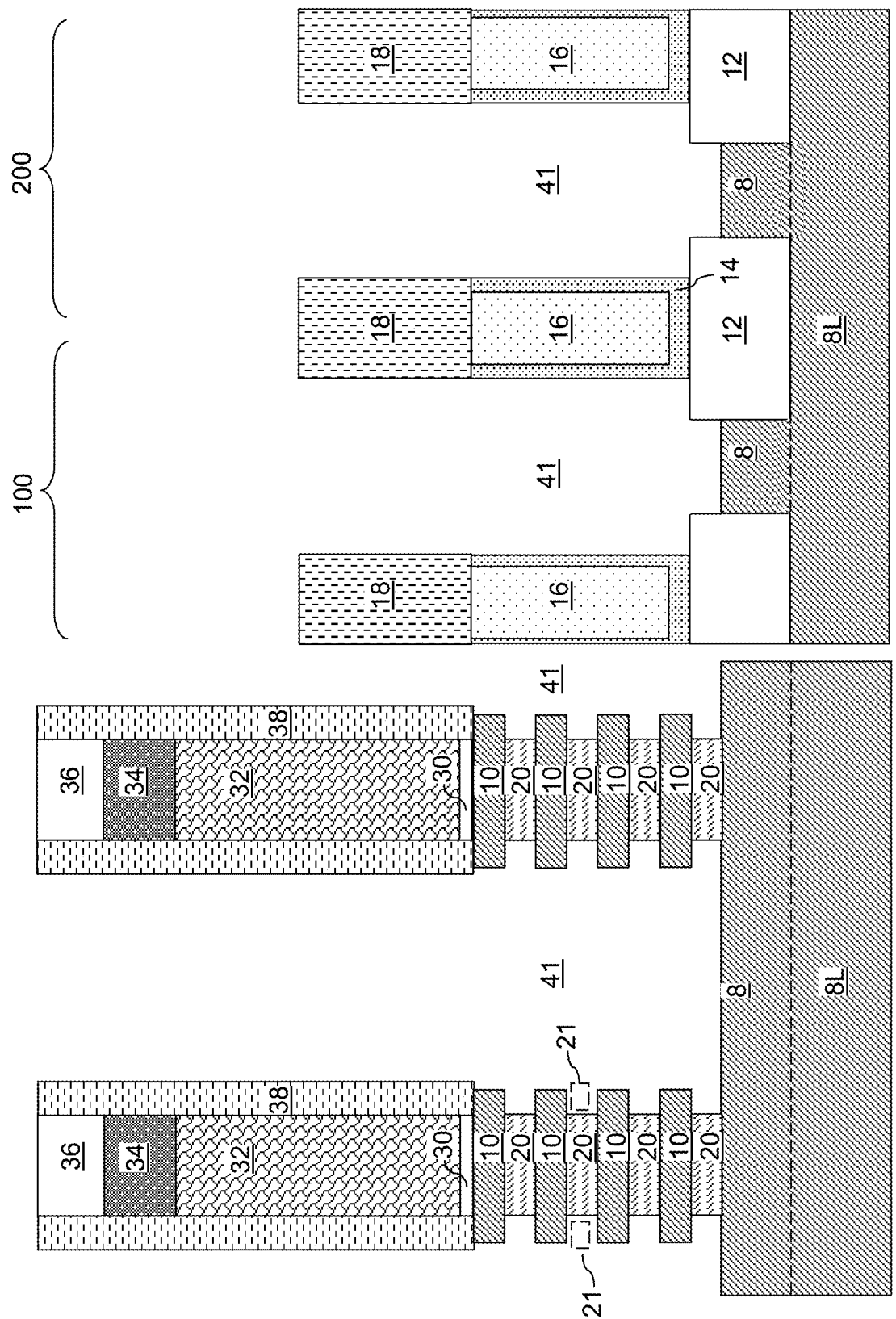

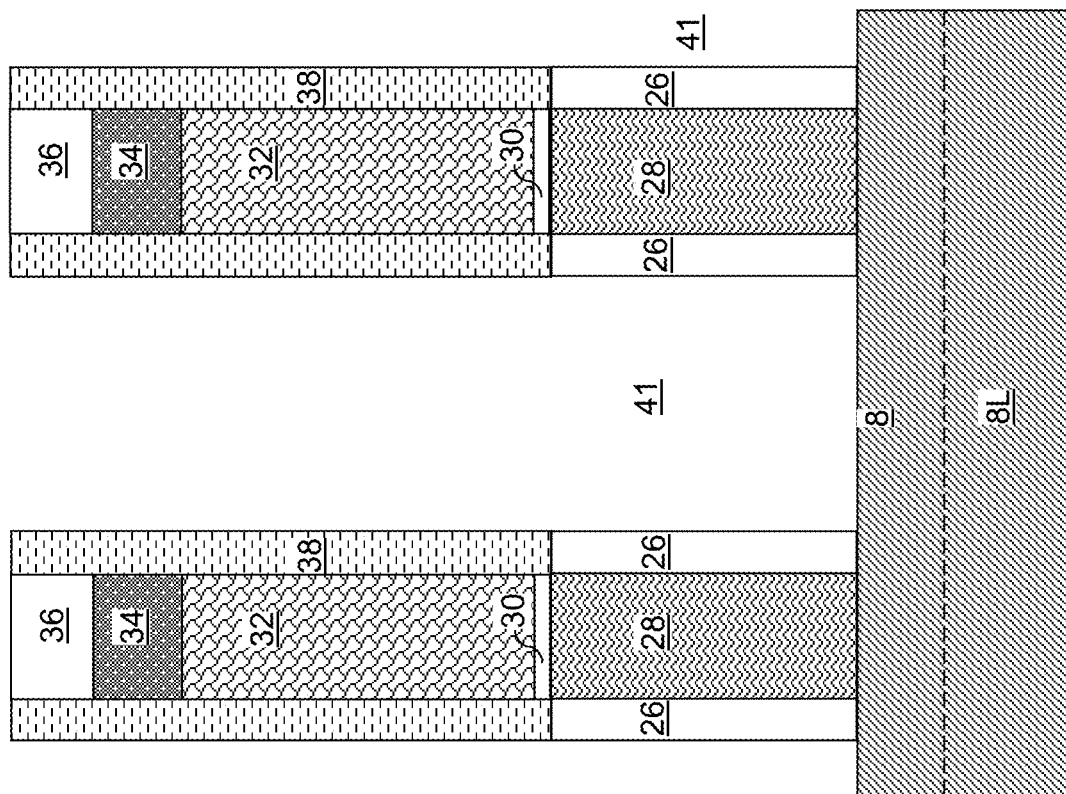

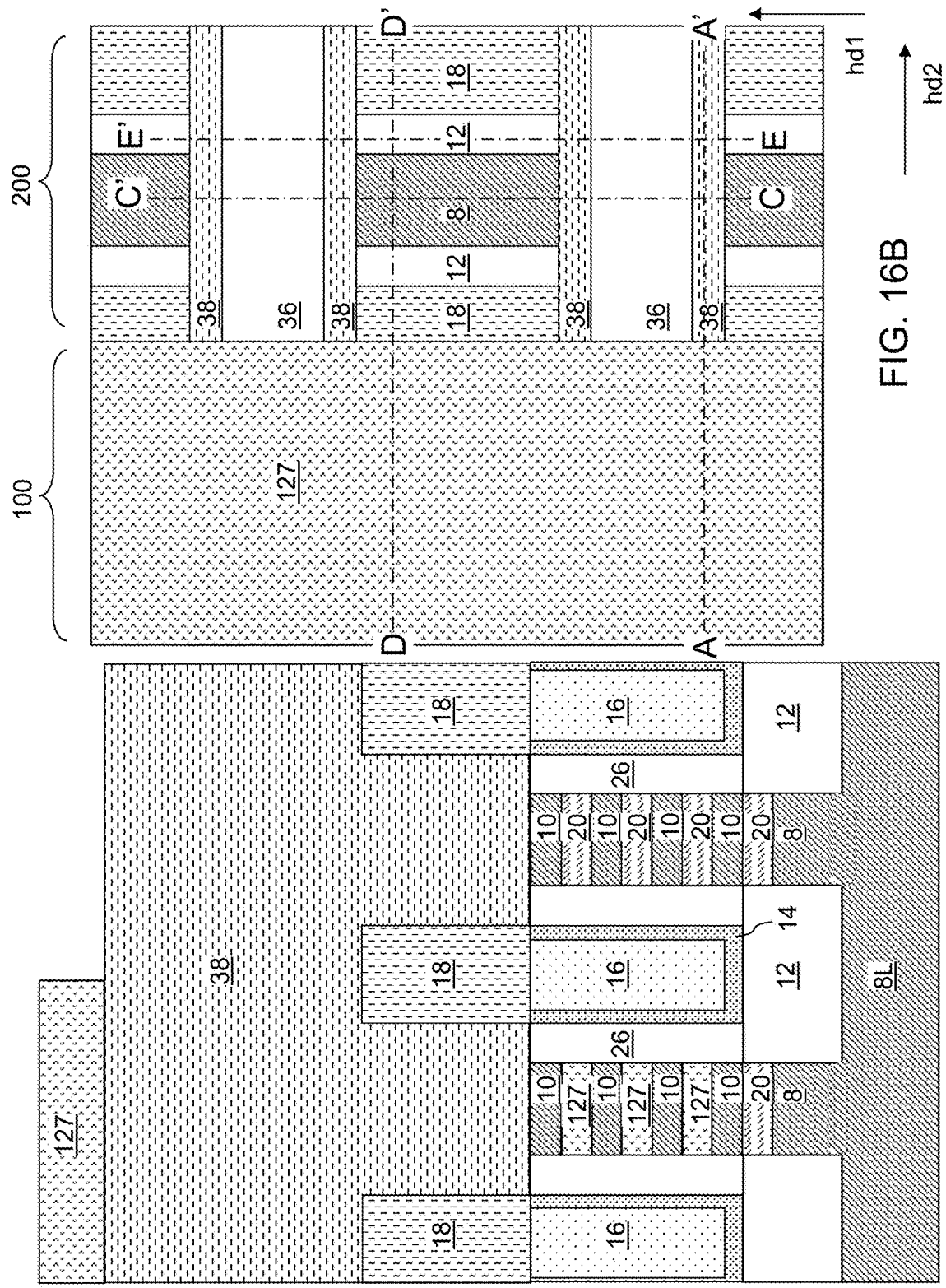

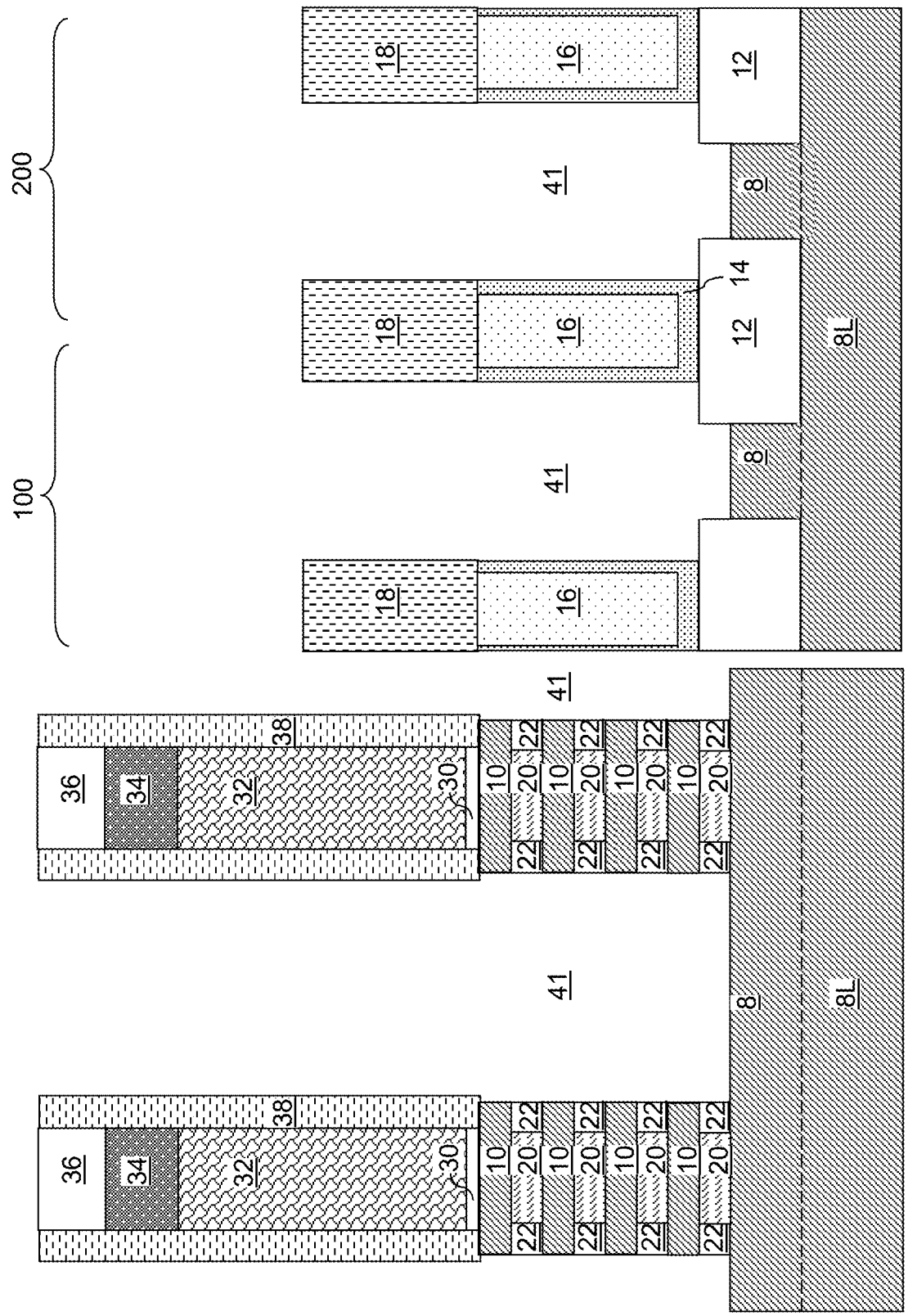

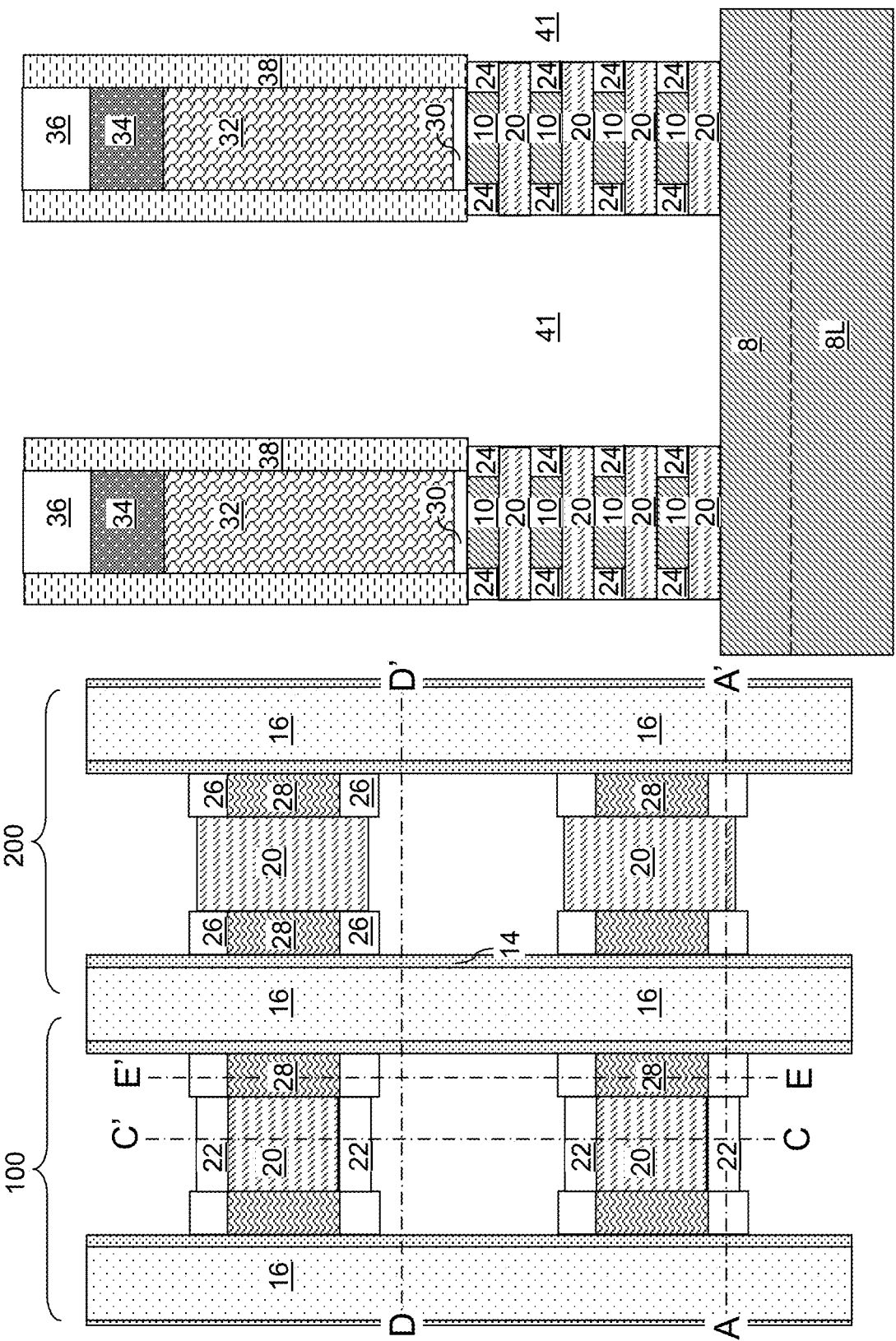

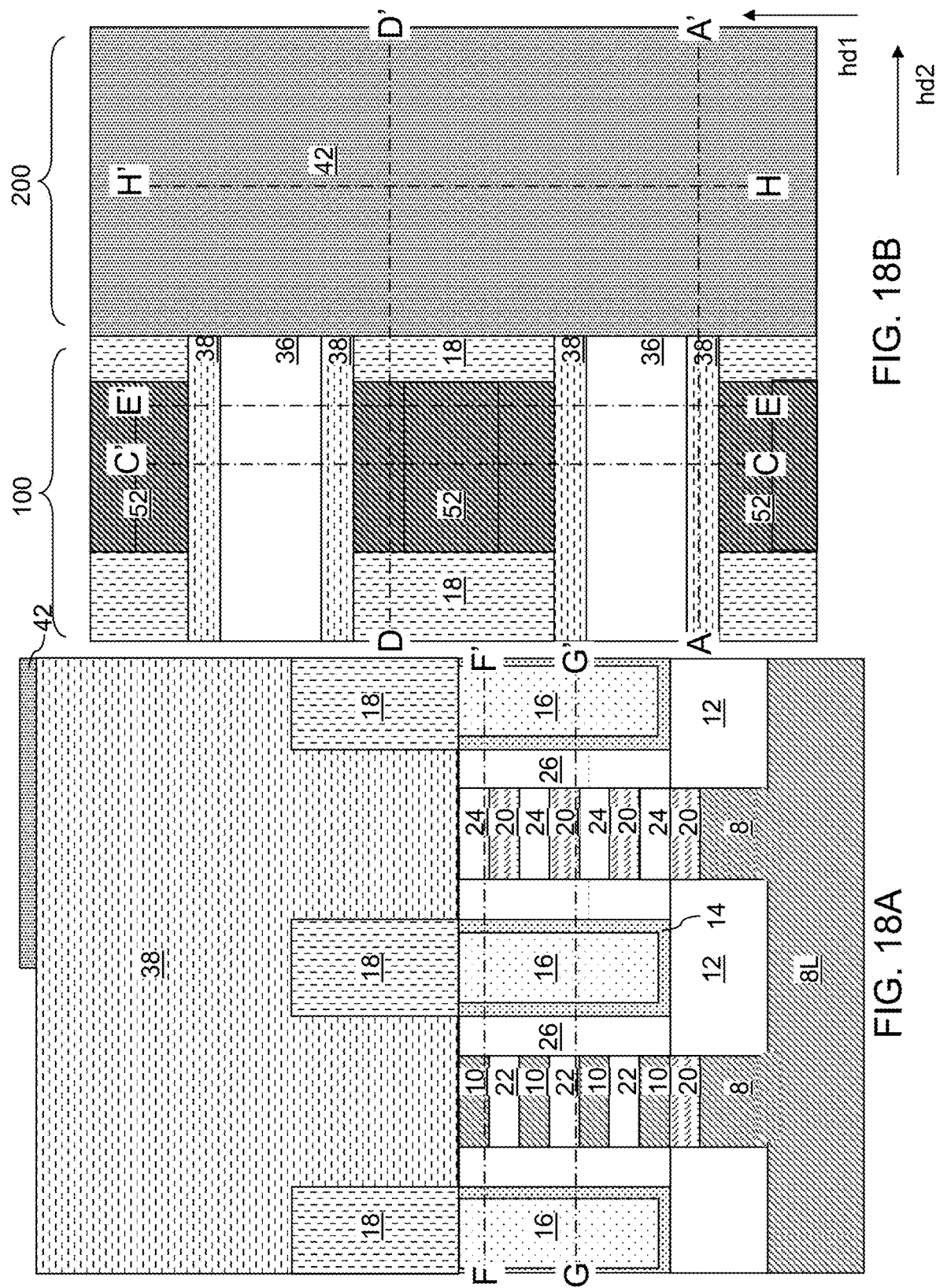

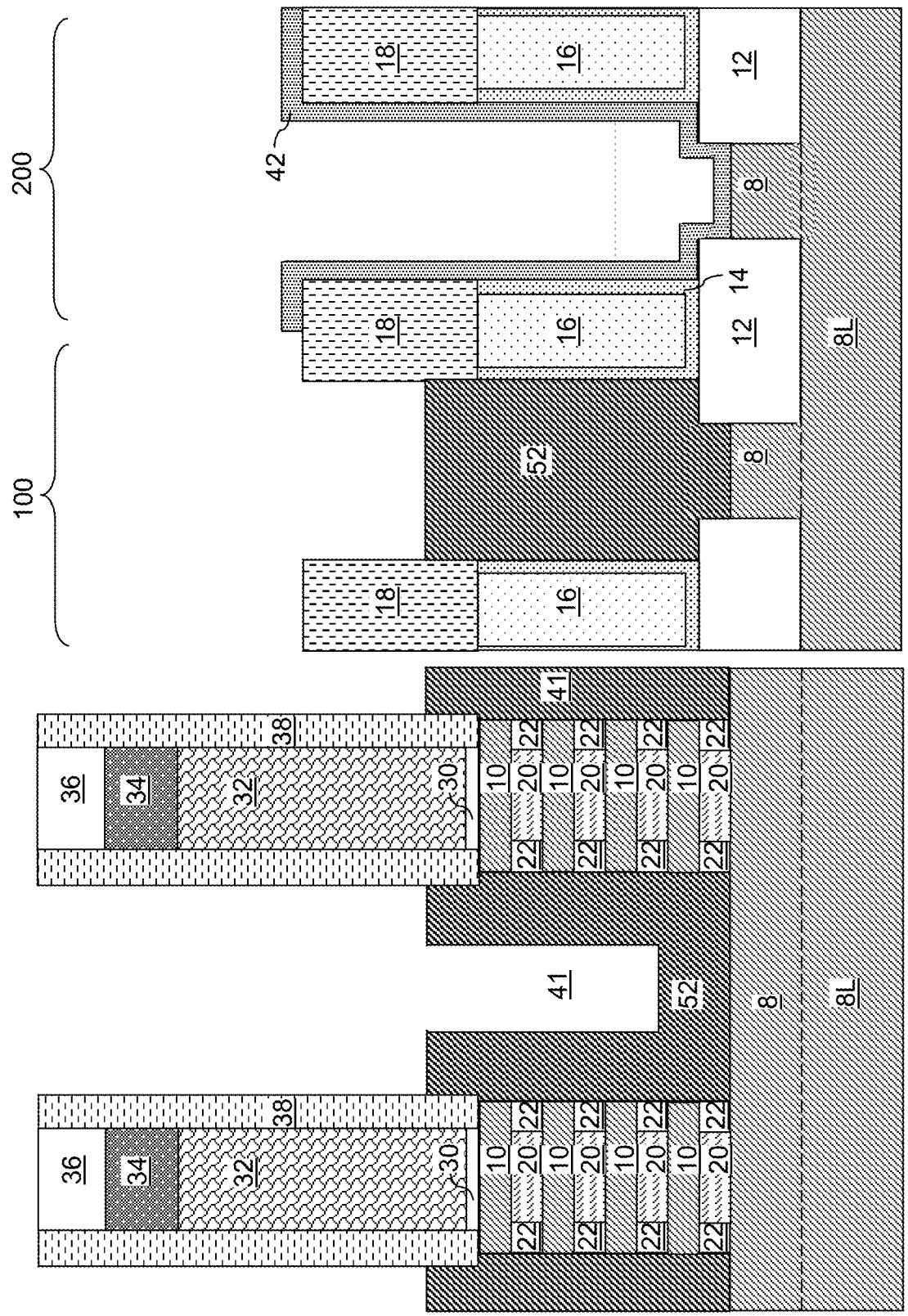

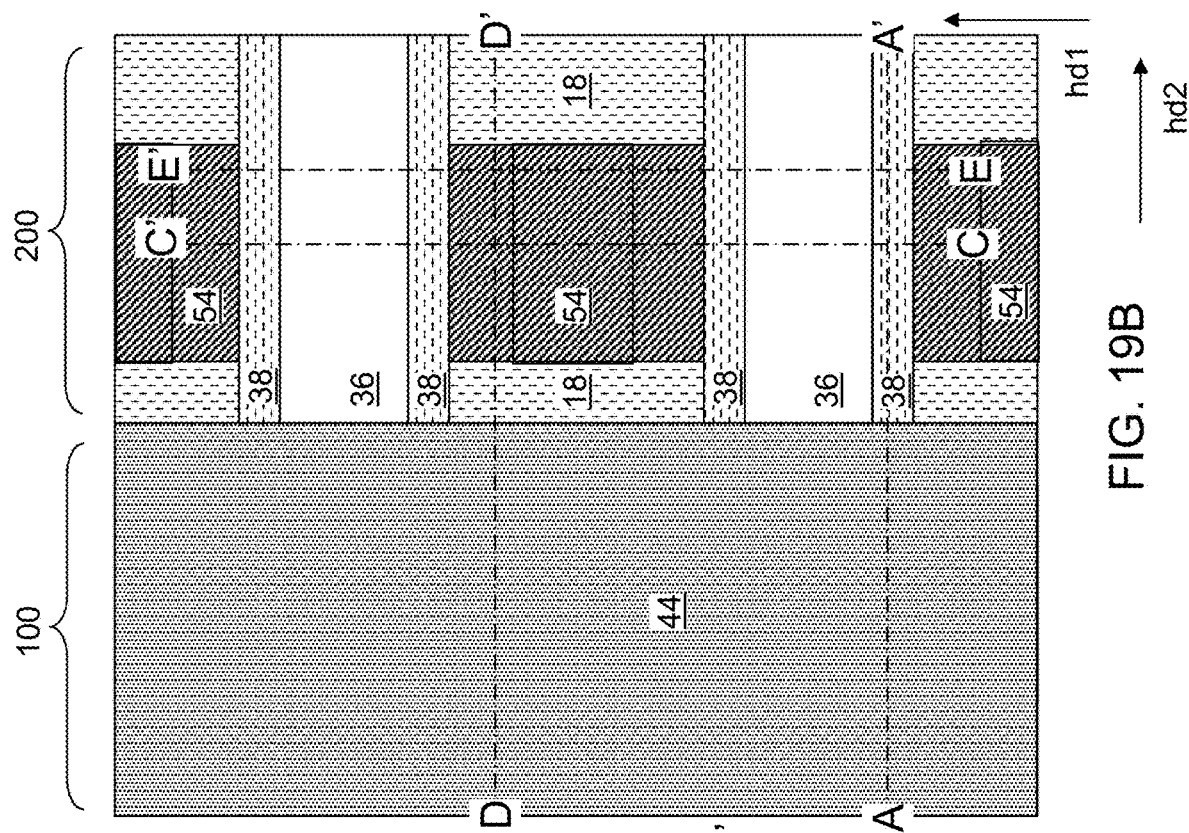
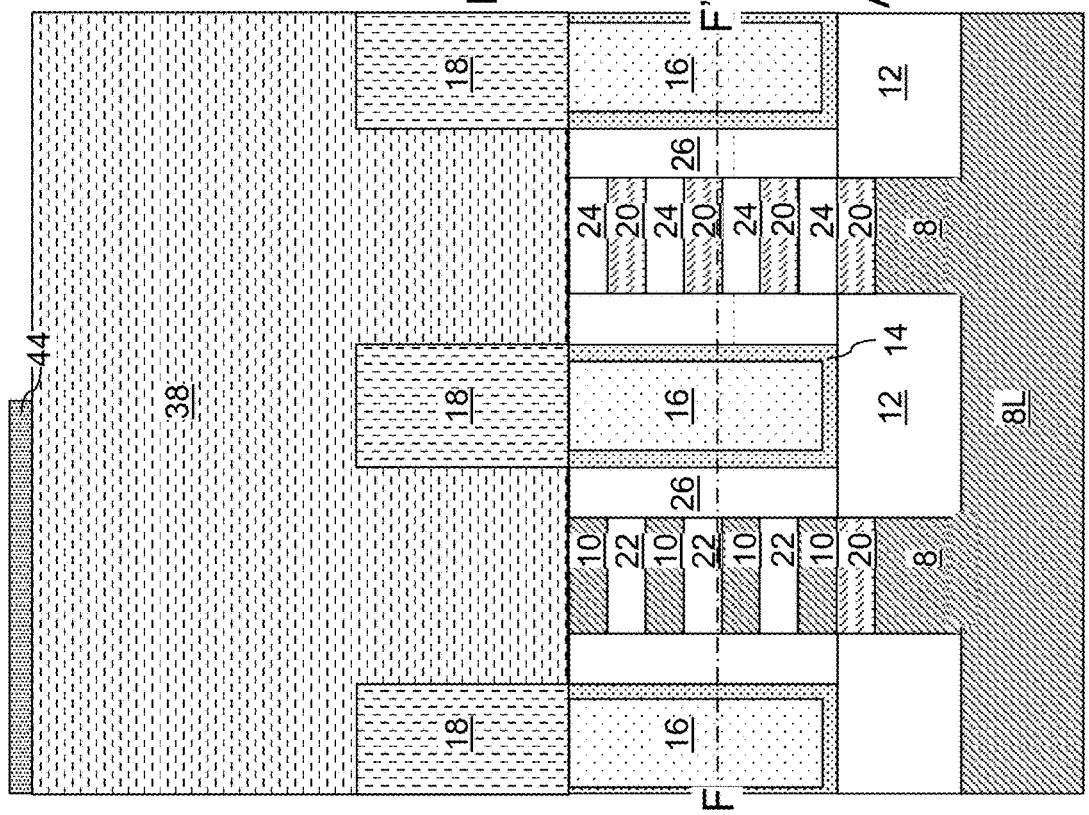
FIG. 19B
FIG. 19A

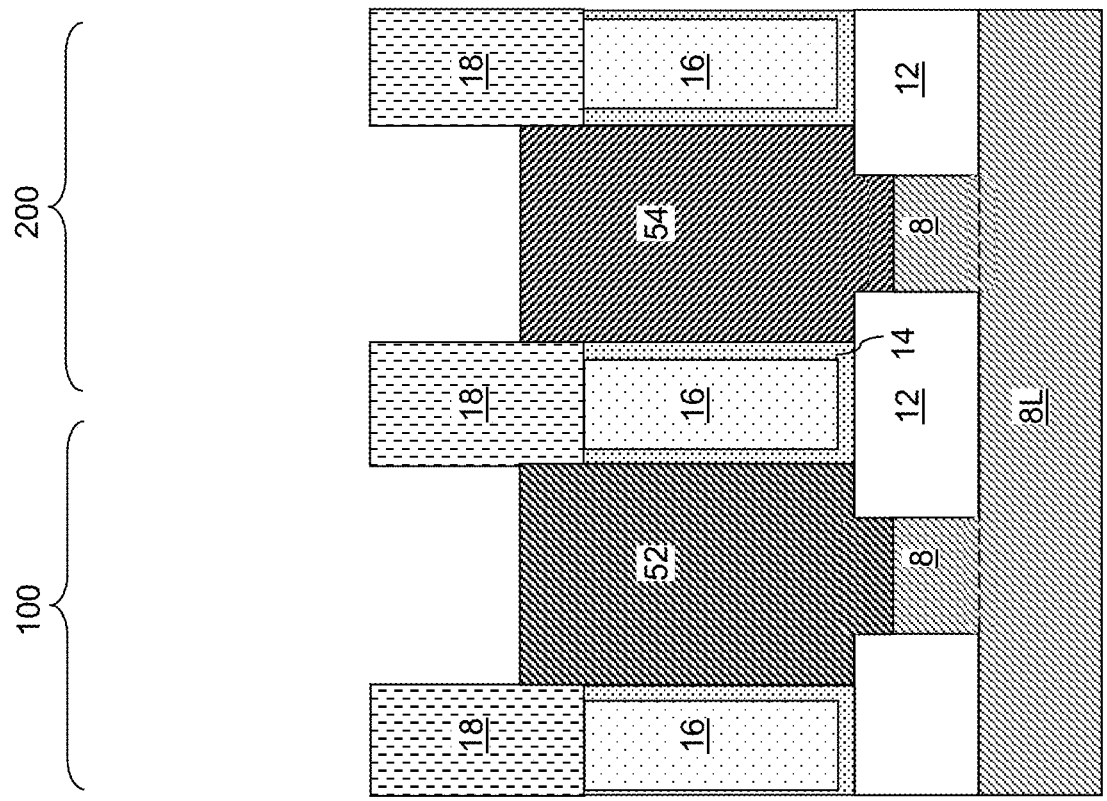
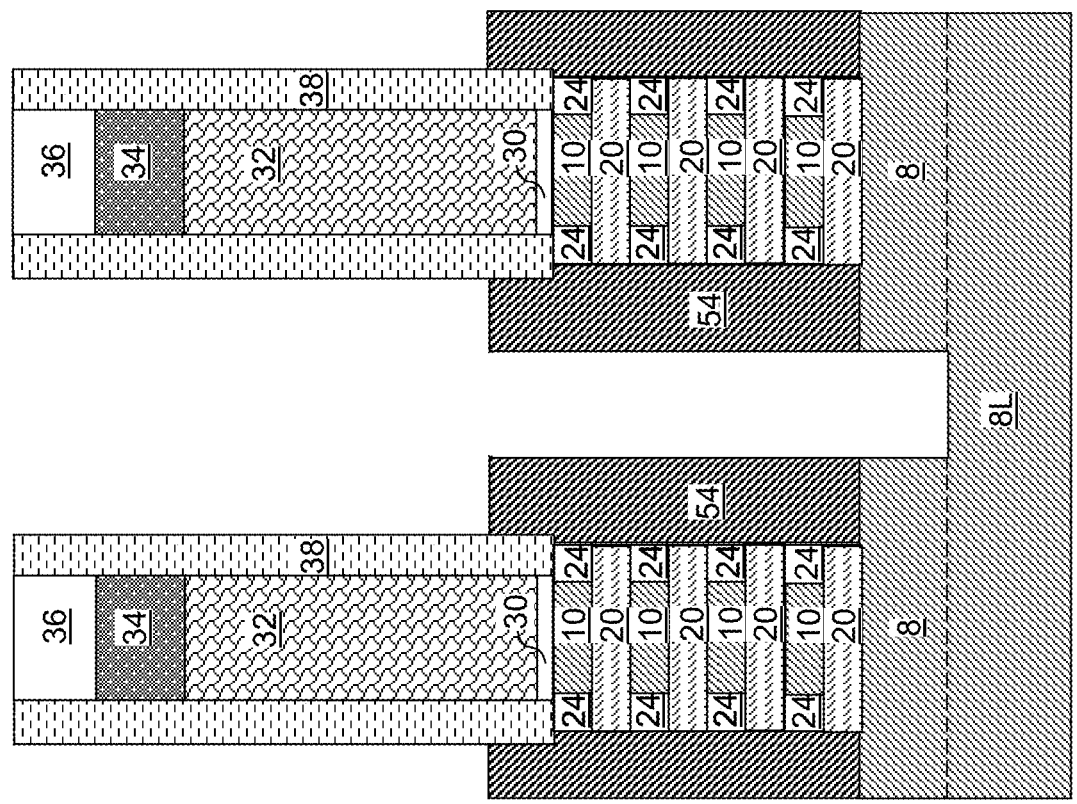

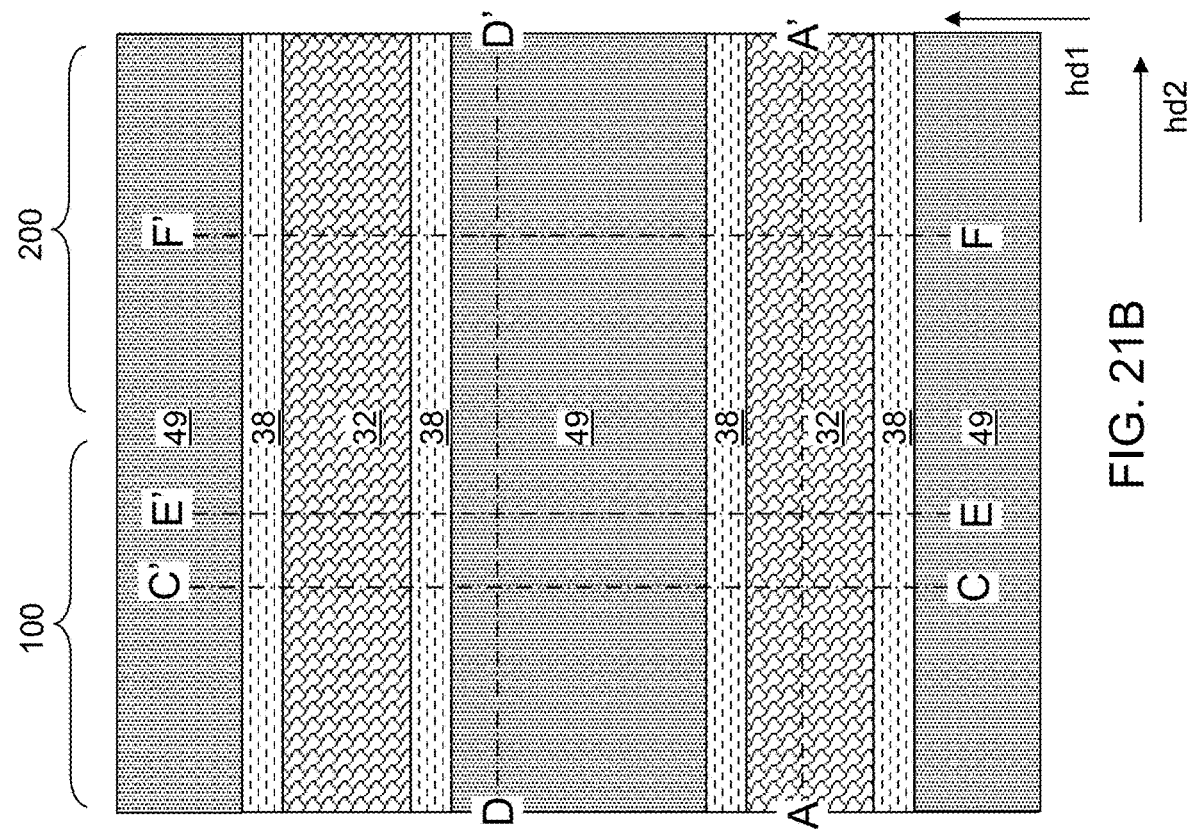
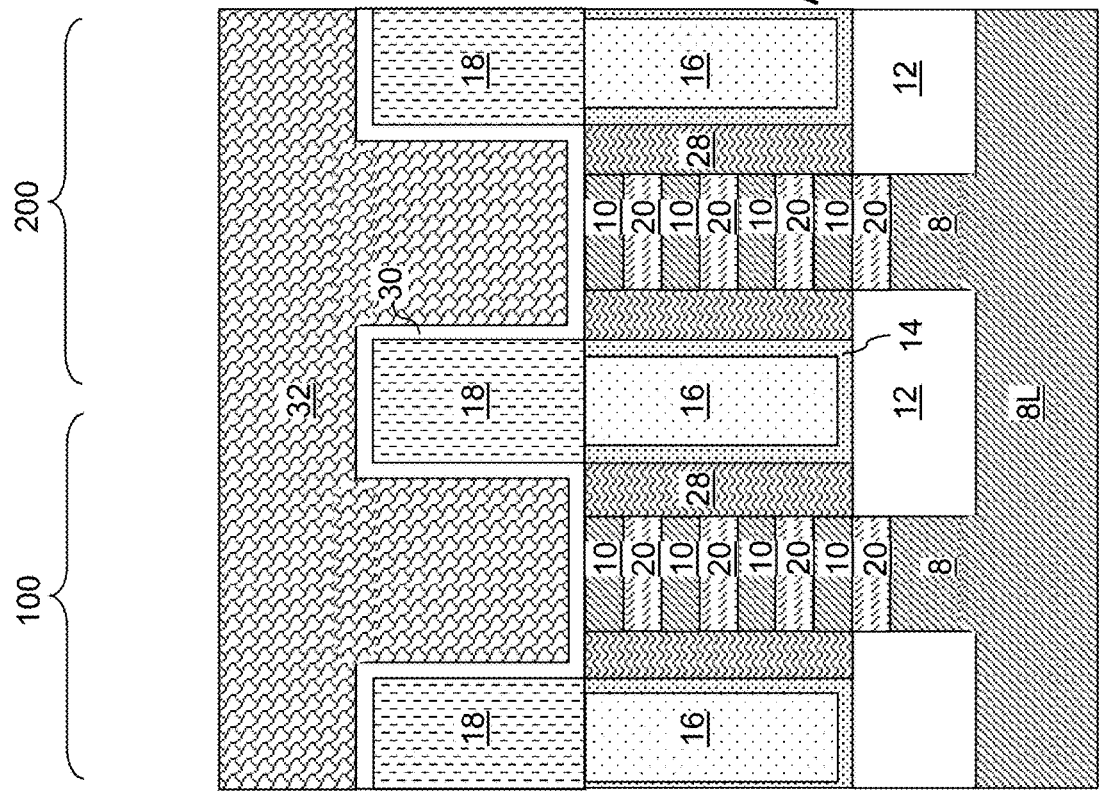
FIG. 21B
FIG. 21A

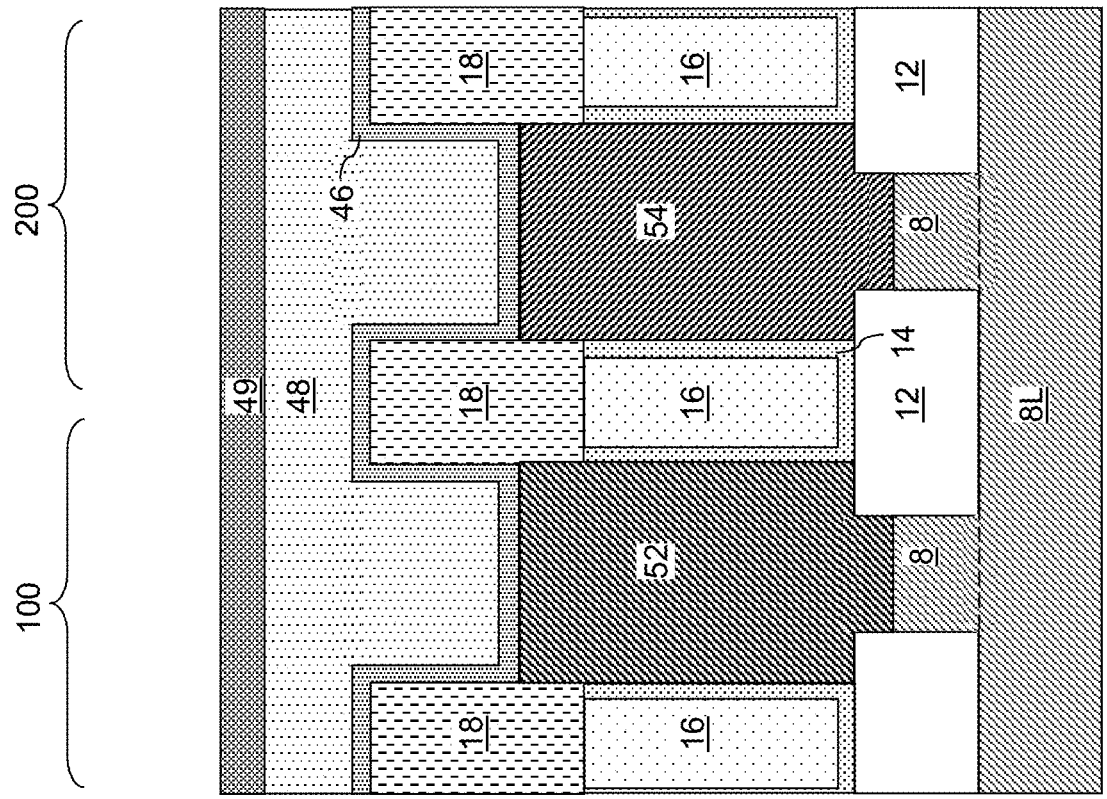
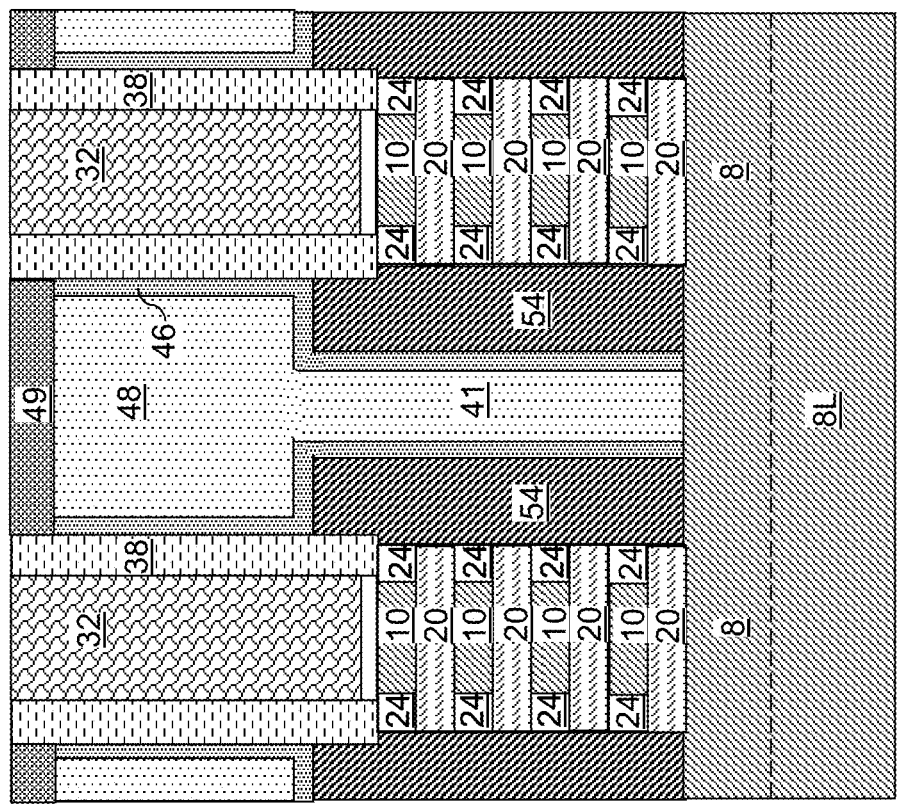
FIG. 21D
FIG. 21C

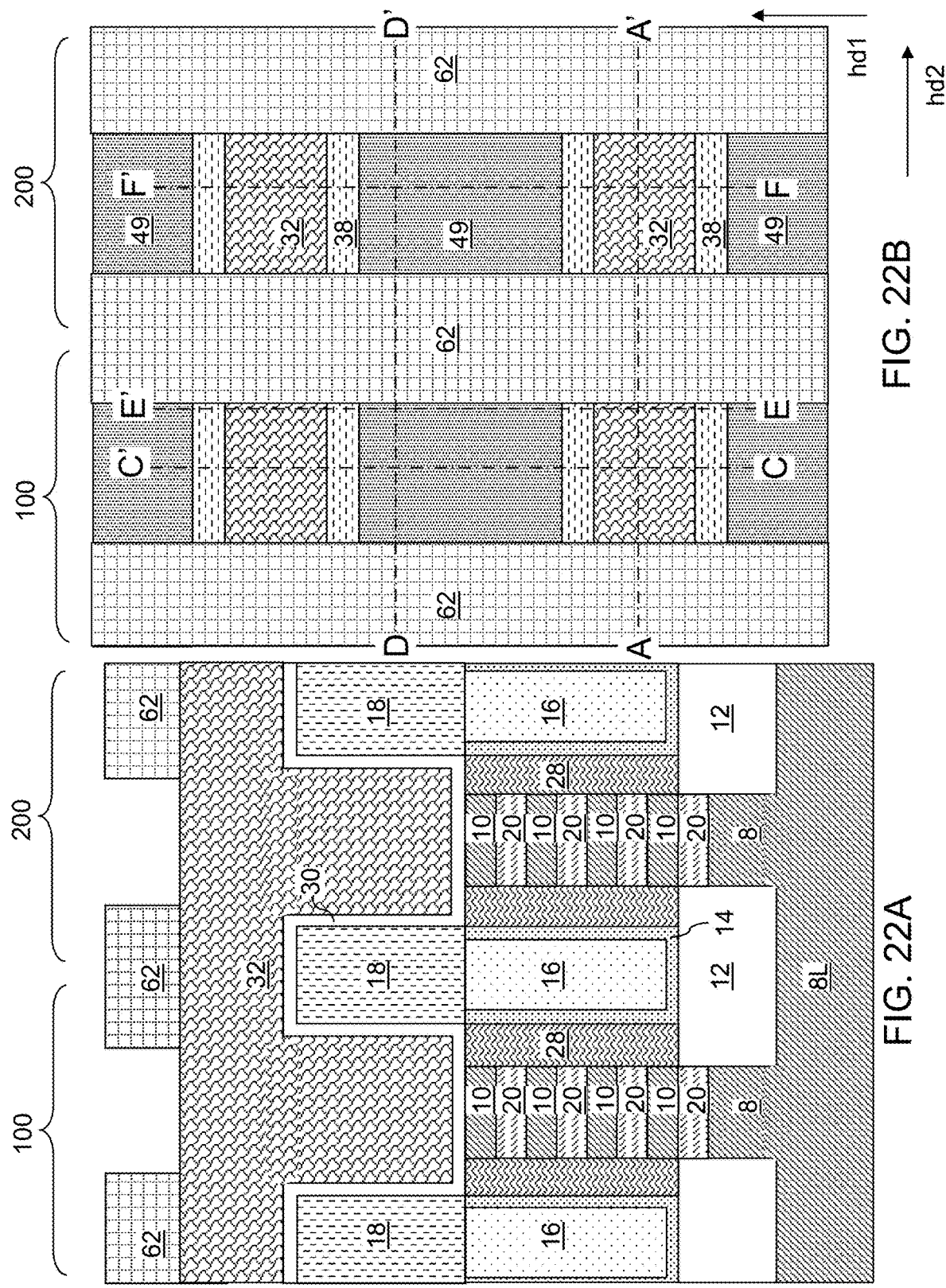

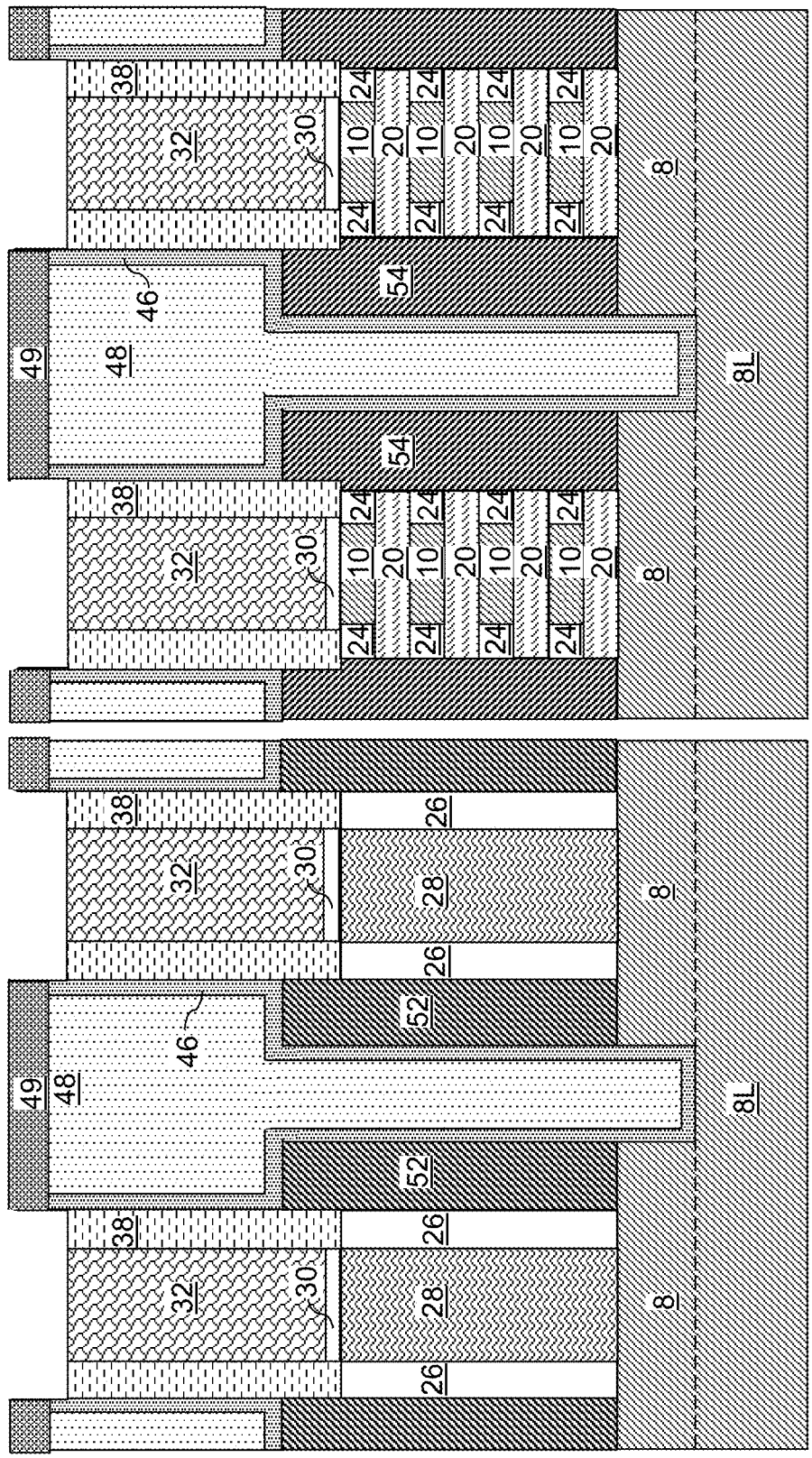

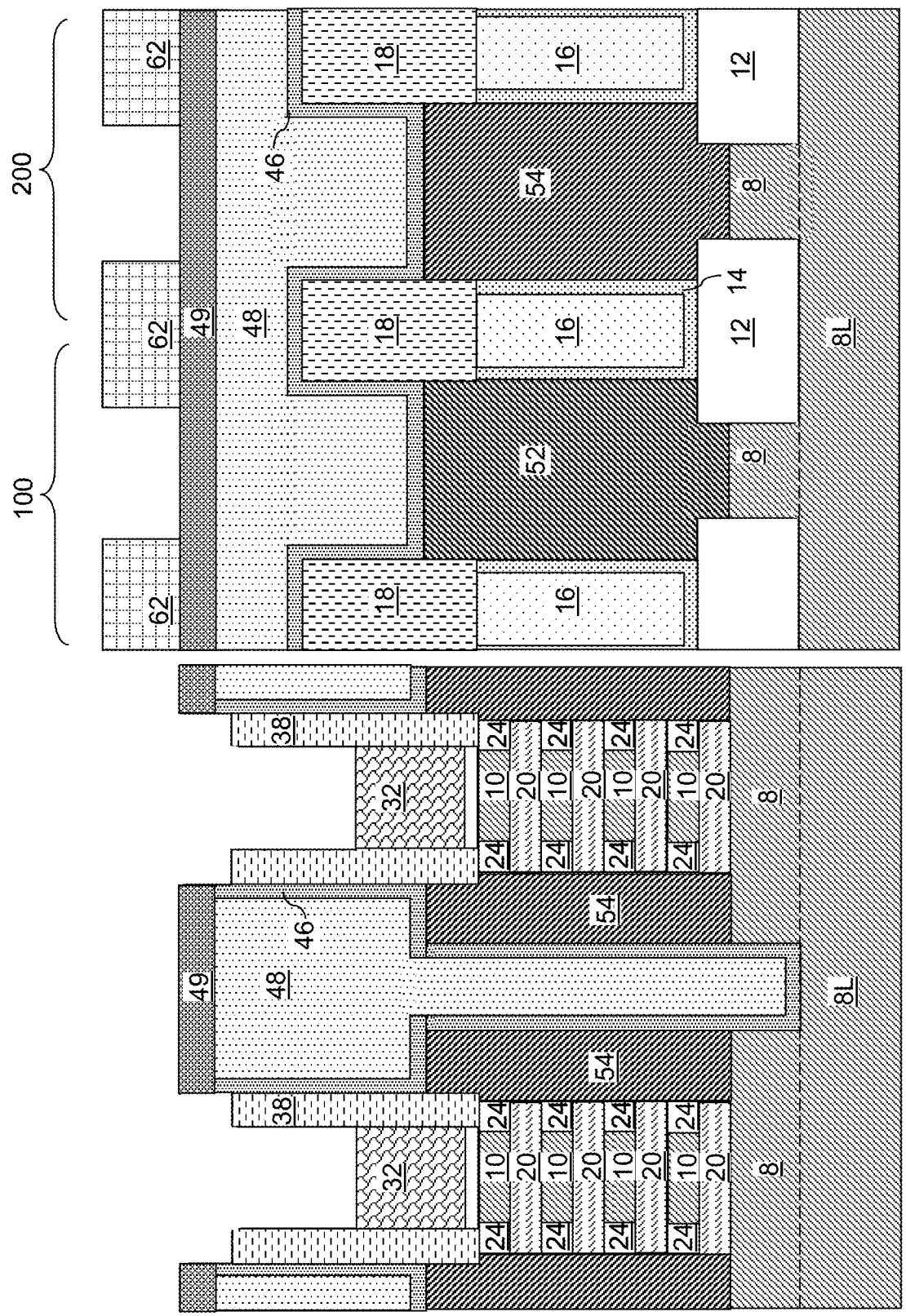

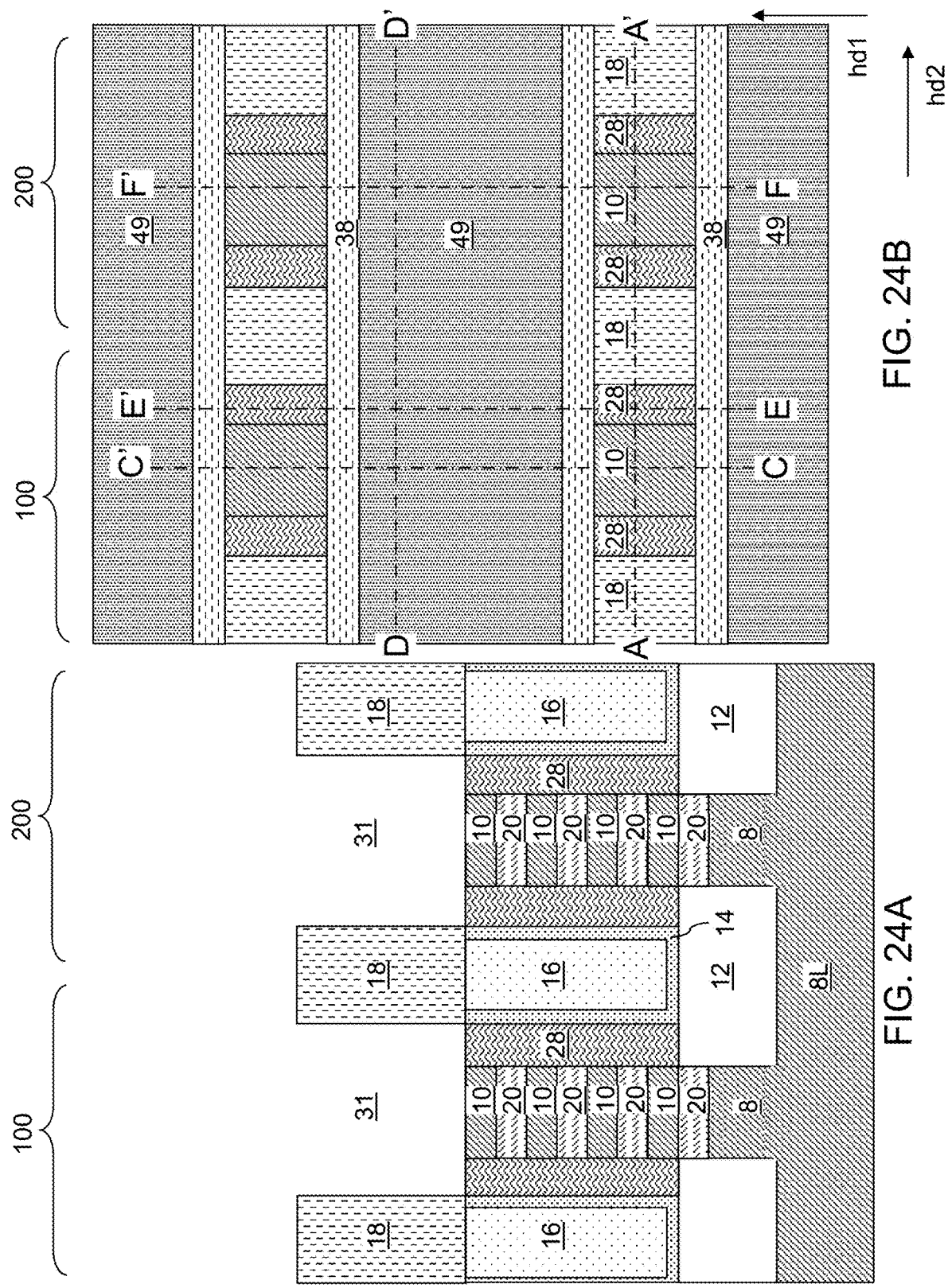

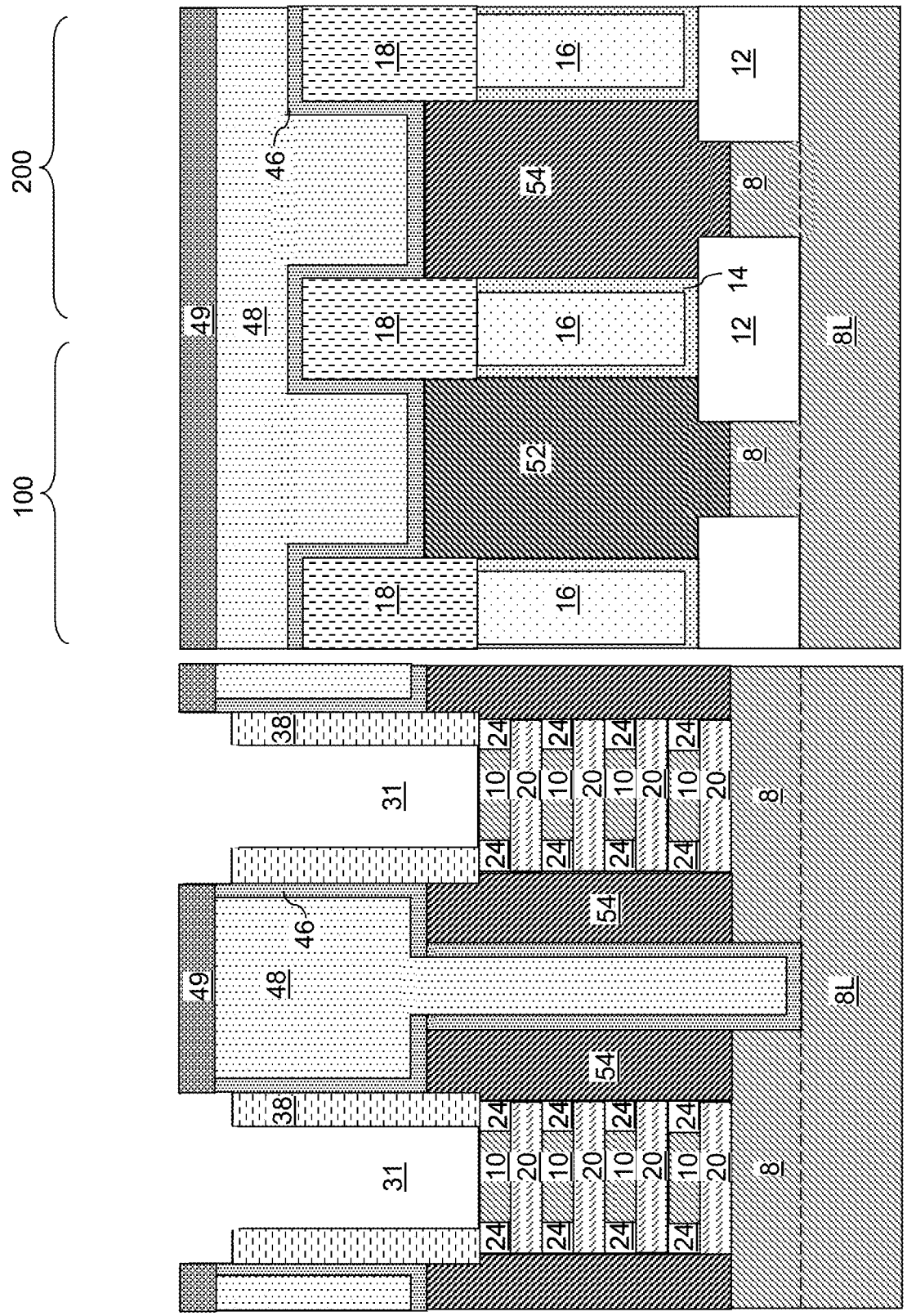

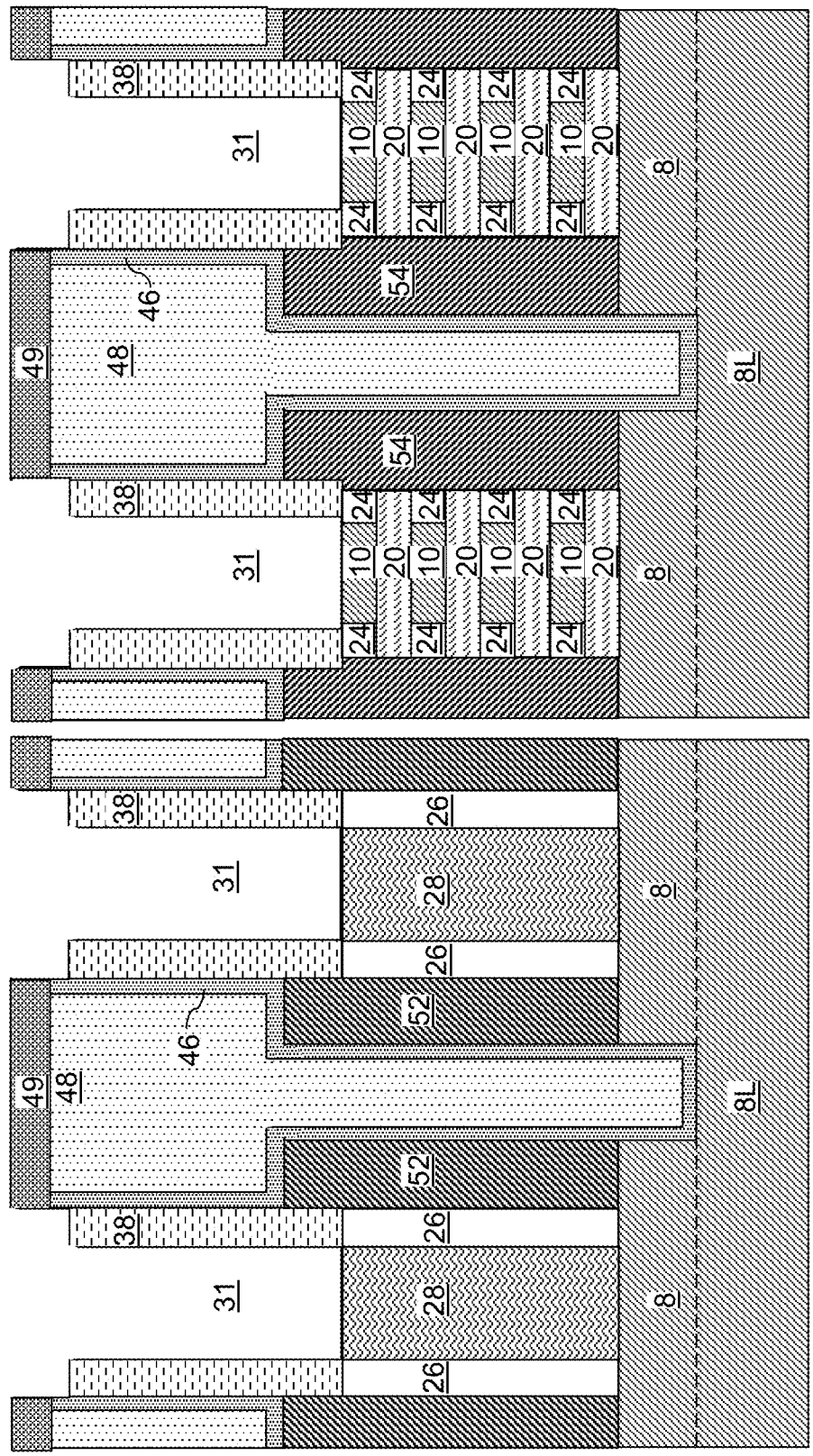

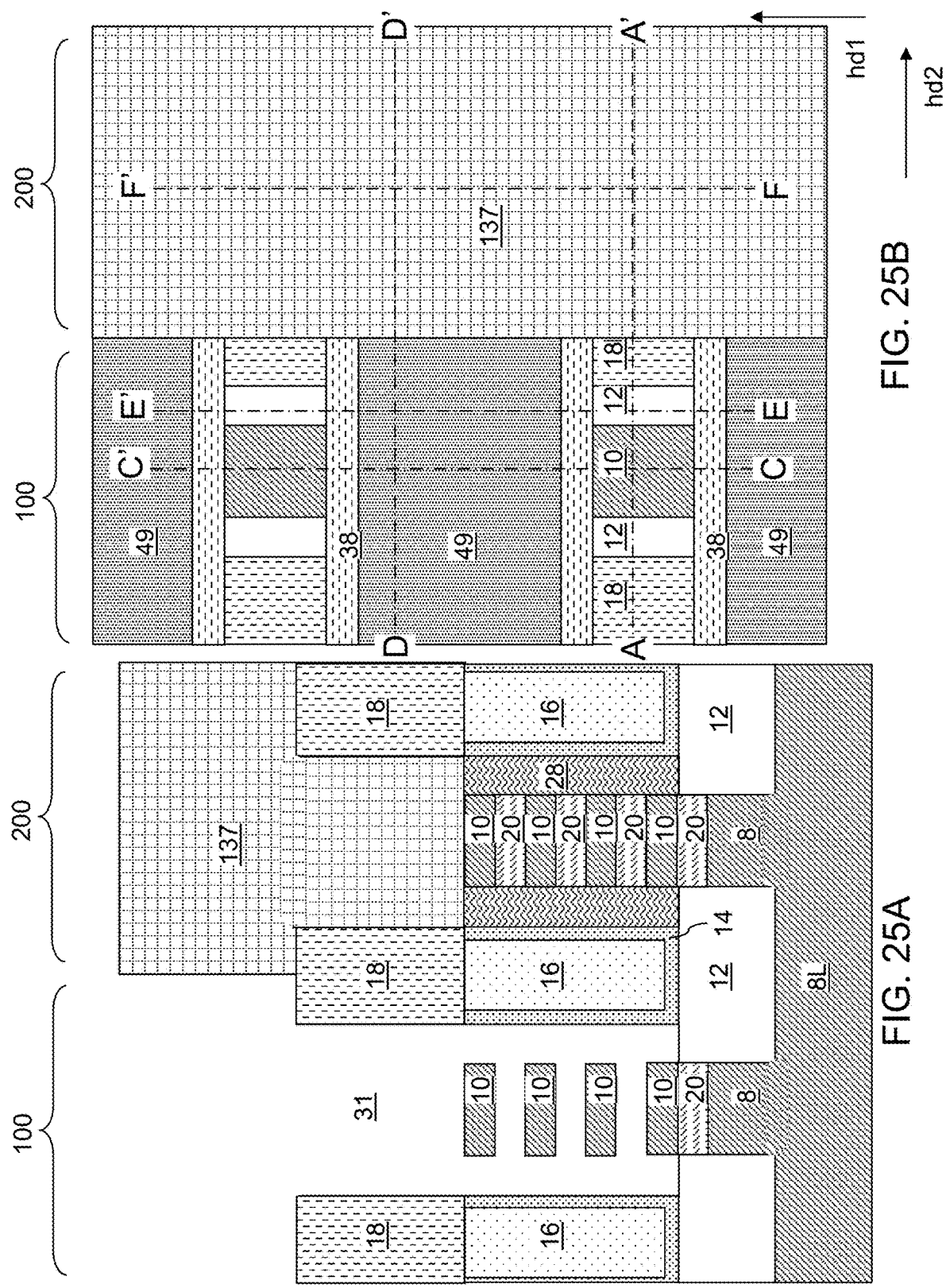

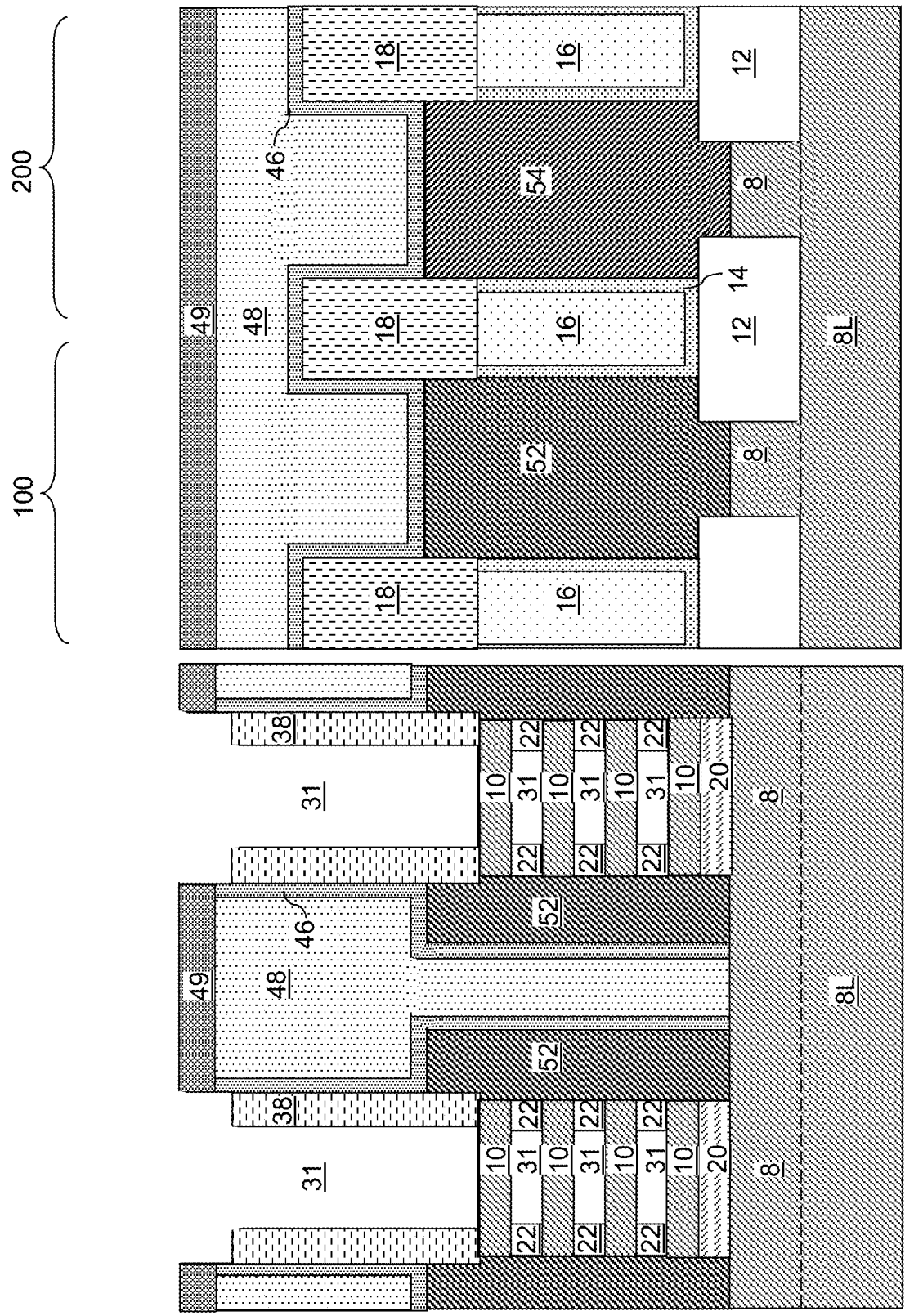

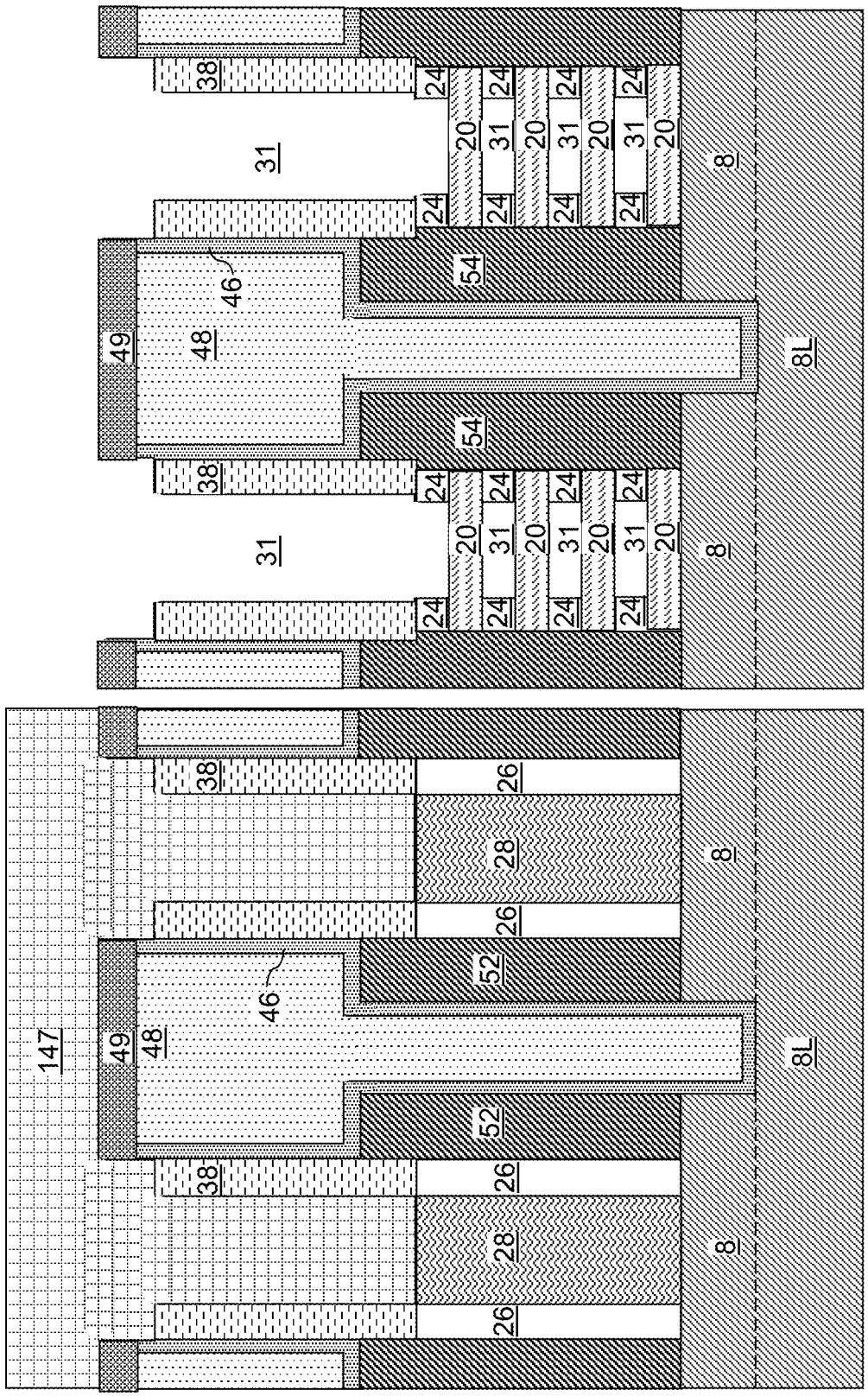

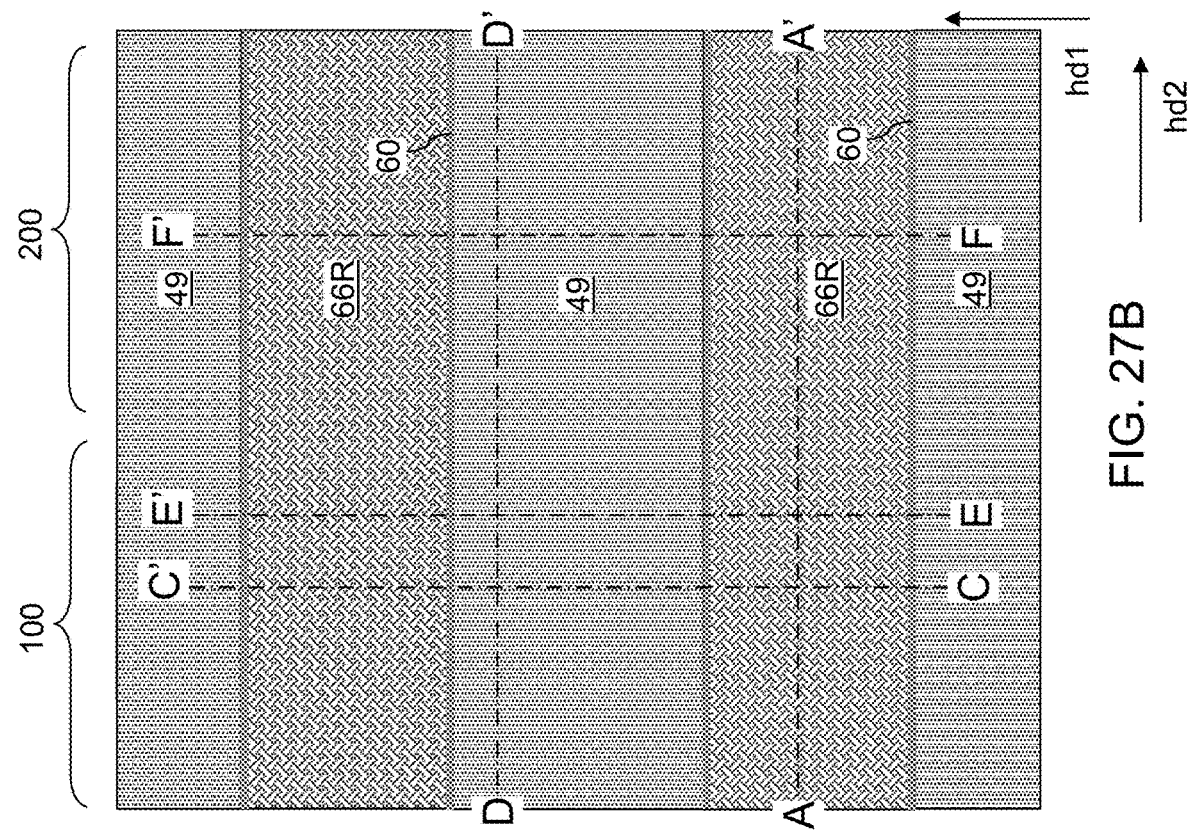
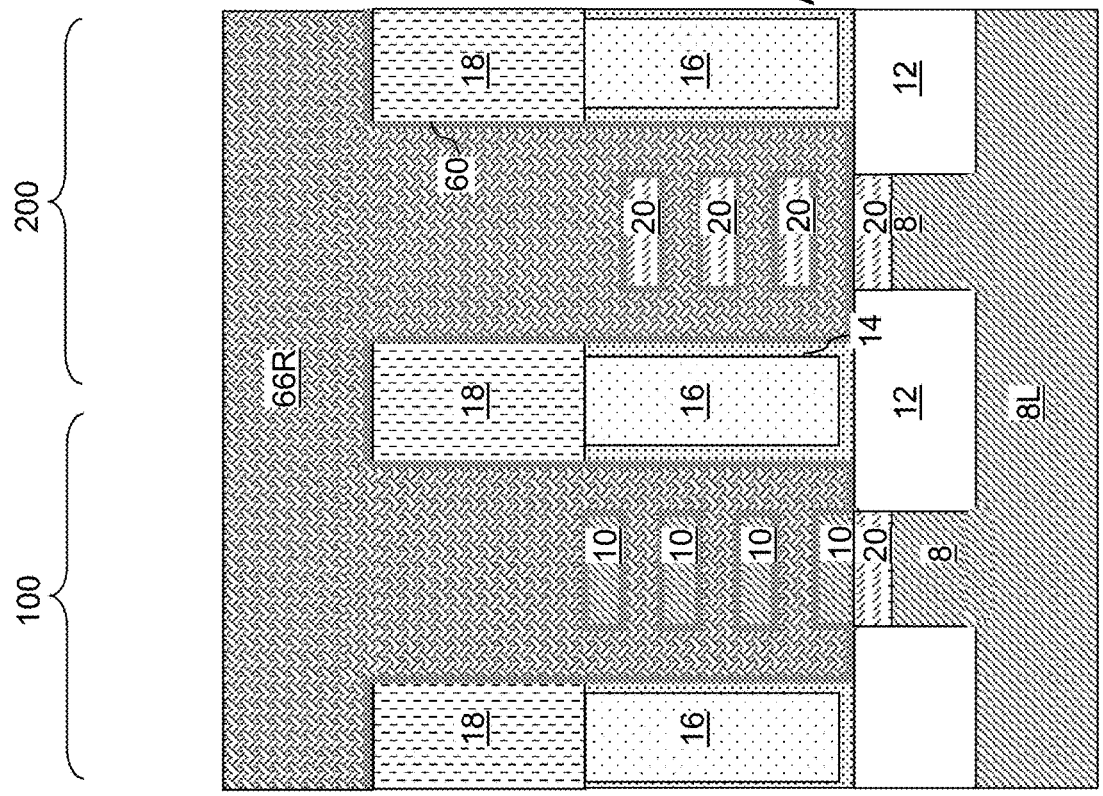
FIG. 27B
FIG. 27A

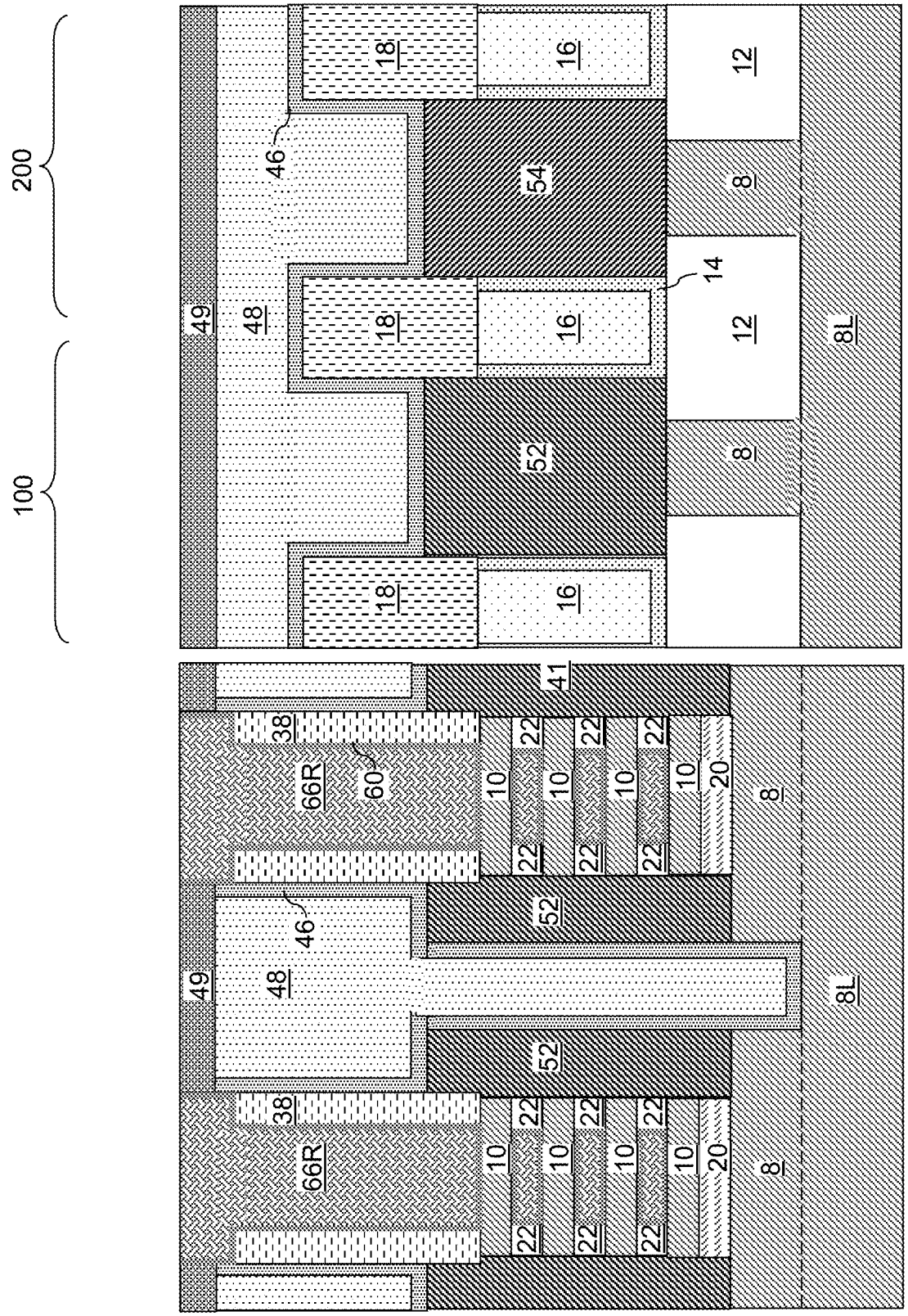

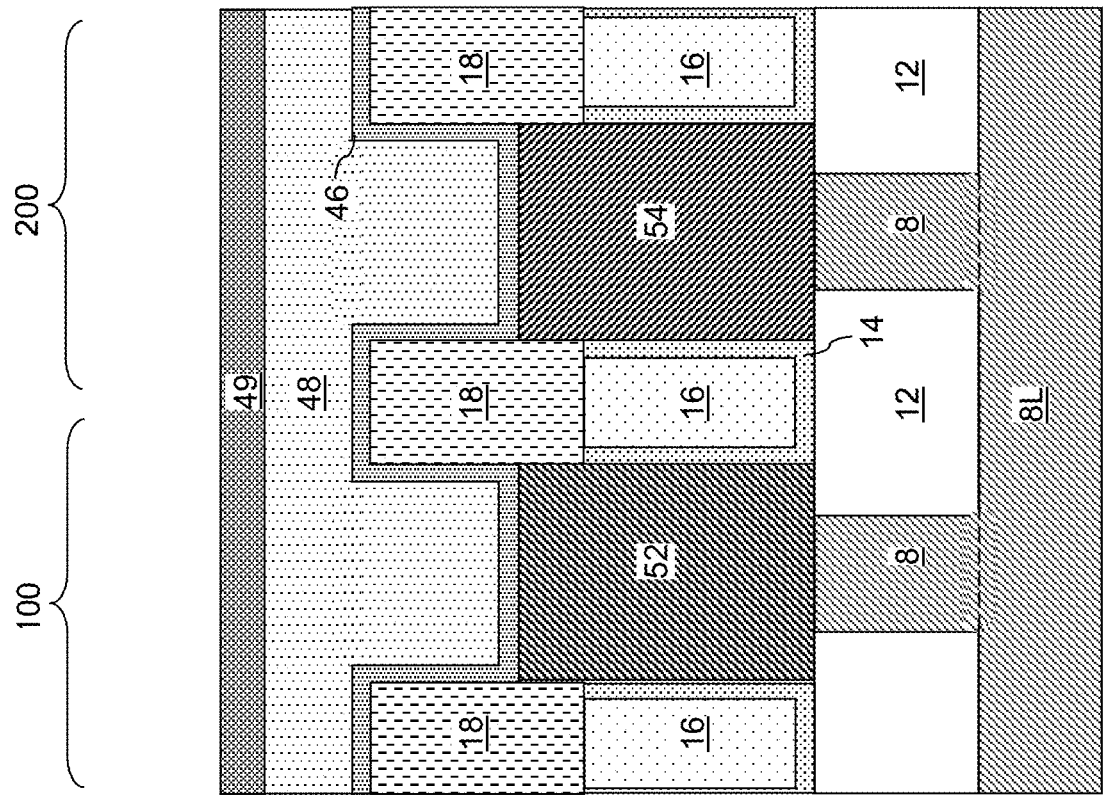
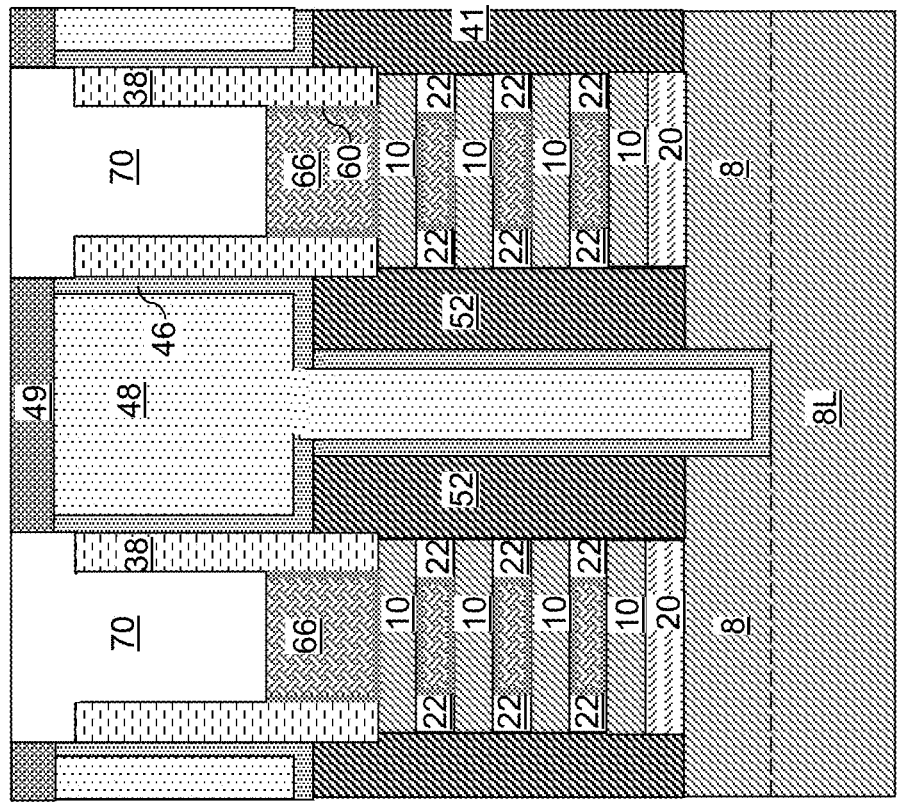
FIG. 28D
FIG. 28C

INTEGRATION OF SILICON CHANNEL NANOSTRUCTURES AND SILICON-GERMANIUM CHANNEL NANOSTRUCTURES

BACKGROUND

A multigate device, multi-gate MOSFET or multi-gate field-effect transistor (MuGFET) refers to a MOSFET (metal-oxide-semiconductor field-effect transistor) that incorporates more than one gate into a single device. The multiple gates may be controlled by a single gate electrode, wherein the multiple gate surfaces act electrically as a single gate, or by independent gate electrodes. A multigate device using independent gate electrodes is sometimes called a multiple-independent-gate field-effect transistor (MIGFET). The most widely used multi-gate devices are the FinFET (fin field-effect transistor) and the GAAFET (gate-all-around field-effect transistor), which are non-planar transistors, or 3D transistors. Use of gate-all-around structures help increase device density. Gate-all-around transistors provide high device current density per device area by vertically stacking semiconductor plates. Further, gate-all-around transistors provide high on-off current ratios by enhancing control of semiconductor channels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is vertical cross-sectional view of an exemplary structure after formation of an alternating stack of silicon-germanium layers and silicon layers, a hard mask layer, a semiconductor liner, a dielectric cover layer, and a semiconductor mandrel layer according to an embodiment of the present disclosure.

FIG. 1B is a top-down view of the exemplary structure of FIG. 1A. The vertical plane A-A' is the plane of the vertical cross-sectional view of FIG. 1A.

FIG. 3A is a vertical cross-sectional view of the exemplary structure after formation of shallow trench isolation structures according to an embodiment of the present disclosure.

FIG. 3B is a top-down view of the exemplary structure of FIG. 3A. The vertical plane A-A' is the plane of the vertical cross-sectional view of FIG. 3A.

FIG. 4A is a vertical cross-sectional view of the exemplary structure after vertically recessing the shallow trench isolation structures according to an embodiment of the present disclosure.

FIG. 4B is a top-down view of the exemplary structure of FIG. 4A. The vertical plane A-A' is the plane of the vertical cross-sectional view of FIG. 4A.

FIG. 5A is a vertical cross-sectional view of the exemplary structure after formation of cladding silicon-germanium alloy structures according to an embodiment of the present disclosure.

FIG. 5B is a top-down view of the exemplary structure of FIG. 5A. The vertical plane A-A' is the plane of the vertical cross-sectional view of FIG. 5A.

FIG. 6A is a vertical cross-sectional view of the exemplary structure after formation of hybrid dielectric fins according to an embodiment of the present disclosure.

FIG. 6B is a top-down view of the exemplary structure of FIG. 6A. The vertical plane A-A' is the plane of the vertical cross-sectional view of FIG. 6A.

FIG. 7A is a vertical cross-sectional view of the exemplary structure after vertically recessing the hybrid dielectric fins according to an embodiment of the present disclosure.

FIG. 7B is a top-down view of the exemplary structure of FIG. 7A. The vertical plane A-A' is the plane of the vertical cross-sectional view of FIG. 7A.

FIG. 8A is a vertical cross-sectional view of the exemplary structure after formation of etch stop fins according to an embodiment of the present disclosure.

FIG. 8B is a top-down view of the exemplary structure of FIG. 8A. The vertical plane A-A' is the plane of the vertical cross-sectional view of FIG. 8A.

FIG. 9A is a vertical cross-sectional view of the exemplary structure after removal of hard mask plates and upper portions of the cladding silicon-germanium alloy structures according to an embodiment of the present disclosure.

FIG. 9B is a top-down view of the exemplary structure of FIG. 9A. The vertical plane A-A' is the plane of the vertical cross-sectional view of FIG. 9A.

FIG. 10A is a vertical cross-sectional view of the exemplary structure after formation of gate template structures including a respective set of a sacrificial gate liner, a sacrificial gate structure, a sacrificial gate cap, and a gate mask structure, and subsequent formation of gate template spacers according to an embodiment of the present disclosure.

FIG. 10B is a top-down view of the exemplary structure of FIG. 10A. The vertical plane A-A' is the plane of the vertical cross-sectional view of FIG. 10A.

FIG. 11C is a vertical cross-sectional view along the vertical plane C-C' of FIG. 11B.

FIG. 11D is a vertical cross-sectional view along the vertical plane D-D' of FIG. 11B.

FIG. 12A is a vertical cross-sectional view of the exemplary structure after laterally recessing cladding silicon-germanium alloy structures according to an embodiment of the present disclosure.

FIG. 12B is a top-down view of the exemplary structure of FIG. 12A. The vertical plane A-A' is the plane of the vertical cross-sectional view of FIG. 12A.

FIG. 12C is a vertical cross-sectional view along the vertical plane C-C' of FIG. 12B.

FIG. 12D is a vertical cross-sectional view along the vertical plane D-D' of FIG. 12B.

FIG. 13C is a vertical cross-sectional view along the vertical plane C-C' of FIG. 13B.

FIG. 13D is a vertical cross-sectional view along the vertical plane D-D' of FIG. 13B.

FIG. 14A is a vertical cross-sectional view of the exemplary structure after laterally recessing semiconductor plates according to an embodiment of the present disclosure.

FIG. 14B is a top-down view of the exemplary structure of FIG. 14A. The vertical plane A-A' is the plane of the vertical cross-sectional view of FIG. 14A.

FIG. 14C is a vertical cross-sectional view along the vertical plane C-C' of FIG. 14B.

FIG. 14D is a vertical cross-sectional view along the vertical plane D-D' of FIG. 14B.

FIG. 15A is a vertical cross-sectional view of the exemplary structure after masking a second transistor region and selective removal of end portions of silicon-germanium plates according to an embodiment of the present disclosure.

FIG. 15B is a top-down view of the exemplary structure of FIG. 15A. The vertical plane A-A' is the plane of the vertical cross-sectional view of FIG. 15A.

FIG. 15C is a vertical cross-sectional view along the vertical plane C-C' of FIG. 15B.

FIG. 15D is a vertical cross-sectional view along the vertical plane D-D' of FIG. 15B.

FIG. 15E is a vertical cross-sectional view along the vertical plane E-E' of FIG. 15B.

FIG. 16A is a vertical cross-sectional view of the exemplary structure after masking a first transistor region and selective removal of end portions of silicon plates according to an embodiment of the present disclosure.

FIG. 16B is a top-down view of the exemplary structure of FIG. 16A. The vertical plane A-A' is the plane of the vertical cross-sectional view of FIG. 16A.

FIG. 17C is a vertical cross-sectional view along the vertical plane C-C' of FIG. 17B.

FIG. 17D is a vertical cross-sectional view along the vertical plane D-D' of FIG. 17B.

FIG. 17G is a horizontal cross-sectional view along the horizontal plane G-G' of FIG. 17A.

FIG. 17H is a vertical cross-sectional view along the vertical plane H-H—of FIG. 17A.

FIG. 18A is a vertical cross-sectional view of the exemplary structure after formation of a first dielectric mask layer and formation of first source/drain regions according to an embodiment of the present disclosure.

FIG. 18B is a top-down view of the exemplary structure of FIG. 18A. The vertical plane A-A' is the plane of the vertical cross-sectional view of FIG. 16A.

FIG. 18C is a vertical cross-sectional view along the vertical plane C-C' of FIG. 18B.

FIG. 18D is a vertical cross-sectional view along the vertical plane D-D' of FIG. 18B.

FIG. 19A is a vertical cross-sectional view of the exemplary structure after formation of a second dielectric mask layer and formation of second source/drain regions according to an embodiment of the present disclosure.

FIG. 19B is a top-down view of the exemplary structure of FIG. 19A. The vertical plane A-A' is the plane of the vertical cross-sectional view of FIG. 16A.

FIG. 20C is a vertical cross-sectional view along the vertical plane C-C' of FIG. 20B.

FIG. 20D is a vertical cross-sectional view along the vertical plane D-D' of FIG. 20B.

FIG. 21A is a vertical cross-sectional view of the exemplary structure after formation of inter-device isolation structures according to an embodiment of the present disclosure.

FIG. 21B is a top-down view of the exemplary structure of FIG. 21A. The vertical plane A-A' is the plane of the vertical cross-sectional view of FIG. 21A.

FIG. 21C is a vertical cross-sectional view along the vertical plane C-C' of FIG. 21B.

FIG. 21D is a vertical cross-sectional view along the vertical plane D-D' of FIG. 21B.

FIG. 22A is a vertical cross-sectional view of the exemplary structure after removal of gate mask structures and sacrificial gate caps, formation of etch barrier structures, and recessing of the sacrificial gate structures and the gate template spacers according to an embodiment of the present disclosure.

FIG. 22B is a top-down view of the exemplary structure of FIG. 22A. The vertical plane A-A' is the plane of the vertical cross-sectional view of FIG. 22A.

FIG. 22E is a vertical cross-sectional view along the vertical plane E-E' of FIG. 22B.

FIG. 22F is a vertical cross-sectional view along the vertical plane F-F' of FIG. 22B.

FIG. 23C is a vertical cross-sectional view along the vertical plane C-C' of FIG. 23B.

FIG. 23D is a vertical cross-sectional view along the vertical plane D-D' of FIG. 23B.

FIG. 24A is a vertical cross-sectional view of the exemplary structure after removal of the etch barrier structures, the sacrificial gate structures, and the sacrificial gate liners according to an embodiment of the present disclosure.

FIG. 24B is a top-down view of the exemplary structure of FIG. 24A. The vertical plane A-A' is the plane of the vertical cross-sectional view of FIG. 24A.

FIG. 24C is a vertical cross-sectional view along the vertical plane C-C' of FIG. 24B.

FIG. 24D is a vertical cross-sectional view along the vertical plane D-D' of FIG. 24B.

FIG. 24E is a vertical cross-sectional view along the vertical plane E-E' of FIG. 24B.

FIG. 24F is a vertical cross-sectional view along the vertical plane F-F' of FIG. 24B.

FIG. 25A is a vertical cross-sectional view of the exemplary structure after formation of a first etch mask layer and first gate cavities according to an embodiment of the present disclosure.

FIG. 25B is a top-down view of the exemplary structure of FIG. 25A. The vertical plane A-A' is the plane of the vertical cross-sectional view of FIG. 25A.

FIG. 25C is a vertical cross-sectional view along the vertical plane C-C' of FIG. 25B.

FIG. 25D is a vertical cross-sectional view along the vertical plane D-D' of FIG. 25B.

FIG. 26E is a vertical cross-sectional view along the vertical plane E-E' of FIG. 26B.

FIG. 26F is a vertical cross-sectional view along the vertical plane F-F' of FIG. 26B.

FIG. 27F is a vertical cross-sectional view along the vertical plane F-F' of FIG. 27B.

FIG. 28A is a vertical cross-sectional view of the exemplary structure after formation of gate stacks including a respective gate dielectric layer and a respective gate electrode and formation of a contact-level dielectric layer according to an embodiment of the present disclosure.

FIG. 28B is a top-down view of the exemplary structure of FIG. 28A. The vertical plane A-A' is the plane of the vertical cross-sectional view of FIG. 28A.

FIG. 28C is a vertical cross-sectional view along the vertical plane C-C' of FIG. 28B.

FIG. 28D is a vertical cross-sectional view along the vertical plane D-D' of FIG. 28B.

FIG. 28E is a vertical cross-sectional view along the vertical plane E-E' of FIG. 28B.

FIG. 28F is a vertical cross-sectional view along the vertical plane F-F' of FIG. 28B.

FIG. 29 is a flowchart illustrating steps for forming the exemplary structure of the present disclosure according to an embodiment of the present disclosure.

DETAILED DESCRIPTION

Figure 2A:
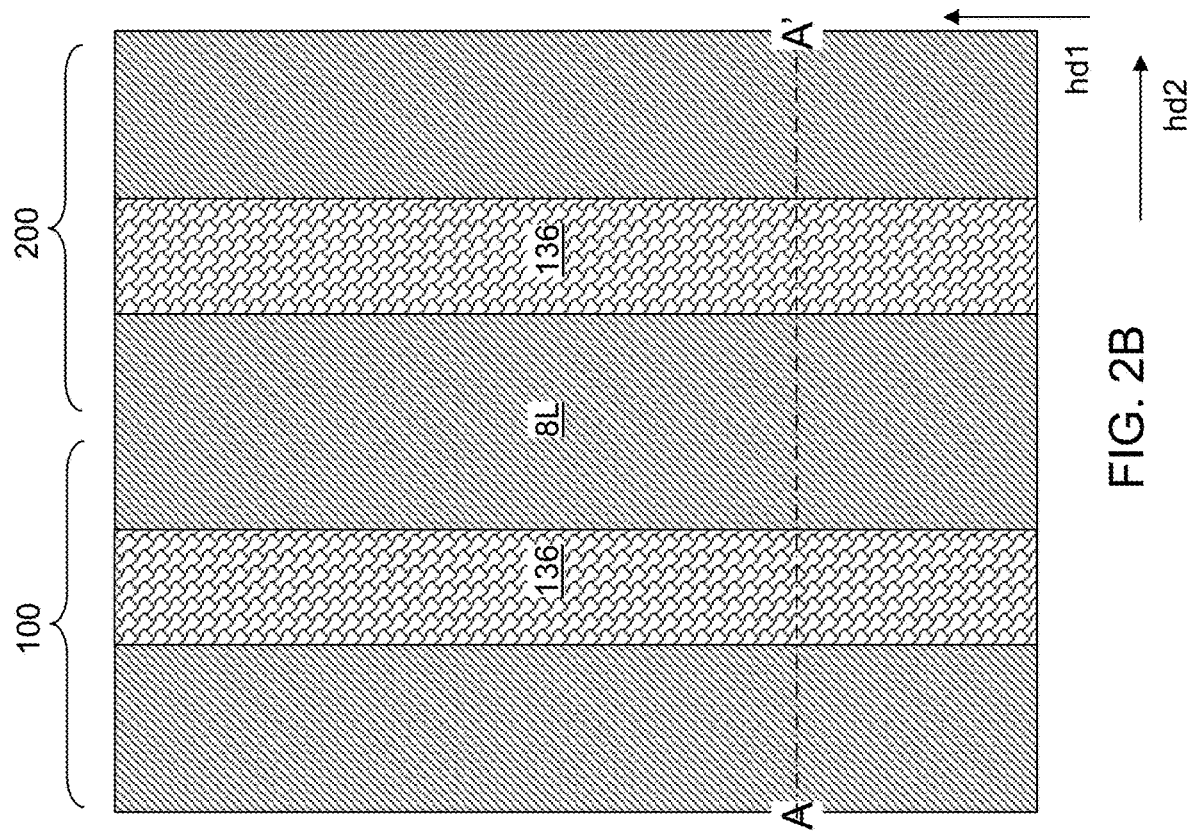
FIG. 2A is a vertical cross-sectional view of the exemplary structure after patterning semiconductor fin stacks according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

P-type gate-all-around transistors and n-type gate-all-around transistors have different optimal work functions. However, use of two different gate electrode materials for the two types of gate-all-around transistors require additional processing steps, and thus, increases the total processing cost and the turn-around time for manufacture. The optimal work function for a p-type field effect transistor is generally different from the optional work function for an n-type field effect transistor using a same channel material. However, if different channel materials are used for a p-type field effect transistor and an n-type field effect transistor, a same gate electrode material may provide the optimal work function for both the p-type field effect transistor and the n-type field effect transistor. Embodiments of the present disclosure use a first semiconductor channel material for an n-type field effect transistor and a second semiconductor channel material for a p-type field effect transistor, and use a common gate metal for the gate electrodes. In some embodiments, the first semiconductor channel material may be silicon, and the second semiconductor channel material may be a silicon-germanium alloy. In some embodiments, the first semiconductor channel material may be p-doped to provide an n-type field effect transistor, and the second semiconductor channel material may be n-doped to provide a p-type field effect transistor. The various aspects of embodiments of the present disclosure are now described in detail.

Referring to FIGS. 1A and 1B, an exemplary structure according to an embodiment of the present disclosure is illustrated, which includes a substrate containing a substrate single crystalline semiconductor layer 8L. FIG. 1A is vertical cross-sectional view of an exemplary structure after formation of an alternating stack of silicon-germanium layers and silicon layers, a hard mask layer, a semiconductor liner, a dielectric cover layer, and a semiconductor mandrel layer according to an embodiment of the present disclosure. FIG. 1B is a top-down view of the exemplary structure of FIG. 1A. The vertical plane A-A' is the plane of the vertical cross-sectional view of FIG. 1A.

The substrate single crystalline semiconductor layer 8L may include a semiconductor wafer such as a commercially available single crystalline silicon wafer. In one embodiment, the substrate single crystalline semiconductor layer 8L may comprise a single crystalline silicon layer. The thickness of the substrate may be in a range from 200 microns to 1 mm, although lesser and greater thicknesses may also be used.

An alternating stack of silicon-germanium layers 20L and silicon layers 10L may be deposited on the top surface of the substrate single crystalline semiconductor layer 8L by epitaxial deposition process. Each of the silicon-germanium layers 20L and the silicon layers 10L may be formed by an epitaxial deposition process in which a single crystalline silicon-germanium alloy material or a single crystalline silicon is deposited with epitaxial registry with underlying single crystalline semiconductor layers, i.e., the substrate single crystalline semiconductor layer 8L and any underlying silicon-germanium layer 20L and/or any underlying silicon layer 10L. In one embodiment, the silicon-germanium layers 20L may include a respective single crystalline silicon-germanium alloy material including germanium at an atomic concentration in a range from 15% to 35%, such as from 20% to 30%, although lesser and greater atomic concentrations may also be used. The thickness of each silicon-germanium layer 20L may be in a range from 4 nm to 20 nm, such as from 8 nm to 16 nm, although lesser and greater thicknesses may also be used. In one embodiment, the silicon layers 10L may include single crystalline silicon. The thickness of each silicon layer 10L may be in a range from 4 nm to 20 nm, such as from 8 nm to 16 nm, although lesser and greater thicknesses may also be used.

Generally, a vertically interlaced stack of silicon layers 10L and silicon-germanium layers 20L may be grown on a single crystalline semiconductor material of a substrate. Each silicon layer 10L and each silicon-germanium layer 20L may be single crystalline, and may be epitaxially aligned to one another. Thus, each crystallographic orientation having a same Miller index may be orientated along a same direction as the silicon layers 10L, the silicon-germanium layers 20L, and the substrate single crystalline semiconductor layer 8L.

The exemplary structure may include a first device region 100 in which first-type semiconductor nanostructure is to be subsequently formed, and a second device region 200 in which second semiconductor nanostructure is to be subsequently formed. A semiconductor nanostructure refers to a semiconductor structure having at least one nanoscale dimension, i.e., a dimension greater than 1 nm and less than 1 micron. The semiconductor nanostructure may include a gate-all-around (GAA) transistor, a stacked channel transistor, a multi-bridge channel transistor, a nanowire transistor, a multi-nanowire transistor, and so forth. In one embodiment, the semiconductor nanostructure can include at least one semiconductor channel having a nanoscale dimension such as a channel having a width and/or a height greater than 1 nm and less than 1 micron, such as greater than 1 nm and less than 100 nm. In one embodiment, the semiconductor nanostructure can include a GAA transistor. The portions of the silicon layers 10L and the silicon-germanium layers 20L located within the first device region 100 may be doped with dopants of the first conductivity type (for example, p-type), and the portions of the silicon layers 10L and the silicon-germanium layers 20L located within the second device region 200 may be doped with dopant atoms of the second conductivity type (for example, n-type). The atomic concentration of electrical dopants in each of the first device region 100 and the second device region 200 may be in a range from $1.0 \times 10^{14}/cm^3$ to $1.0 \times 10^{17}/cm^3$, although lesser and greater dopant concentrations may also be used. The p-type dopants and the n-type dopants may be introduced into the first device region 100 or into the second device region 200 by performing a respective masked ion implantation process.

Optionally, a silicon oxide liner (not shown) may be formed over the alternating stack of silicon-germanium layers 20L and silicon layers 10L. If present, the silicon oxide liner may have a thickness in a range from 1 nm to 3 nm, although lesser and greater thicknesses may also be used. A hard mask layer 130L may be deposited over the alternating stack of silicon-germanium layers 20L and silicon layers 10L. The hard mask layer 130L includes a hard mask material such as silicon nitride, and may have a thickness in a range from 20 nm to 40 nm, although lesser and greater thicknesses may also be used.

A semiconductor liner 132L may be optionally formed over the hard mask layer 130L. The semiconductor liner 132L includes a semiconductor material such as amorphous silicon, and may have a thickness in a range from 5 nm to 10 nm, although lesser and greater thicknesses may also be used. A dielectric cover layer 134L may be formed over the semiconductor liner 132L. The dielectric cover layer 134L includes a dielectric material such as silicon oxide, and may have a thickness in a range from 300 nm to 600 nm, although lesser and greater thicknesses may also be used. A semiconductor mandrel layer 136L may be deposited over the dielectric cover layer 134L. The semiconductor mandrel layer 136L includes a semiconductor material such as polysilicon, and may have a thickness in a range from 100 nm to 200 nm, although lesser and greater thicknesses may also be used. While the present disclosure is described employing an embodiment in which the semiconductor nanostructure comprises a GAA transistor, embodiments are expressly contemplated herein in which the semiconductor nanostructure comprises a stacked channel transistor, a multi-bridge channel transistor, a nanowire transistor, a multi-nanowire transistor, or other types of field effect transistors including a nanoscale semiconductor channel.

Figure 2B:
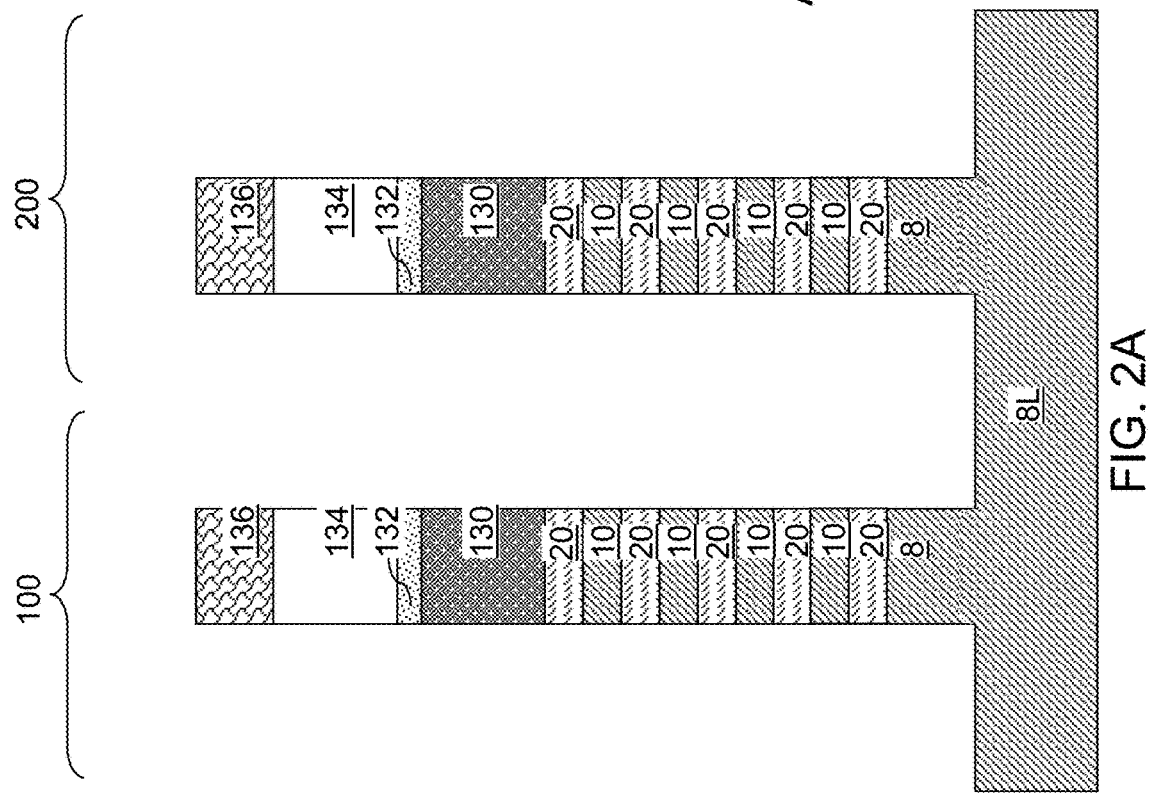
FIG. 2B is a top-down view of the exemplary structure of FIG. 2A. The vertical plane A-A' is the plane of the vertical cross-sectional view of FIG. 2A.

FIG. 2A is a vertical cross-sectional view of the exemplary structure after patterning semiconductor fin stacks according to an embodiment of the present disclosure. FIG. 2B is a top-down view of the exemplary structure of FIG. 2A. The vertical plane A-A' is the plane of the vertical cross-sectional view of FIG. 2A. Referring to FIGS. 2A and 2B, a photoresist layer (not shown) may be applied over the layer stack of FIGS. 1A and 1B, and may be lithographically patterned to form a line and space pattern that laterally extends along a first horizontal direction hd1 and laterally spaced apart along a second horizontal direction hd2 that is perpendicular to the first horizontal direction hd1. An anisotropic etch process may be performed to transfer the pattern in the photoresist layer through underlying material layers and into a top portion of the substrate single crystalline semiconductor layer 8L Fin stack structures including patterned portions of the underlying material layers and the top portion of the substrate single crystalline semiconductor layer 8L may be formed.

Each fin stack structure may include, from bottom to top, a single crystalline semiconductor fin 8 that is a patterned top portion of the substrate single crystalline semiconductor layer 8L, a semiconductor plate stack (10, 20) that is an alternating stack of silicon-germanium plates 20 and silicon plates 10, an optional silicon oxide liner, a hard mask plate 130 that is a patterned portion of the hard mask layer 130L, a semiconductor liner fin 132 that is a patterned portion of the semiconductor liner 132L, a dielectric cover fin 134 that is a patterned portion of the dielectric cover layer 134L, and an optional semiconductor mandrel fin 136 that is a patterned portion of the semiconductor mandrel layer 136L. In one embodiment, each single crystalline semiconductor fin 8 may be a single crystalline silicon fin. Each silicon plate 10 is a patterned portion of a silicon layer 10L. Each silicon-germanium plate 20 is a patterned portion of a silicon-germanium layer 20L.

Each fin stack structure (8, 10, 20, 130, 132, 134, 136) may have a uniform width, which may be in a range from 10 nm to 300 nm, such as from 20 nm to 150 nm, although lesser and greater widths may also be used. The spacing between neighboring fin stack structures (8, 10, 20, 130, 132, 134, 136) may be in a range from 50 nm to 250 nm, although lesser and greater thicknesses may also be used. Each fin stack structure (8, 10, 20, 130, 132, 134, 136) may laterally extend along the first horizontal direction hd1, and may be laterally spaced apart along the second horizontal direction hd2.

Generally, the vertically interlaced stack of the silicon layers 10L and the silicon-germanium layers 20L may be patterned to provide silicon plate stacks (10, 20) in the first device region 100 and second semiconductor plate stacks (10, 20) in the second device region 200. Each silicon plate stack (10, 20) formed in the first device region 100 includes first silicon plates 10 vertically interlaced with first silicon-germanium plates 20. Each silicon plate stack (10, 20) may have a doping of a first conductivity type, such as p-type. Each second semiconductor plate stack (10, 20) formed in the second device region 200 comprises second silicon plates 10 vertically interlaced with second silicon-germanium plates 20. Each second semiconductor plate stack (10, 20) may have a doping of a second conductivity type, such as n-type.

A hard mask plate 130 may be formed above the semiconductor plate stack (10, 20). In one embodiment, sidewalls of a fin stack structure (8, 10, 20, 130, 132, 134, 136) may be vertically coincident, i.e., may be located within a same vertical plane. For example, sidewalls of the hard mask plate 130 of a fin stack structure (8, 10, 20, 130, 132, 134, 136) may be vertically coincident with sidewalls of the semiconductor plate stack (10, 20).

FIG. 3A is a vertical cross-sectional view of the exemplary structure after formation of shallow trench isolation structures according to an embodiment of the present disclosure. FIG. 3B is a top-down view of the exemplary structure of FIG. 3A. The vertical plane A-A' is the plane of the vertical cross-sectional view of FIG. 3A. Referring to FIGS. 3A and 3B, a dielectric fill material such as silicon oxide may be deposited in the trenches between the fin stack structures (8, 10, 20, 130, 132, 134, 136). A planarization process such as a chemical mechanical planarization process may be performed to remove portions of the dielectric fill material located above the horizontal plane including the top surfaces of the semiconductor liner fins 132, the optional semiconductor mandrel fins 136, and the dielectric cover fins 134. Remaining portions of the dielectric fill material comprise shallow trench isolation structures 12.

FIG. 4A is a vertical cross-sectional view of the exemplary structure after vertically recessing the shallow trench isolation structures according to an embodiment of the present disclosure. FIG. 4B is a top-down view of the exemplary structure of FIG. 4A. The vertical plane A-A' is the plane of the vertical cross-sectional view of FIG. 4A.

Referring to FIGS. 4A and 4B, top surfaces of the shallow trench isolation structures 12 may be vertically recessed by an etch back process. The etch back process may use an isotropic etch process (such as a wet etch process) or an anisotropic etch process (such as a reactive ion etch process). In embodiments that use a reactive ion etch process, the semiconductor liner fins 132 and/or the hard mask plates 130 may be used as etch mask structures. The top surfaces of the shallow trench isolation structures 12 may be recessed such that the top surfaces of the shallow trench isolation structures 12 are at, or above, the interface between the bottommost silicon plate 10 and the bottommost silicon-germanium plates 20. In embodiments in which the top surfaces of the shallow trench isolation structures 12 are vertically recessed relative to the top surfaces of the bottommost silicon plate 10, the vertical recess distance may be in a range from 1 nm to 15 nm, although lesser and greater vertical recess distances may also be used.

FIG. 5A is a vertical cross-sectional view of the exemplary structure after formation of cladding silicon-germanium alloy structures according to an embodiment of the present disclosure. FIG. 5B is a top-down view of the exemplary structure of FIG. 5A. The vertical plane A-A' is the plane of the vertical cross-sectional view of FIG. 5A. Referring to FIGS. 5A and 5B, a silicon-germanium alloy may be anisotropically deposited by an anisotropic deposition process such as a plasma-enhanced physical vapor deposition (PECVD) process. A silicon-germanium alloy layer is deposited with a greater thickness over the top surfaces of the hard mask plates 130 than on the top surfaces of the shallow trench isolation structures 12 due to the anisotropic nature of the deposition process. The silicon-germanium alloy layer may include germanium at an atomic concentration in a range from 25% to 50%, such as from 35% to 45%, although lesser and greater thicknesses may also be used. The atomic concentration of germanium in the silicon-germanium alloy layer may be higher than the atomic concentration of germanium in the silicon-germanium plates 20 by at least 10%, such as from 10% to 20%. In one embodiment, the atomic percentage of germanium in the silicon-germanium alloy layer may he higher than the atomic concentration of germanium in the silicon-germanium plates 20 to provide selective lateral recessing of the material of the silicon-germanium alloy layer relative to the silicon-germanium plates 20. The silicon-germanium alloy layer may be polycrystalline. In one embodiment, the anisotropic deposition process may be depletive to facilitate deposition of a thicker film on the top surfaces of the hard mask plates 130 than on the top surfaces of the shallow trench isolation structures 12. The silicon-germanium alloy may be formed on sidewalls of the semiconductor plate stacks (10, 20) and the hard mask plates 130.

An anisotropic etch process may be performed to vertically recess horizontal portions of the deposited silicon-germanium alloy layer. The duration of the anisotropic etch process may be selected such that horizontal portions of the silicon-germanium alloy layer located on top of the shallow trench isolation structures 12 are removed, while horizontal portions of the silicon-germanium alloy layer overlying the top surfaces of the hard mask plates 130 are not completely removed. Each continuous remaining portion of the silicon-germanium alloy layer is herein referred to as a cladding silicon-germanium alloy structure 28. Each cladding silicon-germanium alloy structure 28 may have an inverted U-shaped vertical cross-sectional profile. Each sidewall of the cladding silicon-germanium alloy structures 28 may have a lateral thickness in a range from 6 nm to 20 nm, although lesser and greater thicknesses may also be used. The vertical thickness of the horizontal top portion of each cladding silicon-germanium alloy structure 28 may be in a range from 6 nm to 20 nm, although lesser and greater vertical thicknesses may also be used. The spacing between neighboring pairs of cladding silicon-germanium alloy structures 28 may be in a range from 20 nm to 200 nm, although lesser and greater spacings may also be used.

FIG. 6A is a vertical cross-sectional view of the exemplary structure after formation of hybrid dielectric fins according to an embodiment of the present disclosure. FIG. 6B is a top-down view of the exemplary structure of FIG. 6A. The vertical plane A-A' is the plane of the vertical cross-sectional view of FIG. 6A. Referring to FIGS. 6A and 6B, hybrid dielectric fins (14, 16) may be formed in the trenches between cladding silicon-germanium alloy structures 28. Each hybrid dielectric fin (14, 16) may include a dielectric fin liner 14 and a silicon oxide fill material portion 16. The hybrid dielectric fins (14, 16) may be formed by conformally depositing a dielectric fin liner layer and a silicon oxide fill material, and by removing portions of the dielectric fin liner layer and the silicon oxide fill material from above the horizontal plane including the top surfaces of the cladding silicon-germanium alloy structures 28. The removal of the portions of the dielectric fin liner layer and the silicon oxide fill material from above the horizontal plane including the top surfaces of the cladding silicon-germanium alloy structures 28 may be performed, for example, by a chemical mechanical polishing (CMP) operation. Each dielectric fin liner 14 includes a dielectric material having a dielectric constant not greater than 7.9. For example, each dielectric fin liner 14 may include a material such as silicon nitride, silicon carbide nitride, or silicon carbide oxynitride. Other suitable dielectric materials are within the contemplated scope of disclosure. The thickness of each dielectric fin liner 14 may be in a range from 5 nm to 10 nm, although lesser and greater thicknesses may also be used. Each silicon oxide fill material portion 16 may include undoped silicate glass or a doped silicate glass. Each hybrid dielectric fin (14, 16) laterally extends along the first horizontal direction and may have a uniform width along the second horizontal direction. The width of each hybrid dielectric fin (14, 16) along the second horizontal direction hd2 may be in a range from 20 nm to 200 nm, although lesser and greater spacings may also be used.

FIG. 7A is a vertical cross-sectional view of the exemplary structure after vertically recessing the hybrid dielectric fins according to an embodiment of the present disclosure. FIG. 7B is a top-down view of the exemplary structure of FIG. 7A. The vertical plane A-A' is the plane of the vertical cross-sectional view of FIG. 7A. Referring to FIGS. 7A and 7B, the top surfaces of the hybrid dielectric fins (14, 16) may be vertically recessed by performing at least one etch process, which may include at least one isotropic etch process (such as a wet etch process) and/or at least one anisotropic etch process (such as a reactive ion etch process). The top surfaces of the recessed hybrid dielectric fins (14, 16) may be located between the horizontal plane including the interface between the topmost silicon-germanium plates 20 and the hard mask plates 130 and the horizontal plane including the interface between the topmost silicon-germanium plates 20 and the topmost silicon plates 10.

FIG. 8A is a vertical cross-sectional view of the exemplary structure after formation of etch stop fins according to an embodiment of the present disclosure. FIG. 8B is a top-down view of the exemplary structure of FIG. 8A. The vertical plane A-A' is the plane of the vertical cross-sectional view of FIG. 8A. Referring to FIGS. 8A and 8B, an etch stop dielectric material may be deposited in the trenches overlying the hybrid dielectric fins (14, 16) between each neighboring pair of cladding silicon-germanium alloy structures 28. The etch stop dielectric material includes a dielectric material that may be subsequently used as an etch stop material. For example, the etch stop dielectric material may include aluminum oxide, hafnium oxide, lanthanum oxide, or silicon carbide nitride. Other suitable dielectric materials are within the contemplated scope of disclosure. In one embodiment, the etch stop dielectric material may include a metal oxide dielectric material having a dielectric constant greater than 7.9. Optionally, a silicon oxide material layer may be deposited over the etch stop dielectric material to facilitate a subsequent chemical mechanical planarization, which is performed to remove the silicon oxide material layer and excess portions of the etch stop dielectric material from above the horizontal plane including the top surfaces of the cladding silicon-germanium alloy structures 28. Each remaining portion of the etch stop dielectric material comprises an etch stop dielectric fin 18. The top surfaces of the etch stop dielectric fins 18 may be in the same horizontal plane as the top surfaces of the cladding silicon-germanium alloy structures 28.

FIG. 9A is a vertical cross-sectional view of the exemplary structure after removal of hard mask plates and upper portions of the cladding silicon-germanium alloy structures according to an embodiment of the present disclosure. FIG. 9B is a top-down view of the exemplary structure of FIG. 9A. The vertical plane A-A' is the plane of the vertical cross-sectional view of FIG. 9A. Referring to FIGS. 9A and 9B, top portions of the cladding silicon-germanium alloy structures 28 may be removed, for example, by performing a wet etch process. In an illustrative example, the wet etch process may use a mixture of ammonium hydroxide and hydrogen peroxide, or a mixture of hydrofluoric acid, nitric acid, acetic acid, glycerin, and/or water.

Subsequently, the hard mask plates 130 may be removed selectively by an isotropic etch process. For example, a wet etch process using hot phosphoric acid may be performed to remove the hard mask plates 130. Physically exposed sidewall portions of the cladding silicon-germanium alloy structures 28 may be subsequently removed by performing another wet etch process. Each topmost silicon-germanium plate 20 may be collaterally etched by the wet etch process simultaneously with removal of the physically exposed sidewall portions of the cladding silicon-germanium alloy structures 28. Remaining portions of the cladding silicon-germanium alloy structures 28 may be located below the horizontal plane including the top surfaces of the topmost silicon plates 10. Inter-fin recesses 29 may be formed between neighboring pairs of etch stop dielectric fins 18.

FIG. 10A is a vertical cross-sectional view of the exemplary structure after formation of gate template structures including a respective set of a sacrificial gate liner, a sacrificial gate structure, a sacrificial gate cap, and a gate mask structure, and subsequent formation of gate template spacers according to an embodiment of the present disclosure. FIG. 10B is a top-down view of the exemplary structure of FIG. 10A. The vertical plane A-A' is the plane of the vertical cross-sectional view of FIG. 10A. Referring to FIGS. 10A and 10B, gate template structures (30, 32, 34, 36) including a respective set of a sacrificial gate liner 30, a sacrificial gate structure 32, a sacrificial gate cap 34, and a gate mask structure 36 may be formed over the etch stop dielectric fins 18, the semiconductor plate stacks (10, 20), and the cladding silicon-germanium alloy structures 28. For example, a continuous sacrificial gate liner layer 30 and a continuous sacrificial gate structure material layer 32 may be deposited and planarized to provide a horizontal planar surface. The continuous sacrificial gate liner layer 30 may include a conformal silicon oxide liner having a thickness in a range from 5 nm to 10 nm, although lesser and greater thicknesses may also be used. The continuous sacrificial gate structure material layer 30 includes a sacrificial material that may be removed selective to the material of the continuous sacrificial gate liner layer. For example, the continuous sacrificial gate structure material layer may include, for example, polysilicon. The top surface of the continuous sacrificial gate structure material layer may be planarized by chemical mechanical planarization. The vertical thickness of the continuous sacrificial gate structure material layer over the etch stop dielectric fins 18 may be in a range from 100 nm to 200 nm, although lesser and greater thicknesses may also be used.

A continuous sacrificial gate cap material layer 34 may be subsequently deposited over the continuous sacrificial gate structure material layer 32. The continuous sacrificial gate cap material layer 34 may include, for example, silicon nitride. The thickness of the continuous sacrificial gate cap material layer may be in a range from 20 nm to 40 nm, although lesser and greater thicknesses may also be used. A continuous gate mask material layer 36 may be deposited over the continuous sacrificial gate cap material layer 34. The continuous gate mask material layer includes a hard gate mask material such as silicon oxide. The thickness of the continuous gate mask material layer 36 may be in a range from 20 nm to 40 nm, although lesser and greater thicknesses may also be used.

The layer stack of the continuous gate mask material layer 36, the continuous sacrificial gate cap material layer 34, the continuous sacrificial gate structure material layer 32, and the continuous sacrificial gate liner layer 30 may be patterned into the gate template structures (30, 32, 34, 36), for example, by applying and patterning a photoresist layer (not shown) thereabove, and by performing an anisotropic etch process that transfers the pattern in the photoresist material layer thorough the layer stack. The pattern in the photoresist layer may be a line and space pattern in which each line laterally extends along the second horizontal direction hd2, and each space laterally extends along the second horizontal direction hd2. The anisotropic etch process may include multiple anisotropic etch processes for removing the various material layers in the layer stack. The terminal step of the anisotropic etch process may etch through unmasked portions of the continuous sacrificial gate liner layer 30. Alternatively, the unmasked portions of the continuous sacrificial gate liner layer 30 may be removed by an isotropic etch process such as a wet etch process using dilute hydrofluoric acid. The photoresist layer may be subsequently removed, for example, by ashing.

Each patterned portion of the continuous sacrificial gate liner layer comprises a sacrificial gate liner 30. Each patterned portion of the continuous sacrificial gate structure material layer comprises a sacrificial gate structure 32. Each patterned portion of the continuous sacrificial gate cap material layer comprises a sacrificial gate cap 34. Each patterned portion of the continuous gate mask material layer comprises a gate mask structure 36. Each gate template structures (30, 32, 34, 36) may have a uniform width along the first horizontal direction hd1, which may be in a range from 10 nm to 200 nm, such as from 20 nm to 100 nm, although lesser and greater widths may also be used. The spacing between a neighboring pair of gate template structures (30, 32, 34, 36) may be in a range from 40 nm to 400 nm, such as from 80 nm to 200 nm, although lesser and greater spacings may also be used.

A dielectric gate spacer material layer may be conformally deposited over the gate template structures (30, 32, 34, 36). The dielectric gate spacer material layer includes a dielectric material such as silicon nitride or silicon carbide nitride. Other suitable dielectric materials are within the contemplated scope of disclosure. The thickness of the dielectric gate spacer material layer may be in a range from 5 nm to 15 nm, although lesser and greater thicknesses may also be used. An anisotropic etch process may be performed to etch horizontal portions of the dielectric gate spacer material layer. Each remaining vertical portion of the dielectric gate spacer material layer comprises a dielectric gate spacer 38. Each dielectric gate spacer 38 may contact a sidewall of a respective gate template structure (30, 32, 34, 36), and may have laterally extend along the second horizontal direction hd2 with a uniform thickness, which may be in a range from 5 nm to 15 nm, though lesser and greater thicknesses may also be used.

Figure 11B:
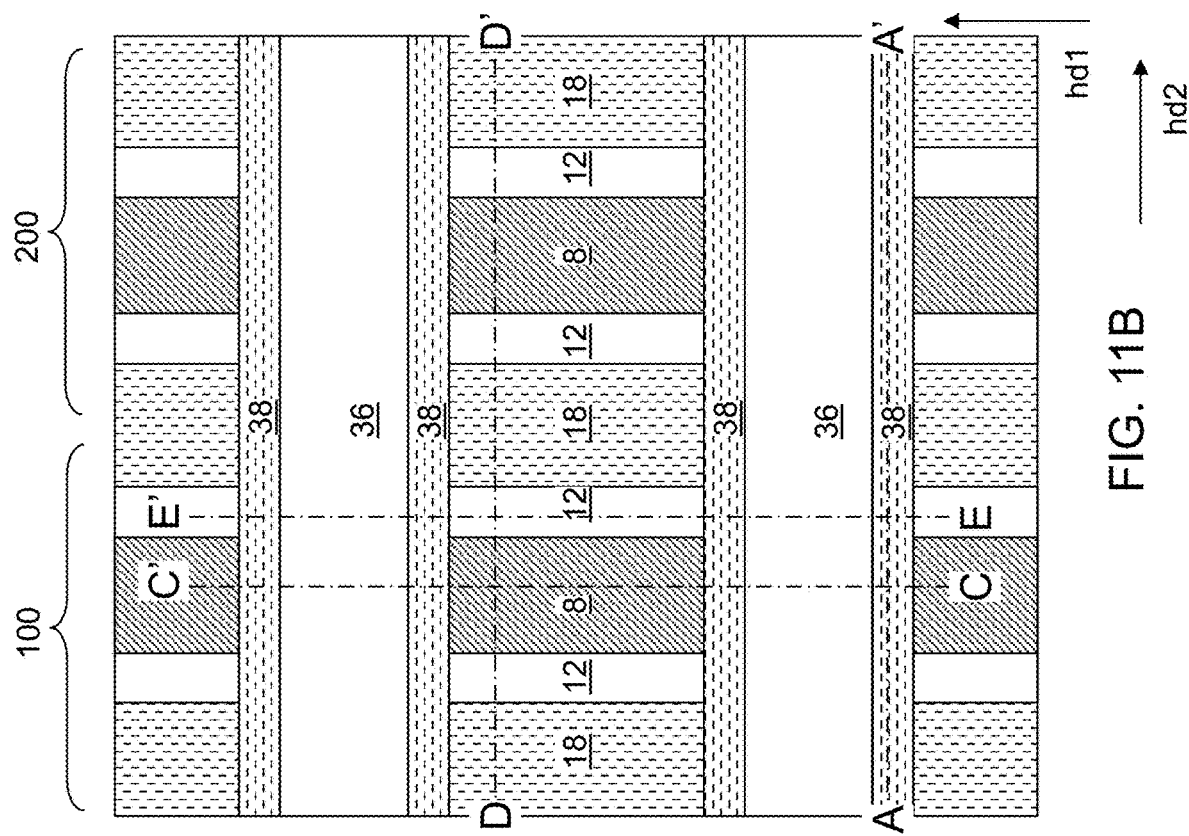
FIG. 11B is a top-down view of the exemplary structure of FIG. 11A. The vertical plane A-A' is the plane of the vertical cross-sectional view of FIG. 11A.
Figure 11A:
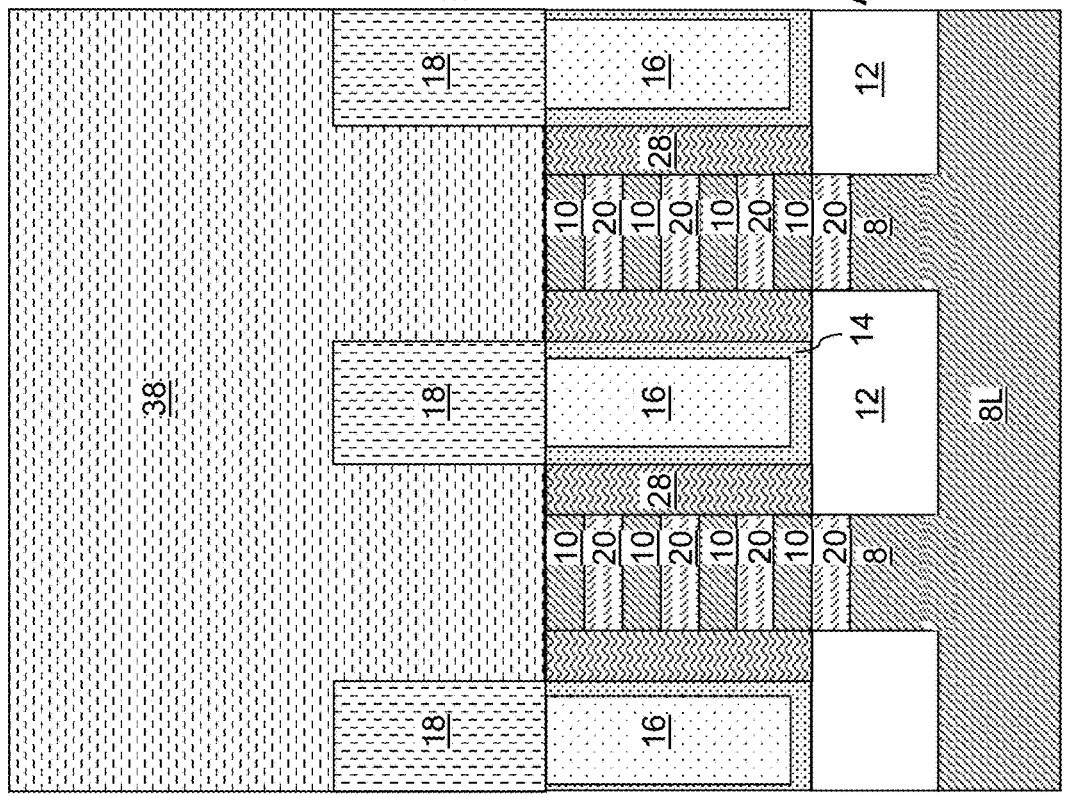
FIG. 11A is a vertical cross-sectional view of the exemplary structure after removing end portions of semiconductor fin stacks according to an embodiment of the present disclosure.
Figure 11E:
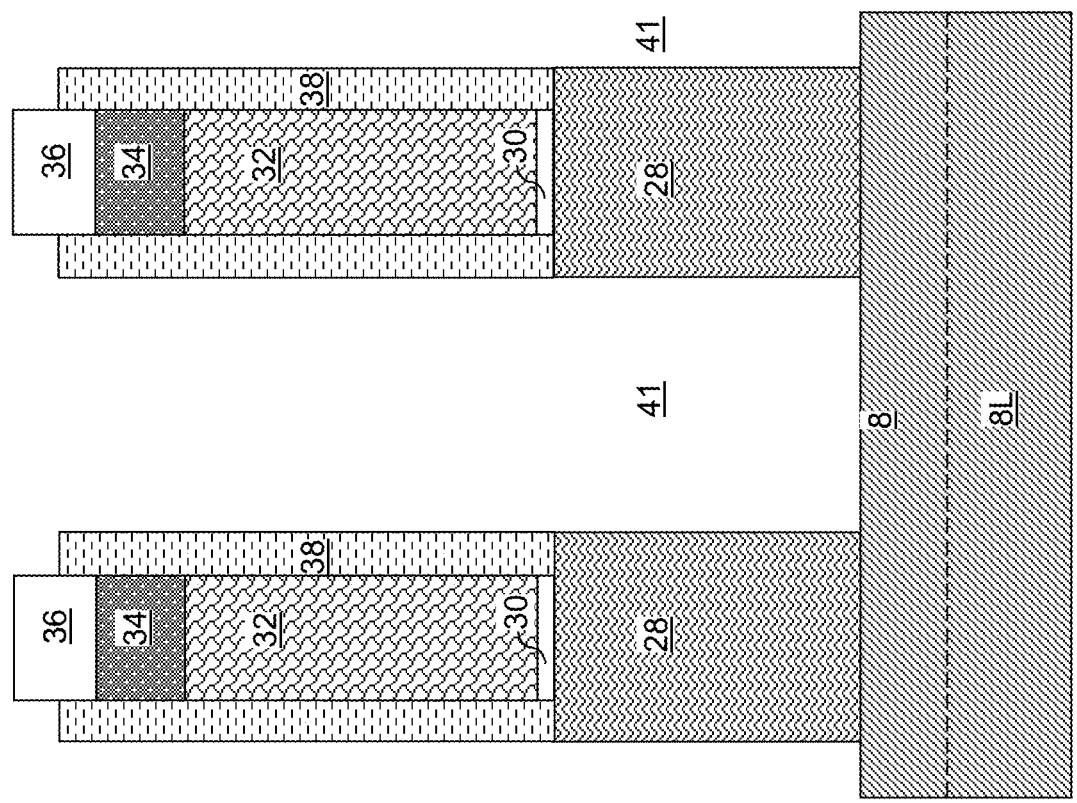
FIG. 11E is a vertical cross-sectional view along the vertical plane E-E' of FIG. 11B.

FIG. 11A is a vertical cross-sectional view of the exemplary structure after removing end portions of semiconductor fin stacks according to an embodiment of the present disclosure. FIG. 11B is a top-down view of the exemplary structure of FIG. 11A. The vertical plane A-A' is the plane of the vertical cross-sectional view of FIG. 11A. FIG. 11C is a vertical cross-sectional view along the vertical plane C-C' of FIG. 11B. FIG. 11D is a vertical cross-sectional view along the vertical plane D-D' of FIG. 11B. FIG. 11E is a vertical cross-sectional view along the vertical plane E-E' of FIG. 11B. Referring to FIGS. 11A-11E, an anisotropic etch process may be performed to etch portions of the semiconductor plate stacks (10, 20) and the cladding silicon-germanium alloy structures 28 that are not masked by the gate template structure (30, 32, 34, 36), the dielectric gate spacers 38, or the etch stop dielectric fins 18 are removed by the anisotropic etch process. The anisotropic etch formed a source/drain cavity 41 in volumes from which portions of the semiconductor plate stacks (10, 20) and the cladding silicon-germanium alloy structures 28 are removed. The source/drain cavities 41 collectively refer to source cavities and drain cavities. A top surface of a single crystalline semiconductor fin 8 may be physically exposed at the bottom each source/drain cavity 41. The top surfaces of the single crystalline semiconductor fins 8 may be vertically recessed below the horizontal plane including the top surfaces of the shallow trench isolation structures 12.

Each semiconductor plate stack (10, 20) may be divided into multiple discrete semiconductor plate stacks (10, 20) that underlie a respective one of the gate template structures (30, 32, 34, 36). The multiple discrete semiconductor plate stacks (10, 20) formed by dividing a semiconductor plate stack (10, 20) are arranged along the first horizontal direction hd2, and laterally spaced apart along the first horizontal direction hd1. Each semiconductor plate stack (10, 20) may have vertical sidewalls that are vertically coincident with overlying sidewalls of the dielectric gate spacers 38. Further, each cladding silicon-germanium alloy structure 28 may be divided into a plurality of cladding silicon-germanium alloy structures 28 that underlie a respective one of the gate template structures (30, 32, 34, 36). Sidewall of the plurality of cladding silicon-germanium alloy structures 28 may be vertically coincident with sidewalls of the gate template structures (30, 32, 34, 36). Generally, a sacrificial gate structure 32 and a dielectric gate spacer 38 are formed over a middle portion of each semiconductor plate stack (10, 20).

Figure 12E:
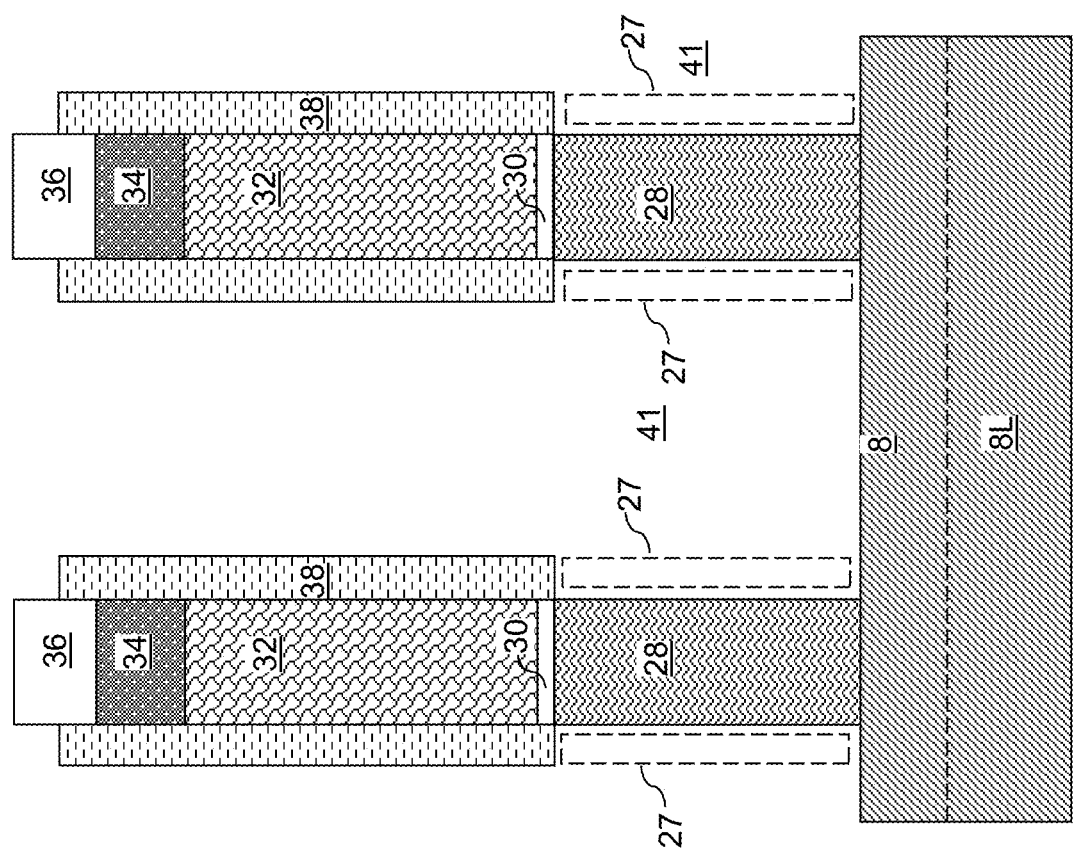
FIG. 12E is a vertical cross-sectional view along the vertical plane E-E' of FIG. 12B.

FIG. 12A is a vertical cross-sectional view of the exemplary structure after laterally recessing cladding silicon-germanium alloy structures according to an embodiment of the present disclosure. FIG. 12B is a top-down view of the exemplary structure of FIG. 12A. The vertical plane A-A' is the plane of the vertical cross-sectional view of FIG. 12A. FIG. 12C is a vertical cross-sectional view along the vertical plane C-C' of FIG. 12B. FIG. 12D is a vertical cross-sectional view along the vertical plane D-D' of FIG. 12B. FIG. 12E is a vertical cross-sectional view along the vertical plane E-E' of FIG. 12B. Referring to FIGS. 12A-12E, the cladding silicon-germanium alloy structures 28 may be laterally recessed by performing an isotropic etch process. The isotropic etch process may laterally recess the polycrystalline material of the cladding silicon-germanium alloy structure 28 selective to the materials of the silicon plates 10 and the silicon-germanium plates 20. The higher germanium atomic concentration in the cladding silicon-germanium alloy structure 28 than the germanium atomic concentration in the silicon-germanium plates 20 and the polycrystalline nature of the cladding silicon-germanium alloy structure 28 (compared to the single crystalline nature of the silicon-germanium plates 20) provides a higher etch rate for the cladding silicon-germanium alloy structures 28 relative to the silicon-germanium plates 20. The isotropic etch process may include a wet etch process using a mixture of ammonium hydroxide and hydrogen peroxide.

Outer recess cavities 27 may be formed in volumes from which the materials of the cladding silicon-germanium alloy structures 28 are removed. The recessed sidewalls of the cladding silicon-germanium alloy structures 28 may be at, or about, a vertical plane including an overlying interface between a gate template structure (30, 32, 34, 36) and a dielectric gate spacer 38.

Figure 13B:
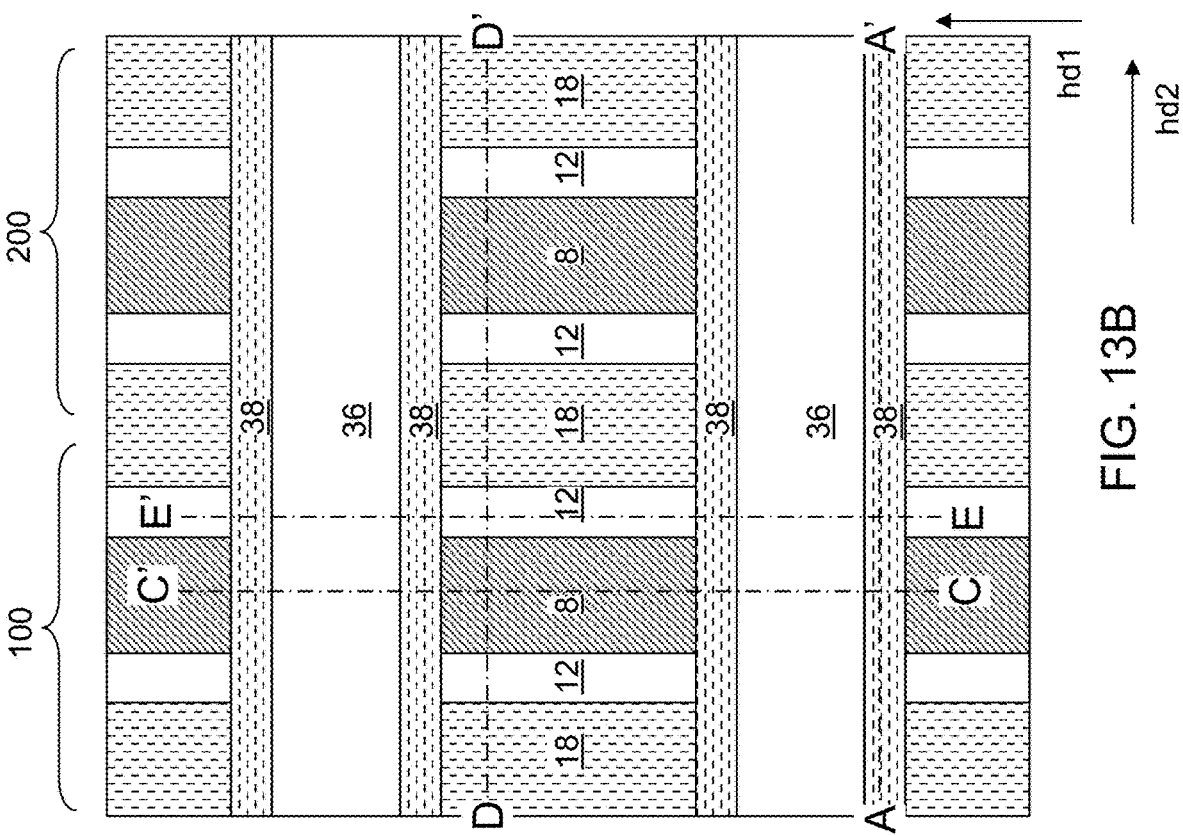
FIG. 13B is a top-down view of the exemplary structure of FIG. 13A. The vertical plane A-A' is the plane of the vertical cross-sectional view of FIG. 13A.
Figure 13A:
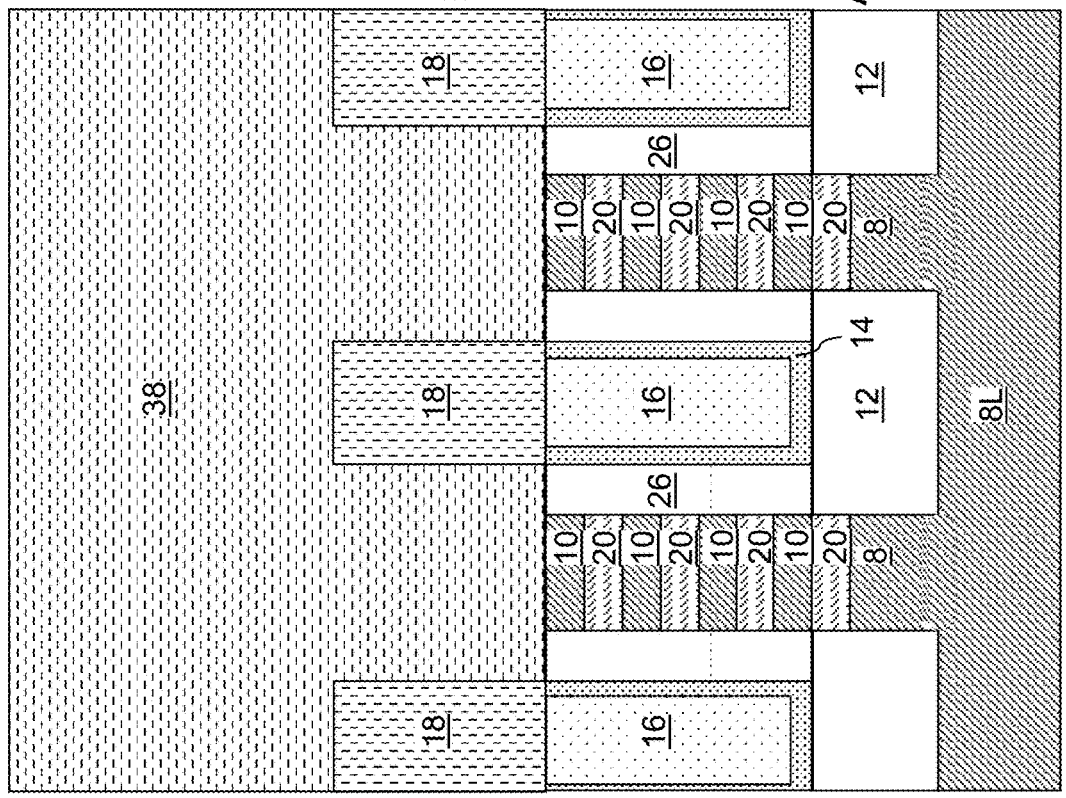
FIG. 13A is a vertical cross-sectional view of the exemplary structure after formation of outer dielectric channel spacers according to an embodiment of the present disclosure.
Figure 13E:
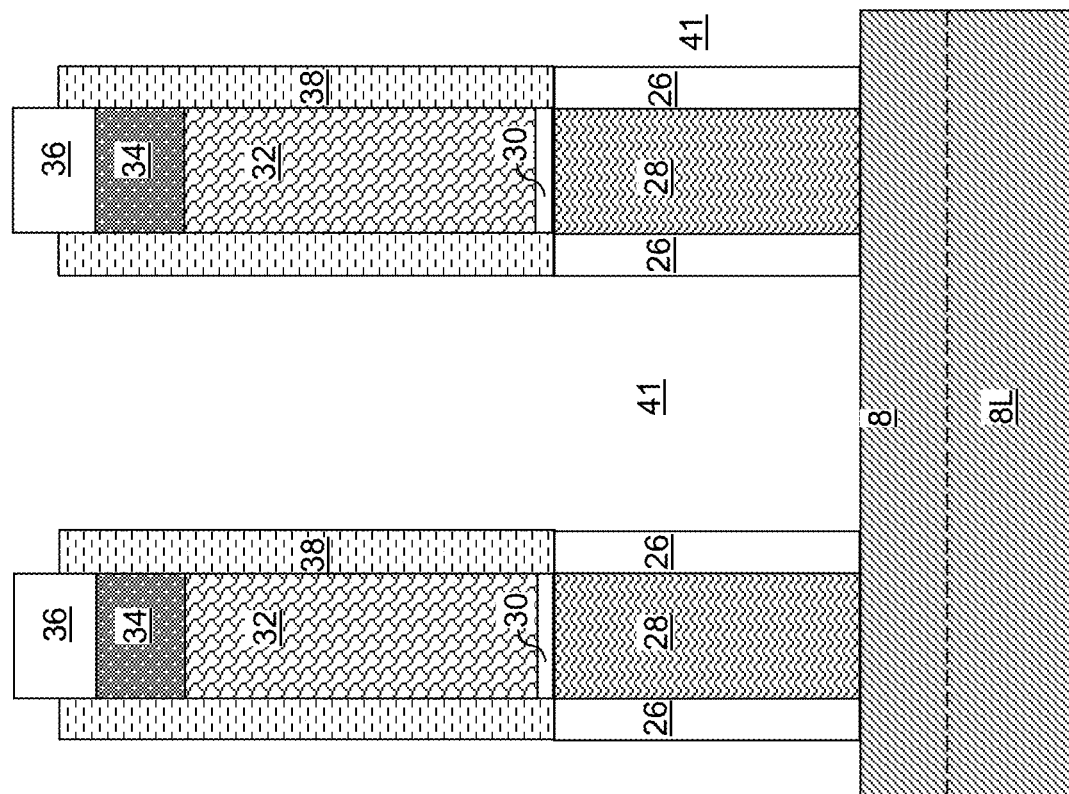
FIG. 13E is a vertical cross-sectional view along the vertical plane E-E' of FIG. 13B.

FIG. 13A is a vertical cross-sectional view of the exemplary structure after formation of outer dielectric channel spacers according to an embodiment of the present disclosure. FIG. 13B is a top-down view of the exemplary structure of FIG. 13A. The vertical plane A-A' is the plane of the vertical cross-sectional view of FIG. 13A. FIG. 13C is a vertical cross-sectional view along the vertical plane C-C' of FIG. 13B. FIG. 13D is a vertical cross-sectional view along the vertical plane D-D' of FIG. 13B. FIG. 13E is a vertical cross-sectional view along the vertical plane E-E' of FIG. 13B. Referring to FIGS. 13A-13E, a dielectric fill material such as silicon oxide may be conformally deposited to fill the outer recess cavities 27. Portions of the dielectric fill material deposited outside the outer recess cavities 27 may be removed by an anisotropic etch process. Each remaining vertical portion of the dielectric fill material that fills a respective one of the outer recess cavities 27 comprises an outer dielectric channel spacer 26. Each outer dielectric channel spacer 26 may be laterally offset outward from an adjacent semiconductor plate stack (10, 20) along the second horizontal direction hd2.

Figure 14E:
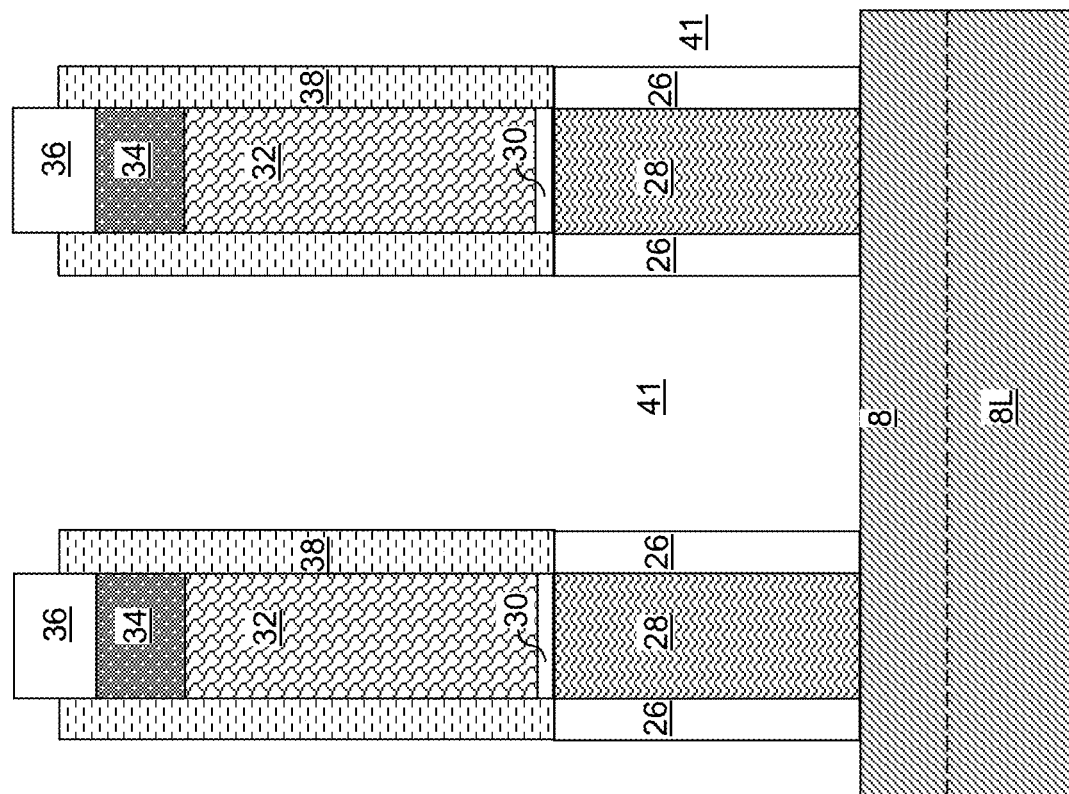
FIG. 14E is a vertical cross-sectional view along the vertical plane E-E' of FIG. 14B.

FIG. 14A is a vertical cross-sectional view of the exemplary structure after laterally recessing semiconductor plates according to an embodiment of the present disclosure. FIG. 14B is a top-down view of the exemplary structure of FIG. 14A. The vertical plane A-A' is the plane of the vertical cross-sectional view of FIG. 14A. FIG. 14C is a vertical cross-sectional view along the vertical plane C-C' of FIG. 14B. FIG. 14D is a vertical cross-sectional view along the vertical plane D-D' of FIG. 14B. FIG. 14E is a vertical cross-sectional view along the vertical plane E-E' of FIG. 14B. Referring to FIGS. 14A-14E, the semiconductor plate stacks (10, 20) may be laterally recessed by an isotropic etch process that etches the materials of the semiconductor plate stacks (10, 20) at about the same etch rate. In one embodiment, the isotropic etch process may include a wet etch process using a combination of hydrofluoric acid, nitric acid, and acetic acid. The lateral recessing of the semiconductor plate stacks (10, 20) shortens the channel length than a lateral separation distance between physically exposed outer sidewalls of a pair of outer dielectric channel spacers 26 underneath a gate template structures (30, 32, 34, 36). Thus, source/drain regions may be subsequently formed such that the channel length is shorter that the lateral spacing between portions of source/drain regions that contact the outer dielectric channel spacers 26. The lateral recess distance may be in a range from 1 nm to 10 nm, such as from 2 nm to 6 nm, although lesser and greater lateral recess distances may also be used.

FIG. 15A is a vertical cross-sectional view of the exemplary structure after masking a second transistor region and selective removal of end portions of silicon-germanium plates according to an embodiment of the present disclosure. FIG. 15B is a top-down view of the exemplary structure of FIG. 15A. The vertical plane A-A' is the plane of the vertical cross-sectional view of FIG. 15A. FIG. 15C is a vertical cross-sectional view along the vertical plane C-C' of FIG. 15B. FIG. 15D is a vertical cross-sectional view along the vertical plane D-D' of FIG. 15B. FIG. 15E is a vertical cross-sectional view along the vertical plane E-E' of FIG. 15B. Referring to FIGS. 15A-15E, a first etch mask layer 117 such as a patterned photoresist layer may be formed in the second device region 200 to cover the area of the second device region 200 without covering the first device region 100. End portions of each silicon-germanium plate 20 may be removed selective to the silicon plates 10 by performing an isotropic etch process that etches the material of the silicon-germanium plates 20 selective to the material of the silicon plates 10. The isotropic etch process may laterally recess the silicon-germanium plates 20 selective to the silicon plates 10. The isotropic etch process may include a wet etch process using a mixture of ammonium hydroxide and hydrogen peroxide. First inner recess cavities 21 are formed in volumes from which the materials of the end portions of the silicon-germanium plates 20 are removed. The recessed sidewalls of the silicon-germanium plates 20 may be at, or about, a vertical plane including an overlying interface between a gate template structure (30, 32, 34, 36) and a dielectric gate spacer 38. The first etch mask layer 117 may be subsequently removed, for example, by ashing.

Figure 16C:
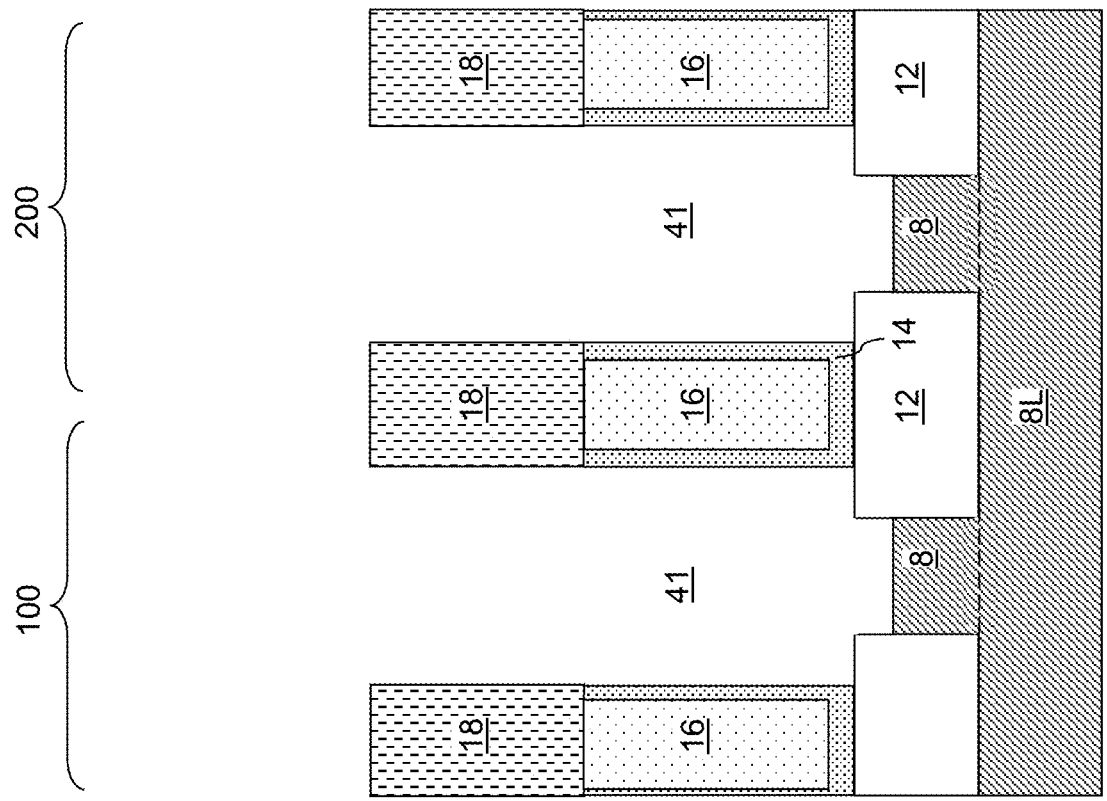
FIG. 16C is a vertical cross-sectional view along the vertical plane C-C' of FIG. 16B.
Figure 16D:
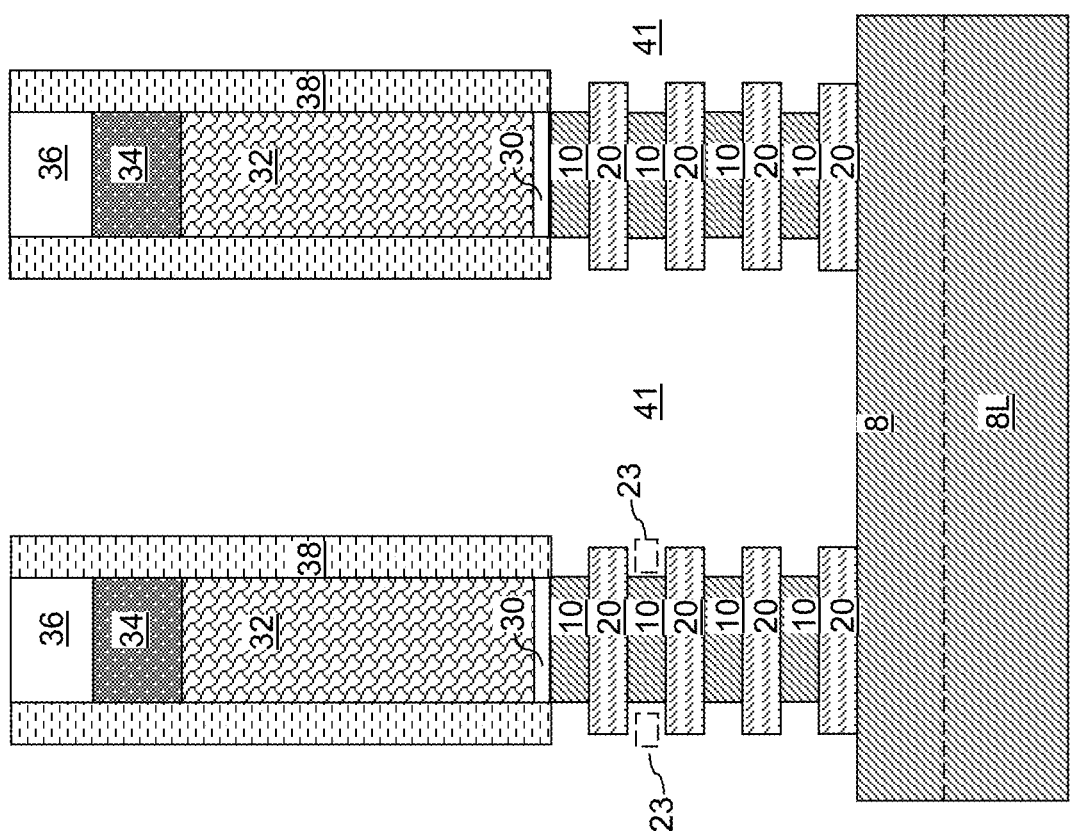
FIG. 16D is a vertical cross-sectional view along the vertical plane D-D' of FIG. 16B.
Figure 16E:
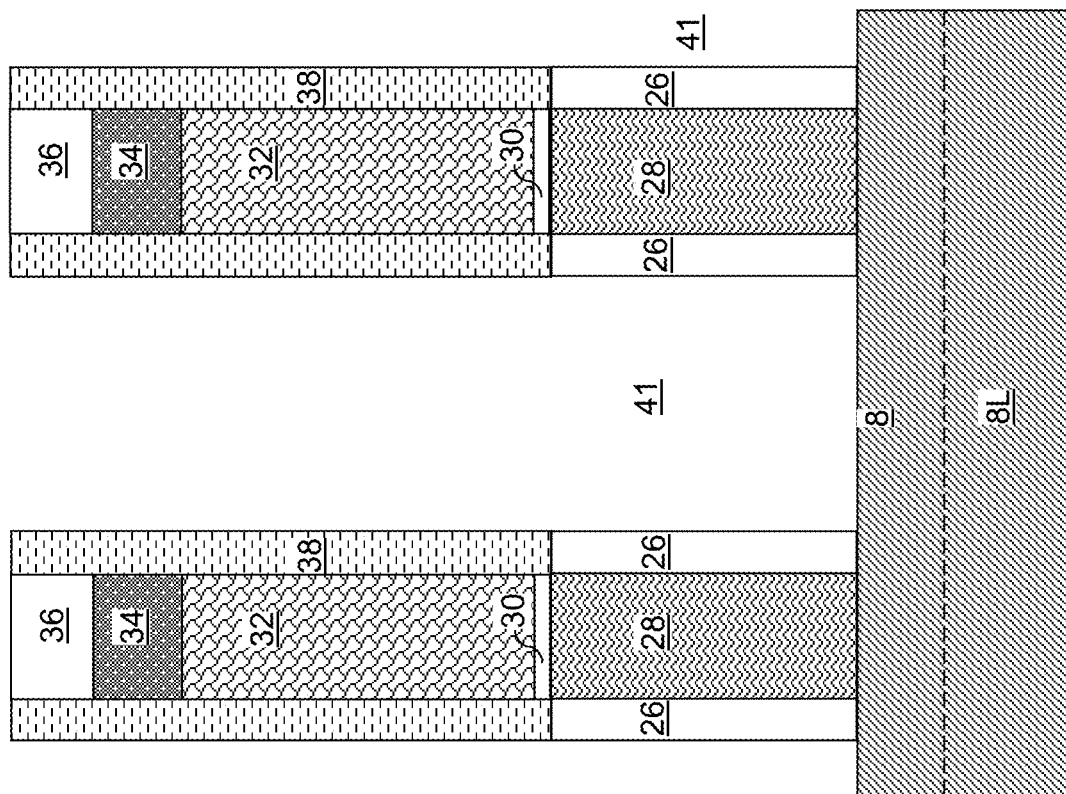
FIG. 16E is a vertical cross-sectional view along the vertical plane E-E' of FIG. 16B.

FIG. 16A is a vertical cross-sectional view of the exemplary structure after masking a first transistor region and selective removal of end portions of silicon plates according to an embodiment of the present disclosure. FIG. 16B is a top-down view of the exemplary structure of FIG. 16A. The vertical plane A-A' is the plane of the vertical cross-sectional view of FIG. 16A. FIG. 16C is a vertical cross-sectional view along the vertical plane C-C' of FIG. 16B. FIG. 16D is a vertical cross-sectional view along the vertical plane D-D' of FIG. 16B. FIG. 16E is a vertical cross-sectional view along the vertical plane E-E' of FIG. 16B. Referring to FIGS. 16A-16E, a second etch mask layer 127 such as a patterned photoresist layer may be formed in the first device region 100 to cover the area of the first device region 100 without covering the second device region 200. End portions of each silicon plate 10 may be removed selective to the silicon-germanium plates 20 by performing an isotropic etch process that etches the material of the silicon plates 10 selective to the material of the silicon-germanium plates 20. The isotropic etch process may laterally recess the silicon plates 10 selective to the silicon-germanium plates 20. The isotropic etch process may include a wet etch process using a mixture of nitric acid and ammonium fluoride and/or tetramethylammonium hydroxide (TMAH), and/or trimethyl-2 hydroxyethyl ammonium hydroxide (TMY). Second inner recess cavities 23 are formed in volumes from which the materials of the end portions of the silicon plates 10 are removed. The recessed sidewalls of the silicon plates 20 may be at, or about, a vertical plane including an overlying interface between a gate template structure (30, 32, 34, 36) and a dielectric gate spacer 38. The second etch mask layer 127 may be subsequently removed, for example, by ashing.

Figures 17A, 17B:
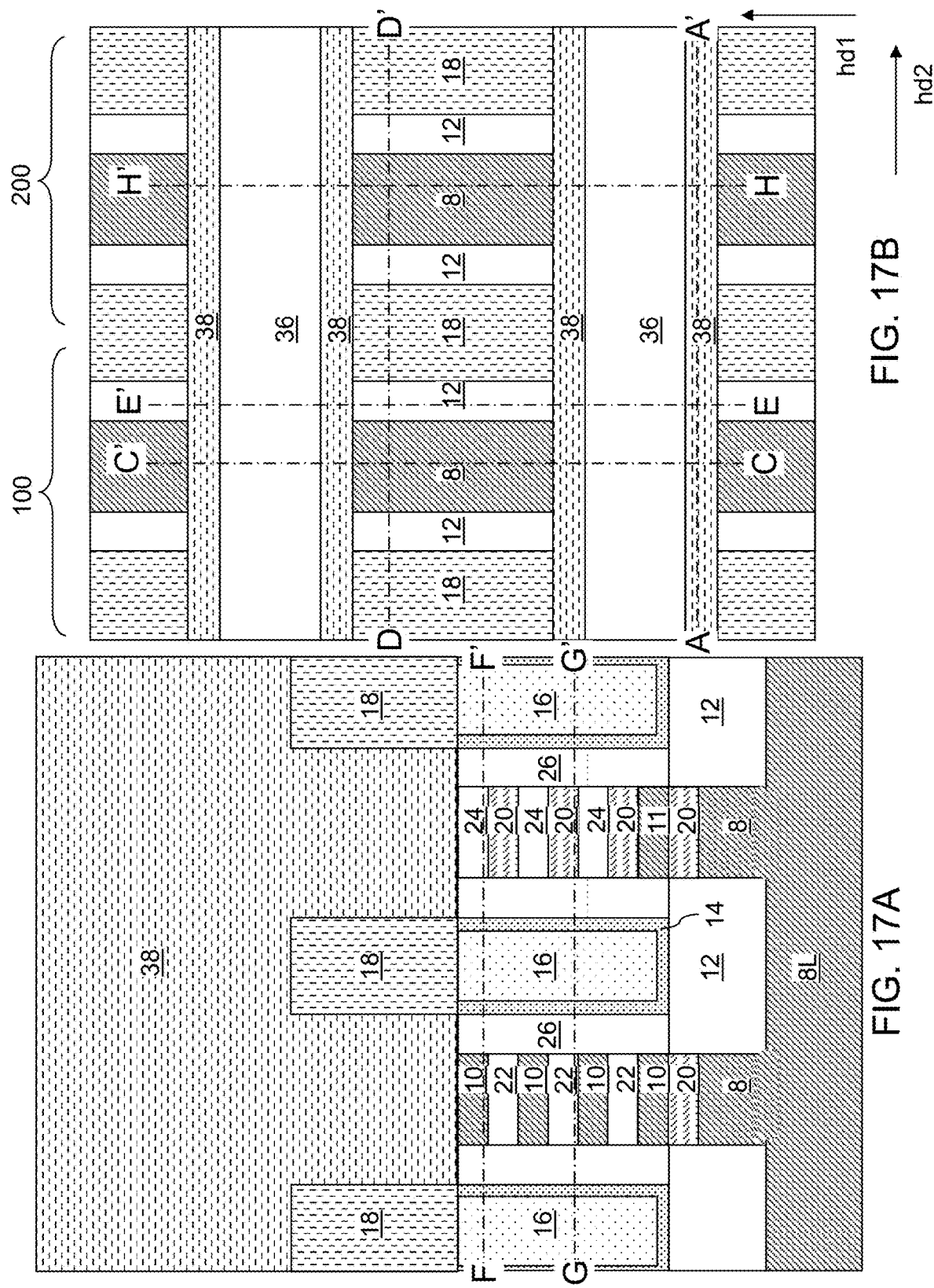
FIG. 17A is a vertical cross-sectional view of the exemplary structure after formation of inner dielectric channel spacers according to an embodiment of the present disclosure.
FIG. 17B is a top-down view of the exemplary structure of FIG. 17A. The vertical plane A-A' is the plane of the vertical cross-sectional view of FIG. 17A.
Figure 17F:
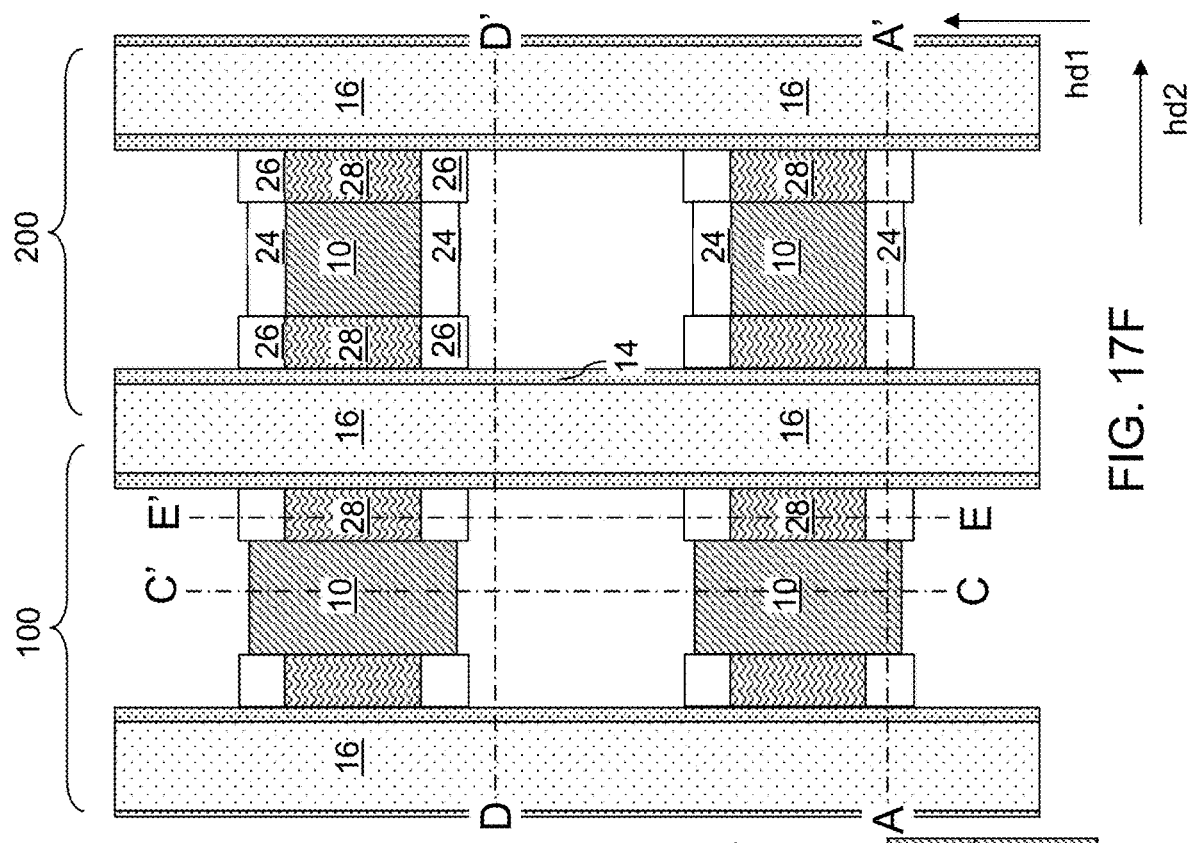
FIG. 17F is a horizontal cross-sectional view along the horizontal plane F-F' of FIG. 17A.
Figure 17E:
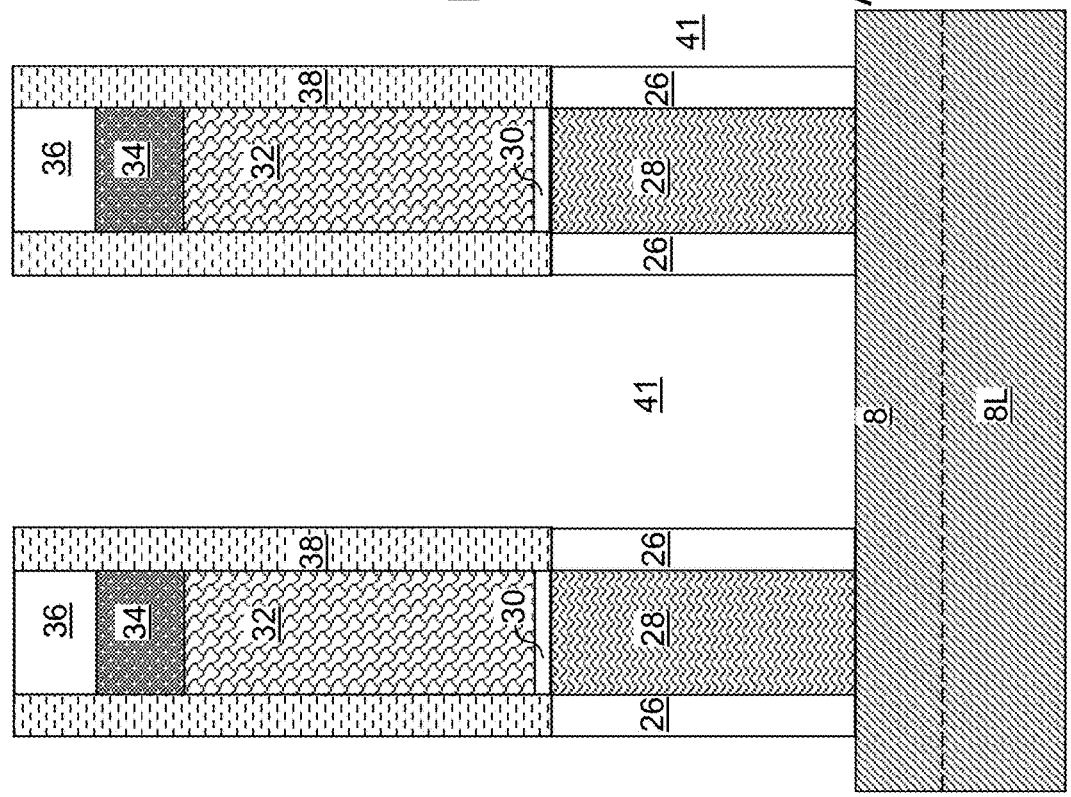
FIG. 17E is a vertical cross-sectional view along the vertical plane E-E' of FIG. 17B.

FIG. 17A is a vertical cross-sectional view of the exemplary structure after formation of inner dielectric channel spacers according to an embodiment of the present disclosure. FIG. 17B is a top-down view of the exemplary structure of FIG. 17A. The vertical plane A-A' is the plane of the vertical cross-sectional view of FIG. 17A. FIG. 17C is a vertical cross-sectional view along the vertical plane C-C' of FIG. 17B. FIG. 17D is a vertical cross-sectional view along the vertical plane D-D' of FIG. 17B. FIG. 17E is a vertical cross-sectional view along the vertical plane E-E' of FIG. 17B. FIG. 17F is a horizontal cross-sectional view along the horizontal plane F-F' of FIG. 17A. FIG. 17G is a horizontal cross-sectional view along the horizontal plane G-G' of FIG. 17A. FIG. 17H is a vertical cross-sectional view along the vertical plane H-H—of FIG. 17A. Referring to FIGS. 17A-17H, a dielectric fill material such as silicon oxide may be conformally deposited to fill the inner recess cavities (21, 23). Portions of the dielectric fill material deposited outside the inner recess cavities (21, 23) may be removed by an anisotropic etch process. Each remaining vertical portion of the dielectric fill material that fills the first inner recess cavities 21 comprises a first inner dielectric channel spacer 22. Each remaining vertical portion of the dielectric fill material that fills the second inner recess cavities 23 comprises a second inner dielectric channel spacer 24. Each first inner dielectric channel spacer 22 contacts a bottom surface of an end portion of an overlying silicon plate 10 and/or a top surface of an end portion of an underlying silicon plate 10. Each second inner dielectric channel spacer 24 contacts a bottom surface of an end portion of an overlying silicon-germanium plate 20 and/or a top surface of an end portion of an underlying silicon-germanium plate 20. Each inner dielectric channel spacer (22, 24) may contact a pair of outer dielectric channel spacers 26. A plurality of inner dielectric channel spacers (22, 24) may be located between a pair of outer dielectric channel spacers 26. Each combination of a pair of outer dielectric channel spacers 26 and first inner dielectric channel spacers 22 in a first device region 100 is herein referred to as a first dielectric channel spacer (22, 26) or as a first composite dielectric channel spacer (22, 26). Each combination of a pair of outer dielectric channel spacers 26 and second inner dielectric channel spacers 24 in a second device region 200 is herein referred to as a second dielectric channel spacer (24, 26) or as a second composite dielectric channel spacer (24, 26).

Figure 18F:
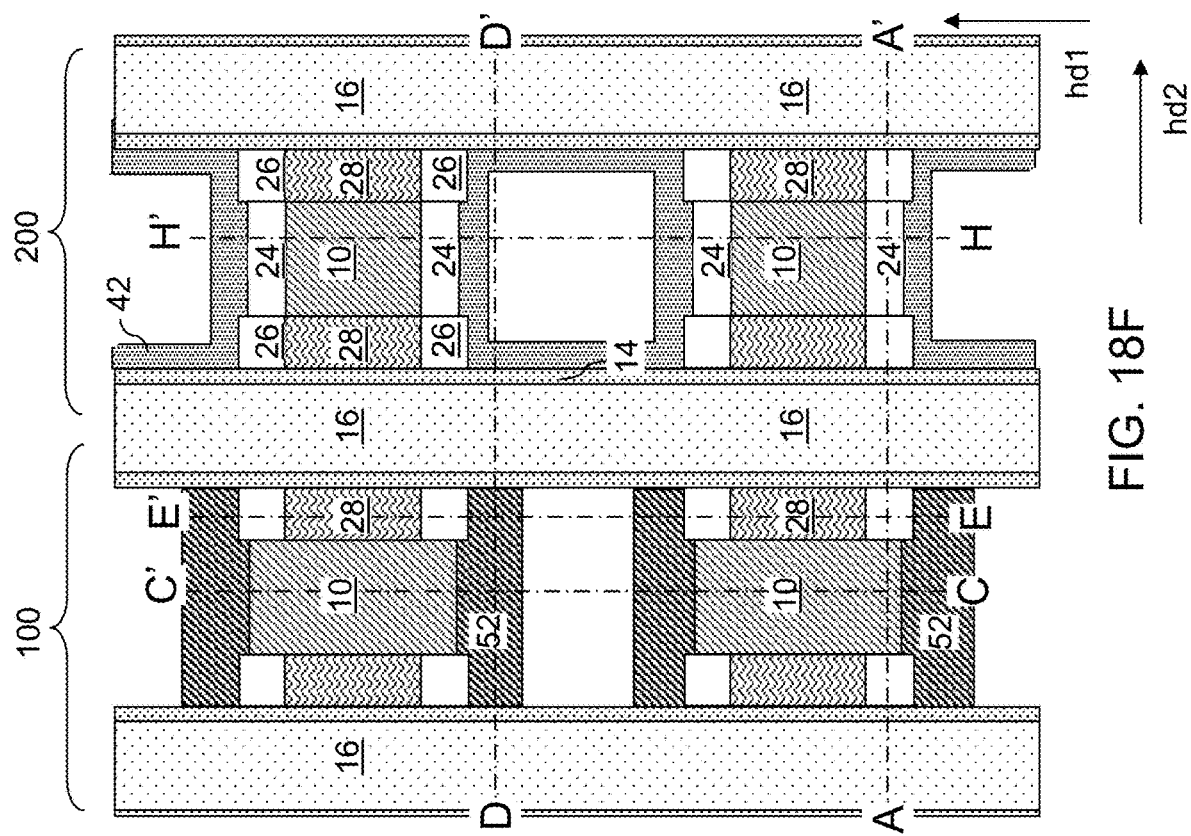
FIG. 18F is a horizontal cross-sectional view along the horizontal plane F-F' of FIG. 18A.
Figure 18E:
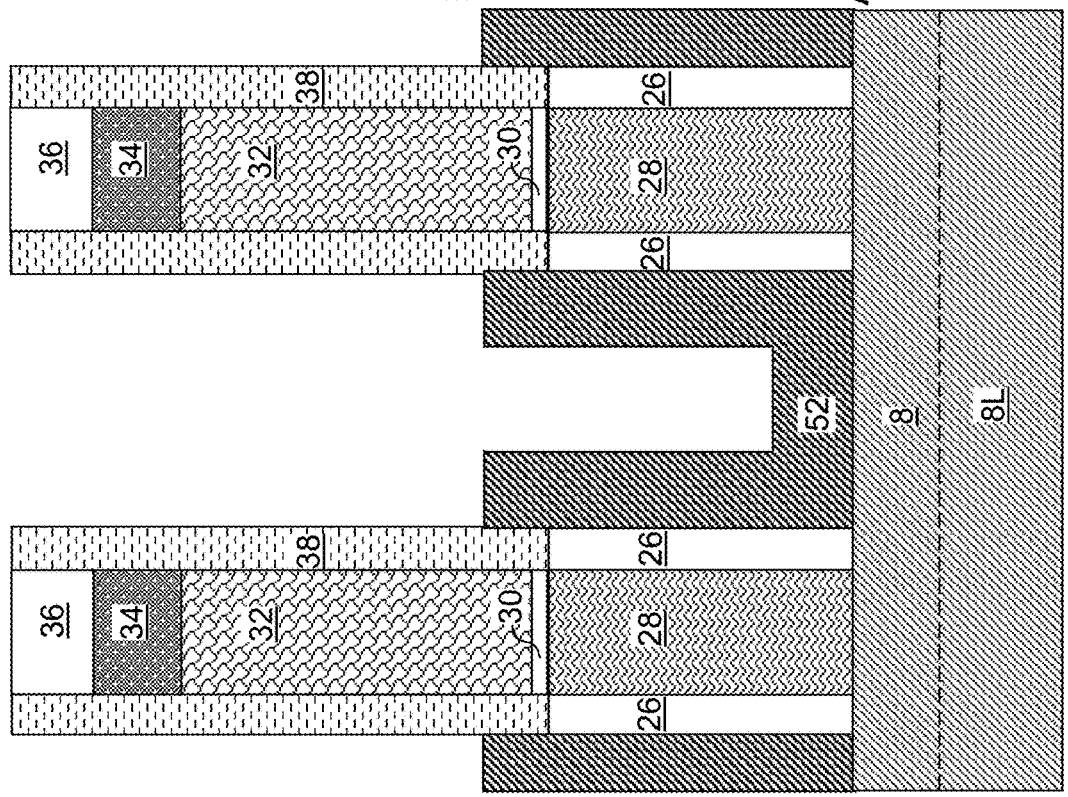
FIG. 18E is a vertical cross-sectional view along the vertical plane E-E' of FIG. 18B.
Figures 18G, 18H:
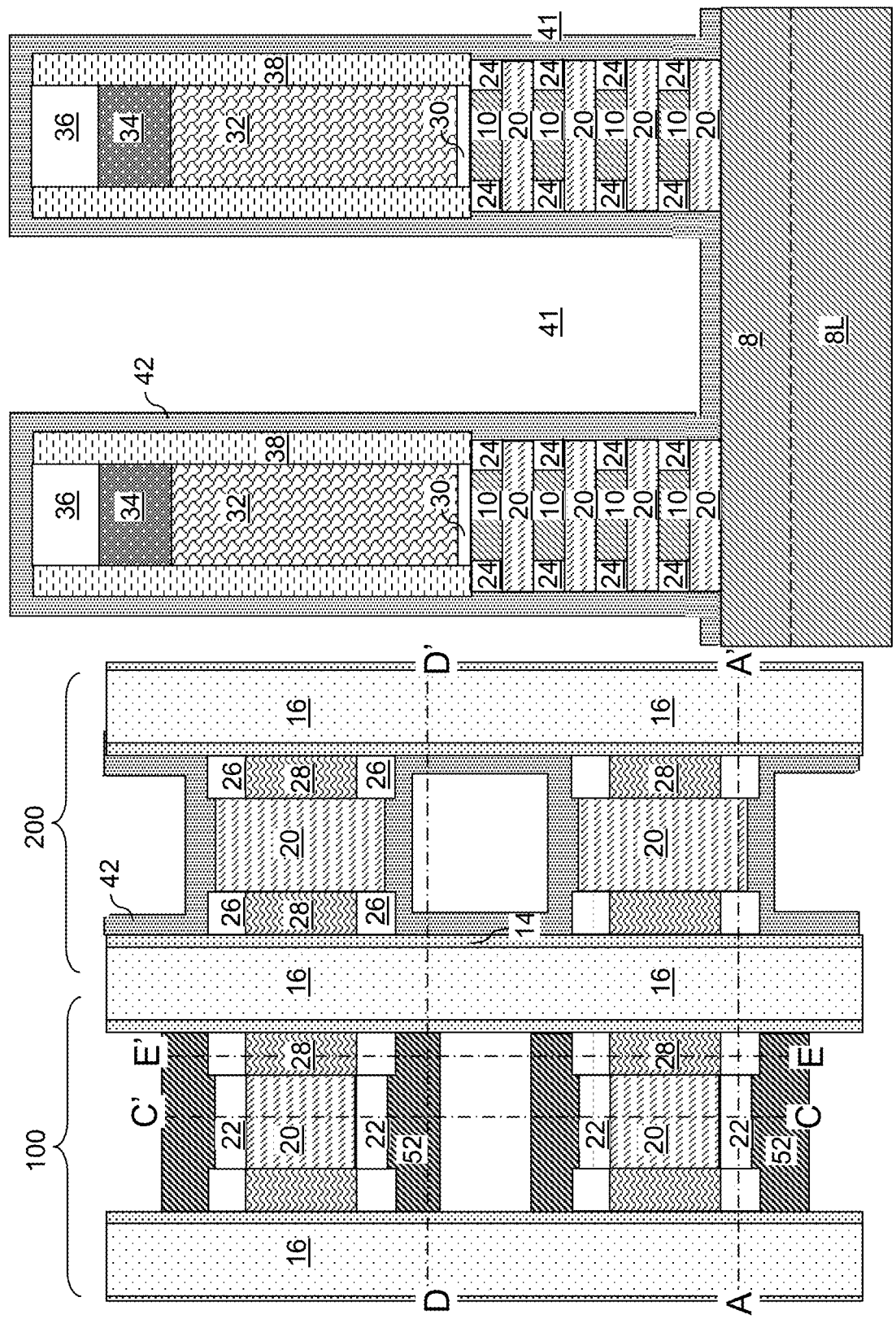
FIG. 18G is a horizontal cross-sectional view along the horizontal plane G-G' of FIG. 18A.
FIG. 18H is a vertical cross-sectional view along the vertical plane H-H—of FIG. 18A.

FIG. 18A is a vertical cross-sectional view of the exemplary structure after formation of a first dielectric mask layer and formation of first source/drain regions according to an embodiment of the present disclosure. FIG. 18B is a top-down view of the exemplary structure of FIG. 18A. The vertical plane A-A' is the plane of the vertical cross-sectional view of FIG. 16A. FIG. 18C is a vertical cross-sectional view along the vertical plane C-C' of FIG. 18B. FIG. 18D is a vertical cross-sectional view along the vertical plane D-D' of FIG. 18B. FIG. 18E is a vertical cross-sectional view along the vertical plane E-E' of FIG. 18B. FIG. 18F is a horizontal cross-sectional view along the horizontal plane F-F' of FIG. 18A. FIG. 18G is a horizontal cross-sectional view along the horizontal plane G-G' of FIG. 18A. FIG. 18H is a vertical cross-sectional view along the vertical plane H-H—of FIG. 18A. Referring to FIGS. 18A-18H, a first hard mask layer 42 may be deposited over the exemplary structure, and may be patterned to cover the second device region 200 while not covering the first device region 100. The first hard mask layer 42 includes a dielectric hard mask material such as silicon oxide or silicon nitride. The first hard mask layer 42 cam be deposited by a conformal deposition process such as a chemical vapor deposition process. The thickness of the first hard mask layer 42 may be in a range from 5 nm to 10 nm, although lesser and greater thicknesses may also be used.

A first selective epitaxy process may be performed to epitaxially grow first source/drain regions 52 from physically exposed semiconductor surfaces of the silicon plates 10, the silicon-germanium plates 20, and the single crystalline semiconductor fins 8. A source/drain region may be a source region or a drain region. It is understood that one of the source/drain regions that contacts a stack of silicon plates 10 is a source region, and another of the source/drain regions that contacts the stack of silicon plates 10 is a drain region. For example, the exemplary structure may be placed in an epitaxial deposition process chamber, and a silicon-containing precursor gas (such as silane, disilane, dichlorosilane, or trichlorosilane) may be flowed concurrent with an etchant gas (such as hydrogen chloride gas) to grow a silicon-containing semiconductor material from the physically exposed semiconductor surfaces. The silicon-containing semiconductor material may be doped silicon. In one embodiment, dopants of a second conductivity type may be concurrently flowed into the epitaxial deposition process chamber to provide in-situ doping of the first source/drain regions 52. The silicon plates 10 may have a doping of the first conductivity type (such as p-type), and the first source/drain regions 52 may have a doping of the second conductivity type (such as n-type) that is the opposite of the first conductivity type. The atomic concentration of dopants of the second conductivity type in the first source/drain regions 52 may be in a range from $5.0\times10^{19}/cm^3$ to $2.0\times10^{21}/cm^3$, although lesser and greater atomic concentrations may also be used. The thickness of the first source/drain regions 52 may be in a range from 10 nm to 50 nm, although lesser and greater thicknesses may also be used. The first hard mask layer 42 may be subsequently removed, for example, by an isotropic etch process such as a wet etch process.

Generally, a first source region (which is one of the first source/drain regions 52) and a first drain region (which is another of the first source/drain regions 52) may be formed on physically exposed surfaces of each vertical stack of first silicon plates 10. Generally, the first source regions and the first drain regions may be deposited by performing a first selective epitaxy process that grows first single crystalline semiconductor material portions (which are the first source/drain regions 52) from the physically exposed surfaces of the first silicon plates 10.

Figure 19D:
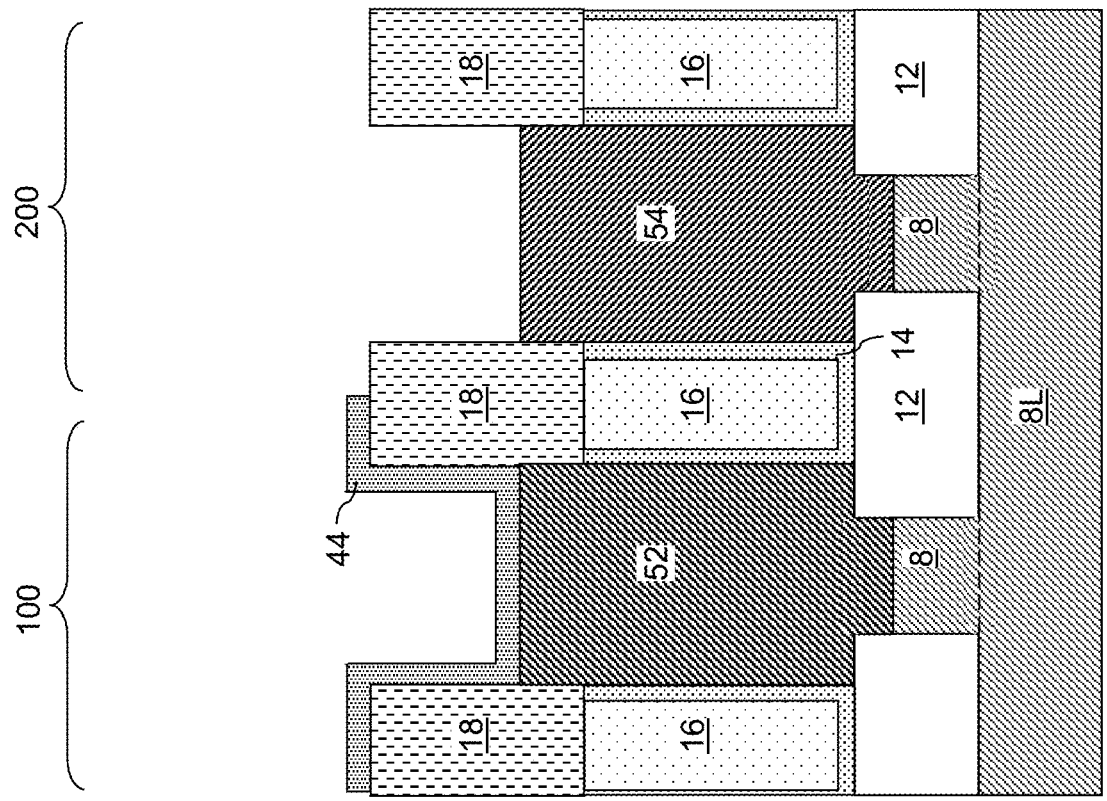
FIG. 19D is a vertical cross-sectional view along the vertical plane D-D' of FIG. 19B.
Figure 19C:
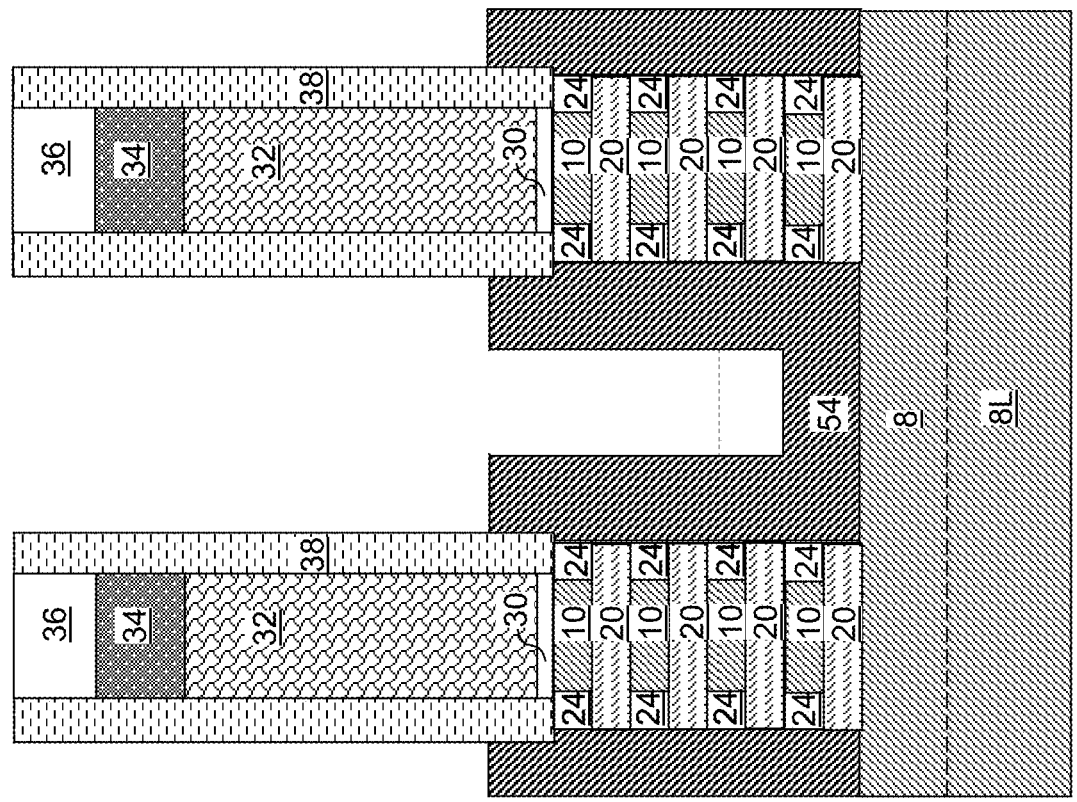
FIG. 19C is a vertical cross-sectional view along the vertical plane C-C' of FIG. 19B.
Figure 19F:
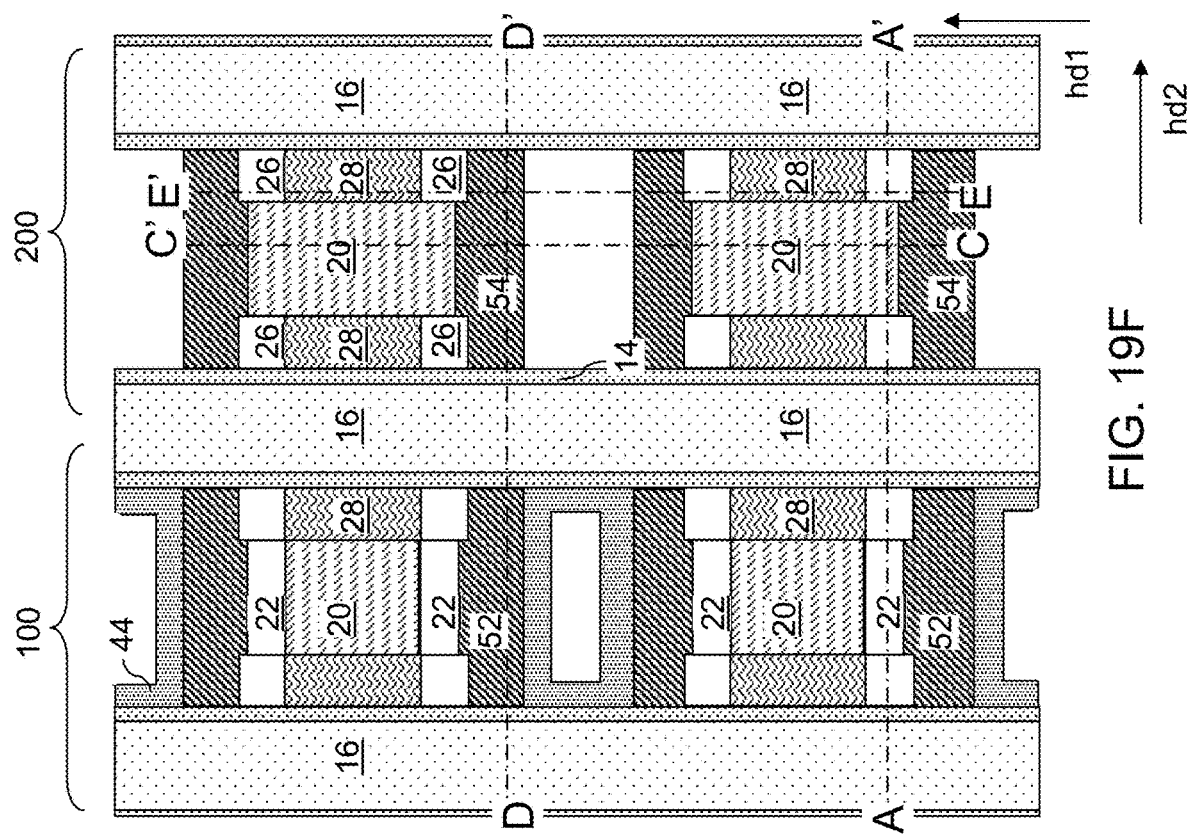
FIG. 19F is a horizontal cross-sectional view along the horizontal plane F-F' of FIG. 19A.
Figure 19E:
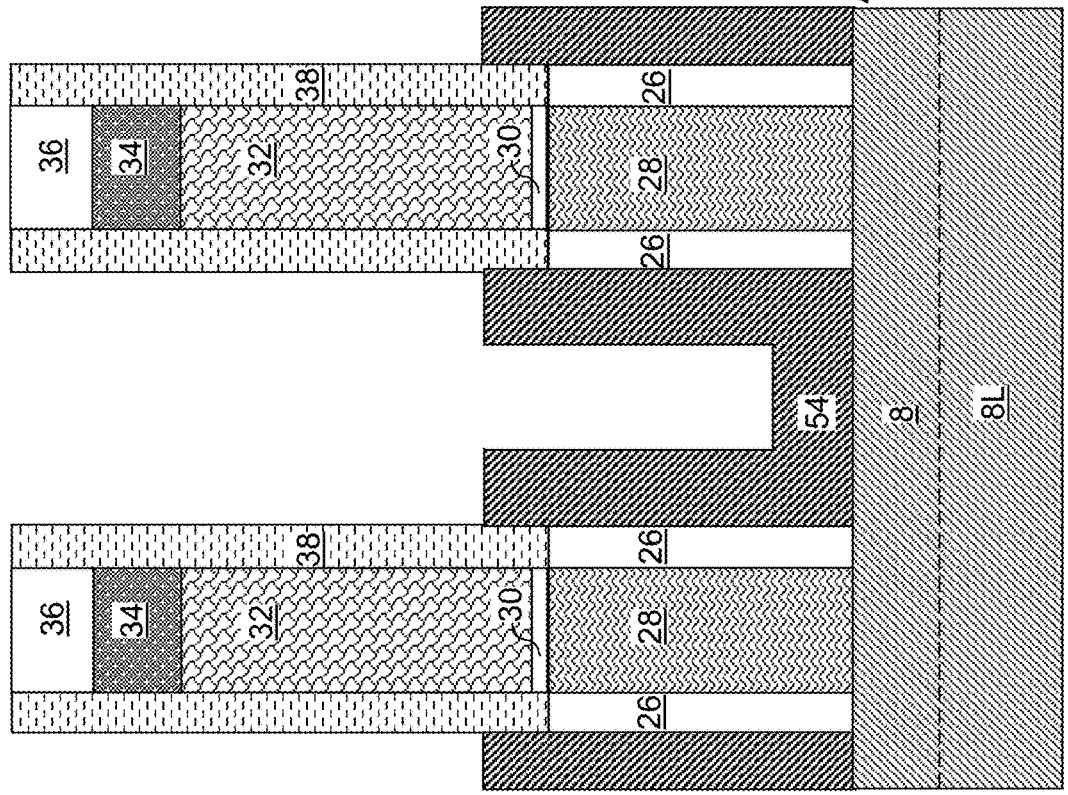
FIG. 19E is a vertical cross-sectional view along the vertical plane E-E' of FIG. 19B.

FIG. 19A is a vertical cross-sectional view of the exemplary structure after formation of a second dielectric mask layer and formation of second source/drain regions according to an embodiment of the present disclosure. FIG. 19B is a top-down view of the exemplary structure of FIG. 19A. The vertical plane A-A' is the plane of the vertical cross-sectional view of FIG. 16A. FIG. 19C is a vertical cross-sectional view along the vertical plane C-C' of FIG. 19B. FIG. 19D is a vertical cross-sectional view along the vertical plane D-D' of FIG. 19B. FIG. 19E is a vertical cross-sectional view along the vertical plane E-E' of FIG. 19B. FIG. 19F is a horizontal cross-sectional view along the horizontal plane F-F' of FIG. 19A. Referring to FIGS. 19A-19F, a second hard mask layer 44 may be deposited over the exemplary structure, and may be patterned to cover the first device region 100 while not covering the second device region 200. The second hard mask layer 44 includes a dielectric hard mask material such as silicon oxide or silicon nitride. The second hard mask layer 44 cam be deposited by a conformal deposition process such as a chemical vapor deposition process. The thickness of the second hard mask layer 44 may be in a range from 5 nm to 10 nm, although lesser and greater thicknesses may also be used.

A second selective epitaxy process may be performed to epitaxially grow second source/drain regions 54 from physically exposed semiconductor surfaces of the silicon plates 10, the silicon-germanium plates 20, and the single crystalline semiconductor fins 8. For example, the exemplary structure may be placed in an epitaxial deposition process chamber, a silicon-containing precursor gas (such as silane, disilane, dichlorosilane, or trichlorosilane), and a germanium-containing precursor gas (such as digermane) may be flowed concurrent with an etchant gas (such as hydrogen chloride gas) to grow a silicon-germanium alloy material from the physically exposed semiconductor surfaces. In one embodiment, dopants of the first conductivity type may be concurrently flowed into the epitaxial deposition process chamber to provide in-situ doping of the second source/drain regions 54. The second source/drain regions 54 may include a silicon-germanium alloy having a doping of the first conductivity type. The silicon-germanium plates 20 may have a doping of the second conductivity type (such as n-type), and the second source/drain regions 54 may have a doping of the first conductivity type (such as p-type) that is the opposite of the second conductivity type. The atomic concentration of dopants of the first conductivity type in the second source/drain regions 54 may be in a range from $5.0\times10^{19}/cm^3$ to $2.0\times10^{21}/cm^3$, although lesser and greater atomic concentrations may also be used. The thickness of the second source/drain regions 54 may be in a range from 10 nm to 50 nm, although lesser and greater thicknesses may also be used. The second hard mask layer 44 may be subsequently removed, for example, by an isotropic etch process such as a wet etch process.

Generally, a second source region (which is one of the second source/drain regions 54) and a second drain region (which is another of the source/drain regions 54) may be formed on physically exposed surfaces of each vertical stack of the second silicon-germanium plates 20. The second source regions and the second drain regions may be deposited by performing a second selective epitaxy process that grows second single crystalline semiconductor material portions (which are the second source/drain regions 54) from the physically exposed surfaces of the second silicon-germanium plates 20. The second source/drain regions 54 may include a silicon-germanium alloy having a doping of the first conductivity type. The atomic concentration of germanium atoms in the second source/drain regions 54 may be in a range from 10% to 40%, such as from 20% to 30%, although lesser and greater atomic concentrations may also be used.

Figure 20B:
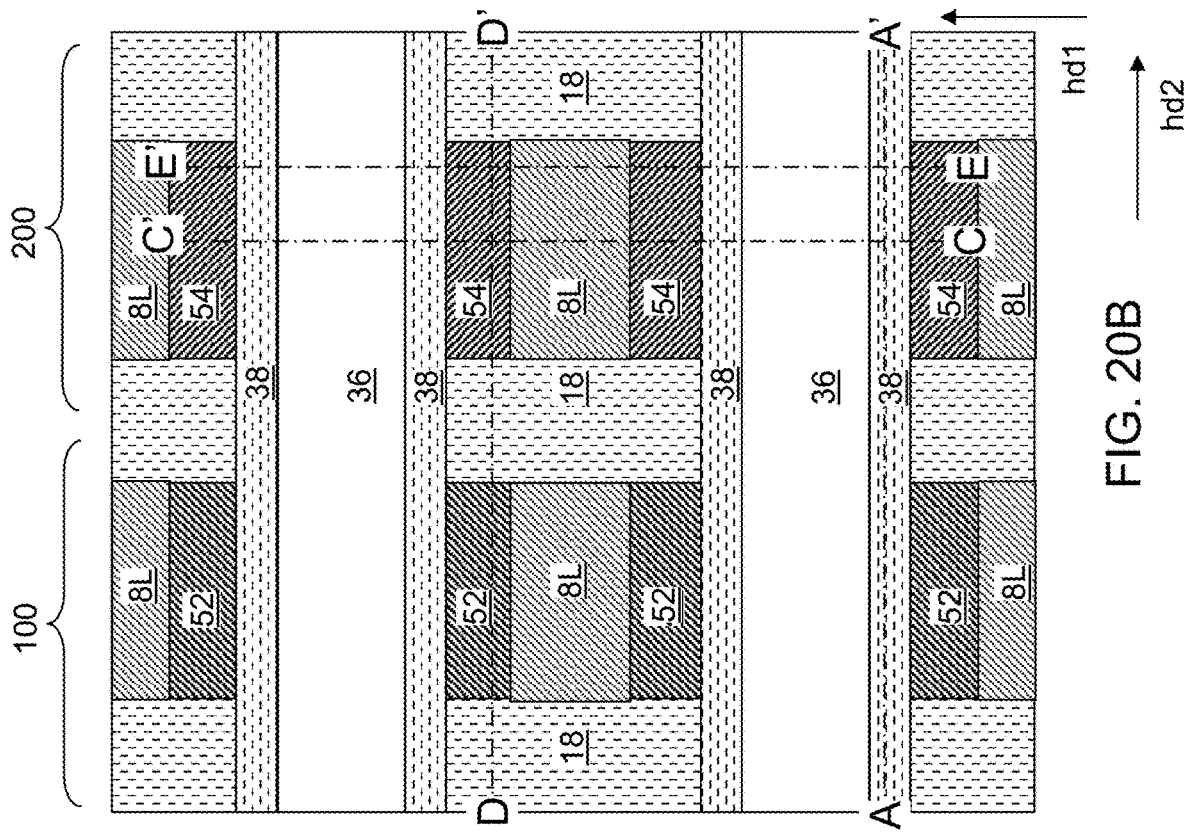
FIG. 20B is a top-down view of the exemplary structure of FIG. 20A. The vertical plane A-A' is the plane of the vertical cross-sectional view of FIG. 20A.
Figure 20A:
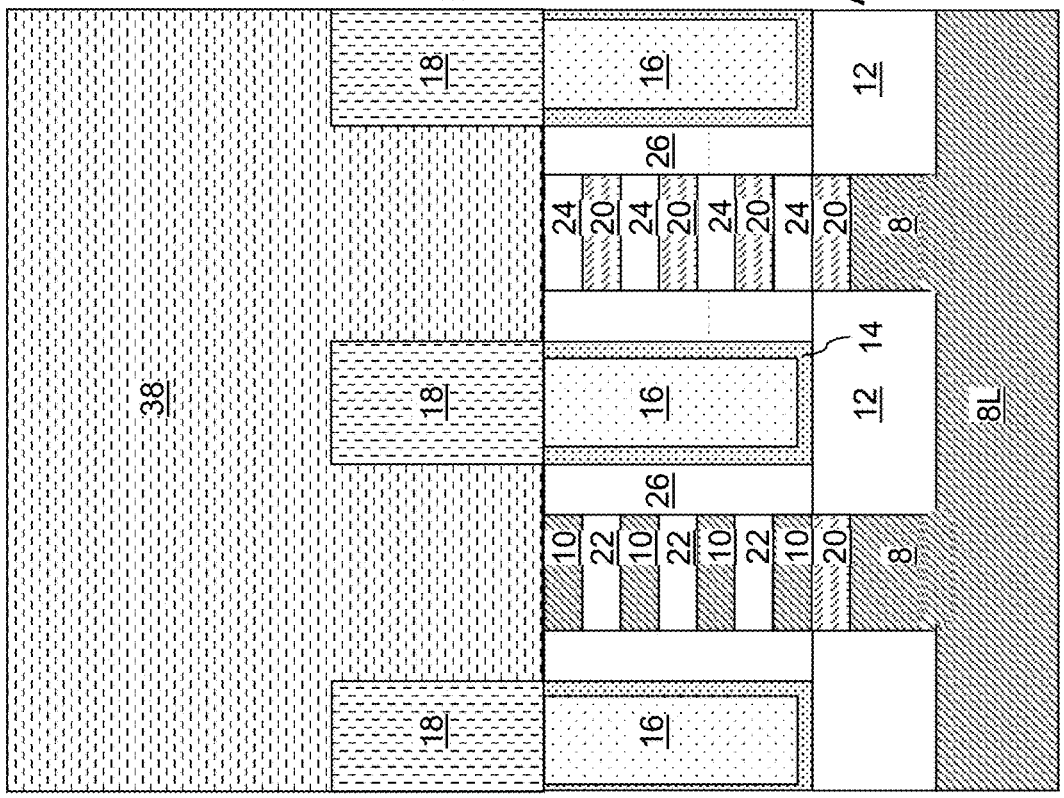
FIG. 20A is a vertical cross-sectional view of the exemplary structure after an optional step of patterning the source/drain regions according to an embodiment of the present disclosure.
Figure 20E:
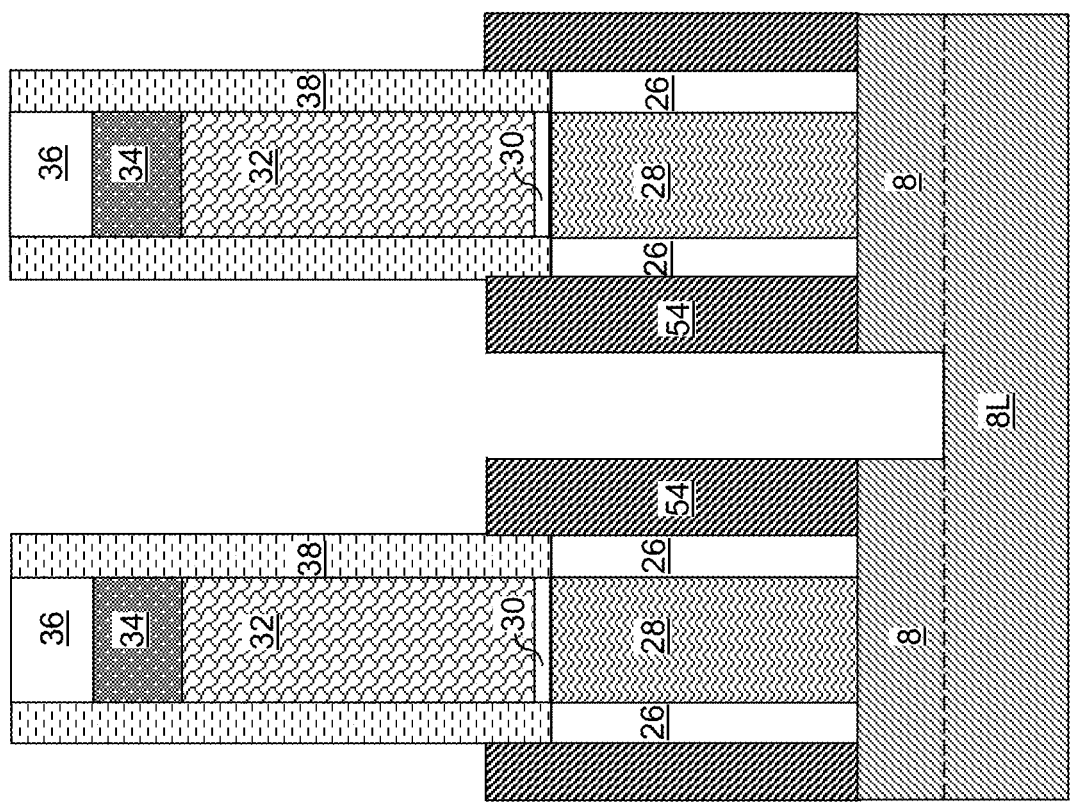
FIG. 20E is a vertical cross-sectional view along the vertical plane E-E' of FIG. 20B.

FIG. 20A is a vertical cross-sectional view of the exemplary structure after an optional step of patterning the source/drain regions according to an embodiment of the present disclosure. FIG. 20B is a top-down view of the exemplary structure of FIG. 20A. The vertical plane A-A' is the plane of the vertical cross-sectional view of FIG. 20A. FIG. 20C is a vertical cross-sectional view along the vertical plane C-C' of FIG. 20B. FIG. 20D is a vertical cross-sectional view along the vertical plane D-D' of FIG. 20B. FIG. 20E is a vertical cross-sectional view along the vertical plane E-E' of FIG. 20B. Referring to FIGS. 20A-20E, a photoresist layer (not shown) may be optionally applied over the exemplary structure, and may be patterned to form openings in areas from which portions of the first source/drain regions 52 and the second source/drain regions 54 are to be removed. An anisotropic etch process may be performed to trim horizontal portions of the first source/drain regions 52 and the second source/drain regions 54 between neighboring field effect transistor as needed. Optionally, the single crystalline semiconductor fins 8 may be patterned to electrically isolate neighboring field effect transistors. The photoresist layer may be subsequently removed, for example, by ashing.

FIG. 21A is a vertical cross-sectional view of the exemplary structure after formation of inter-device isolation structures according to an embodiment of the present disclosure. FIG. 21B is a top-down view of the exemplary structure of FIG. 21A. The vertical plane A-A' is the plane of the vertical cross-sectional view of FIG. 21A. FIG. 21C is a vertical cross-sectional view along the vertical plane C-C' of FIG. 21B. FIG. 21D is a vertical cross-sectional view along the vertical plane D-D' of FIG. 21B. FIG. 21E is a vertical cross-sectional view along the vertical plane E-E' of FIG. 21B.

Figure 21F:
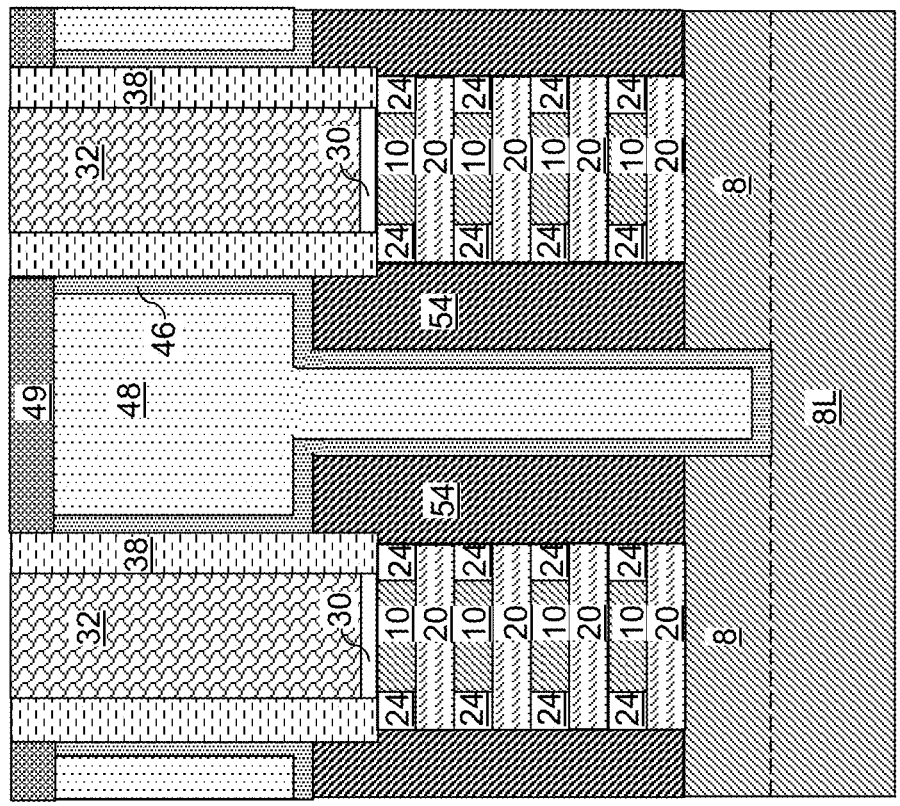
FIG. 21F is a vertical cross-sectional view along the vertical plane F-F' of FIG. 21B.
Figure 21E:
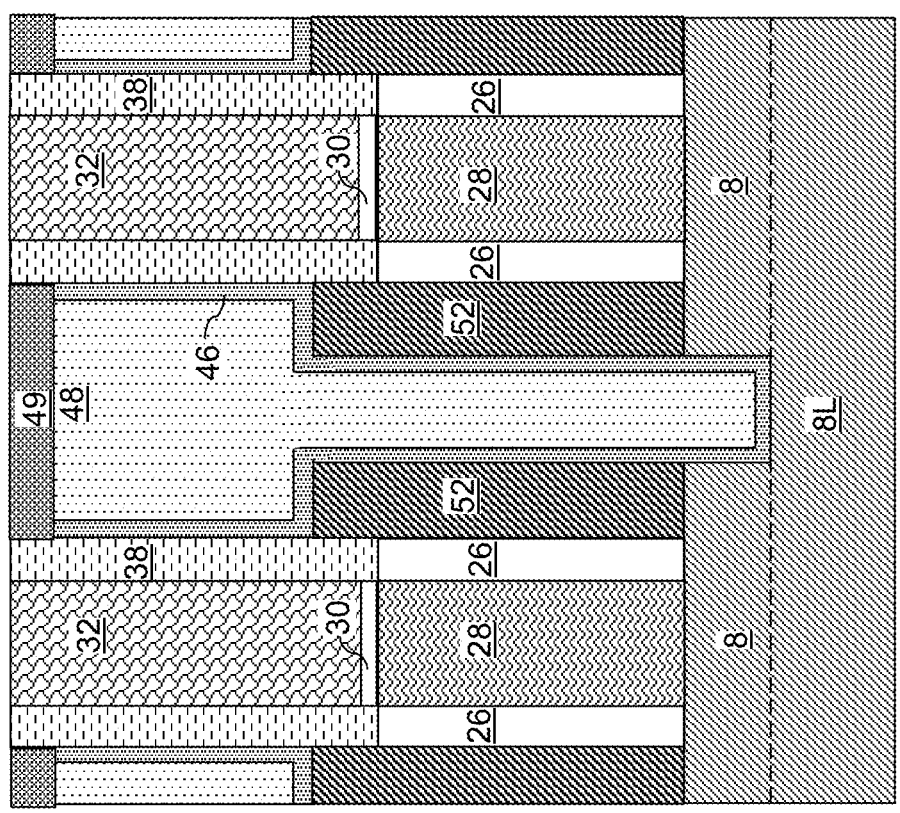
FIG. 21E is a vertical cross-sectional view along the vertical plane E-E' of FIG. 21B.

FIG. 21F is a vertical cross-sectional view along the vertical plane F-F' of FIG. 21B. Referring to FIGS. 21A-21F, inter-device isolation structures (46, 48, 49) may be formed between neighboring pairs of semiconductor plate stacks (10, 20). For example, a continuous isolation dielectric liner including an etch stop dielectric material may be deposited. The continuous isolation dielectric liner may include a dielectric material such as aluminum oxide, hafnium oxide, or silicon carbide nitride. The thickness of the continuous isolation dielectric liner may be in a range from 10 nm to 50 nm, although lesser and greater thicknesses may also be used.

A dielectric fill material such as undoped silicate glass or a doped silicate glass may be deposited over the isolation dielectric liner to fill cavities between neighboring pairs of gate template structures (30, 32, 34, 36). A chemical mechanical planarization process may be performed to remove the gate mask structures 36, the sacrificial gate caps 34, and portions of the dielectric fill material, the continuous isolation dielectric liner, and the dielectric gate spacers 38 that are located above the horizontal plane including the top surface of the sacrificial gate structures 32. Each remaining portion of the continuous isolation dielectric liner comprises an isolation dielectric liner 46. Each remaining portion of the dielectric fill material comprises an isolation dielectric fill material portion 48.

Top portions of the isolation dielectric liners 46 and the isolation dielectric fill material portions 48 may be vertically recessed. At least one isotropic etch process may be used to vertically recess the isolation dielectric liners 46 and the isolation dielectric fill material portions 48. An etch stop dielectric material such as silicon nitride may be deposited in the recesses overlying the isolation dielectric liners 46 and the isolation dielectric fill material portions 48. Excess portions of the etch stop dielectric material may be removed from above the horizontal plane including the top surfaces of the sacrificial gate structures 32. Each remaining portion of the etch stop dielectric material that fills the recesses comprise isolation etch stop plate 49. The thickness of each isolation etch stop plate 49 may be in a range from 10 nm to 20 nm, although lesser and greater thicknesses may also be used. Each combination of an isolation dielectric liner 46, an isolation dielectric fill material portion 48, and an isolation etch stop plate 49 constitutes an inter-device isolation structures (46, 48, 49).

Figures 22C, 22D:
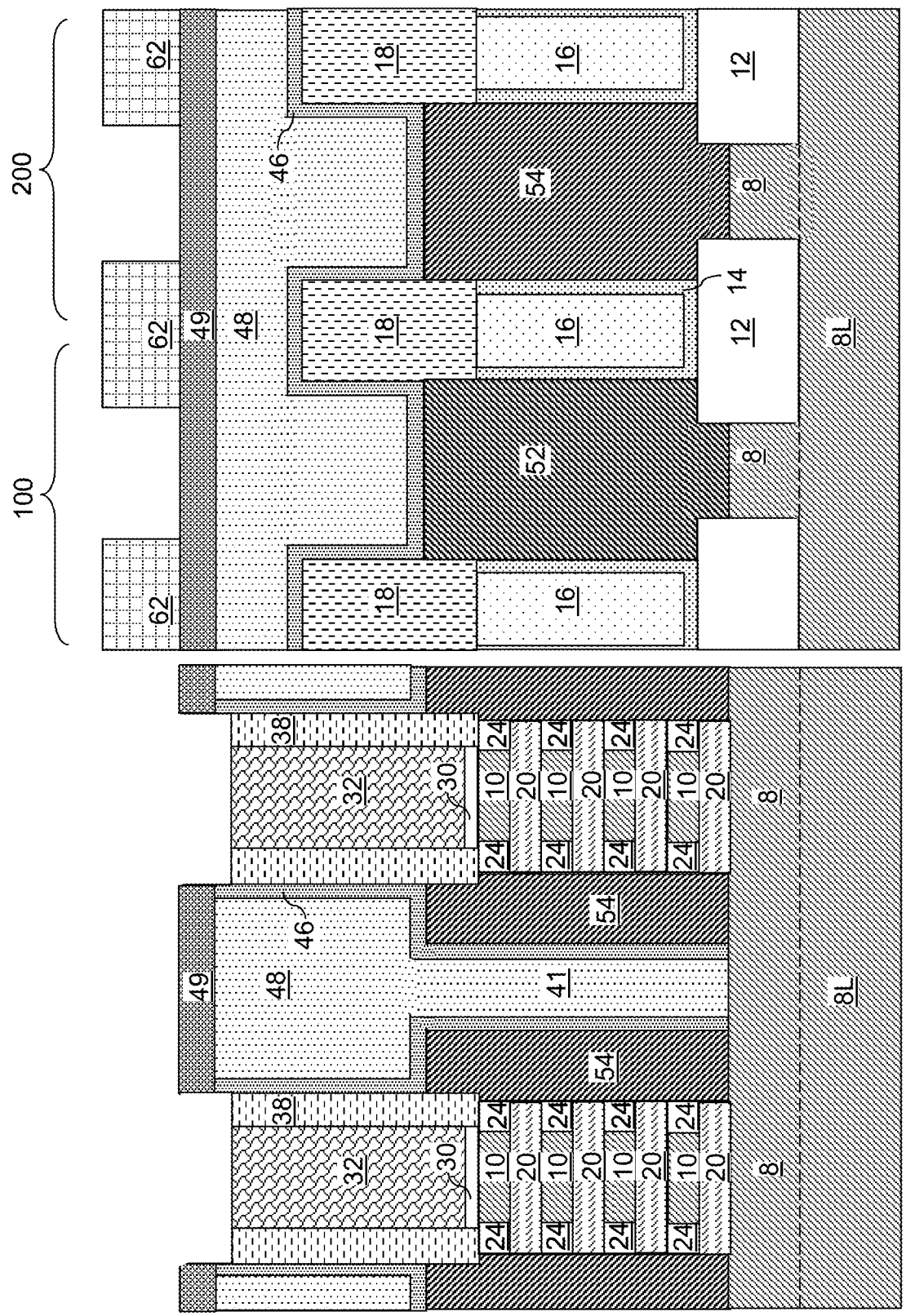
FIG. 22C is a vertical cross-sectional view along the vertical plane C-C' of FIG. 22B.
FIG. 22D is a vertical cross-sectional view along the vertical plane D-D' of FIG. 22B.

FIG. 22A is a vertical cross-sectional view of the exemplary structure after removal of gate mask structures and sacrificial gate caps, formation of etch barrier structures, and recessing of the sacrificial gate structures and the gate template spacers according to an embodiment of the present disclosure. FIG. 22B is a top-down view of the exemplary structure of FIG. 22A. The vertical plane A-A' is the plane of the vertical cross-sectional view of FIG. 22A. FIG. 22C is a vertical cross-sectional view along the vertical plane C-C' of FIG. 22B. FIG. 22D is a vertical cross-sectional view along the vertical plane D-D' of FIG. 22B. FIG. 22E is a vertical cross-sectional view along the vertical plane E-E' of FIG. 22B. FIG. 22F is a vertical cross-sectional view along the vertical plane F-F' of FIG. 22B. Referring to FIGS. 22A-22F, etch barrier structures 62 laterally extending along the first horizontal direction hd1 and overlying the etch stop dielectric fins 18 may be formed. For example, the etch barrier structures 62 may be patterned strips of a photoresist material formed by application and patterning of a photoresist layer.

Figures 23A, 23B:
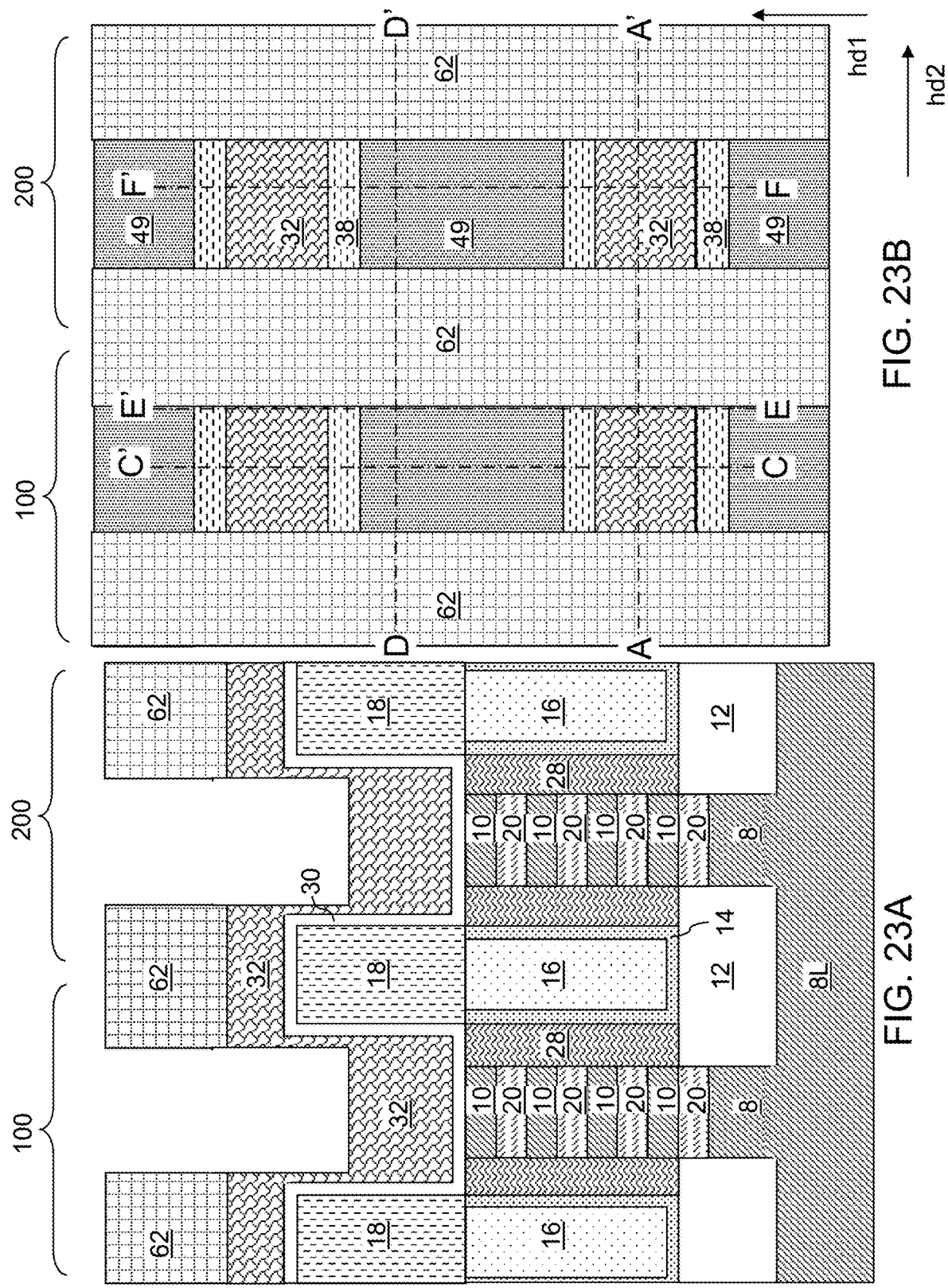
FIG. 23A is a vertical cross-sectional view of the exemplary structure after partially recessing the sacrificial gate structures according to an embodiment of the present disclosure.
FIG. 23B is a top-down view of the exemplary structure of FIG. 23A. The vertical plane A-A' is the plane of the vertical cross-sectional view of FIG. 23A.
Figures 23E, 23F:
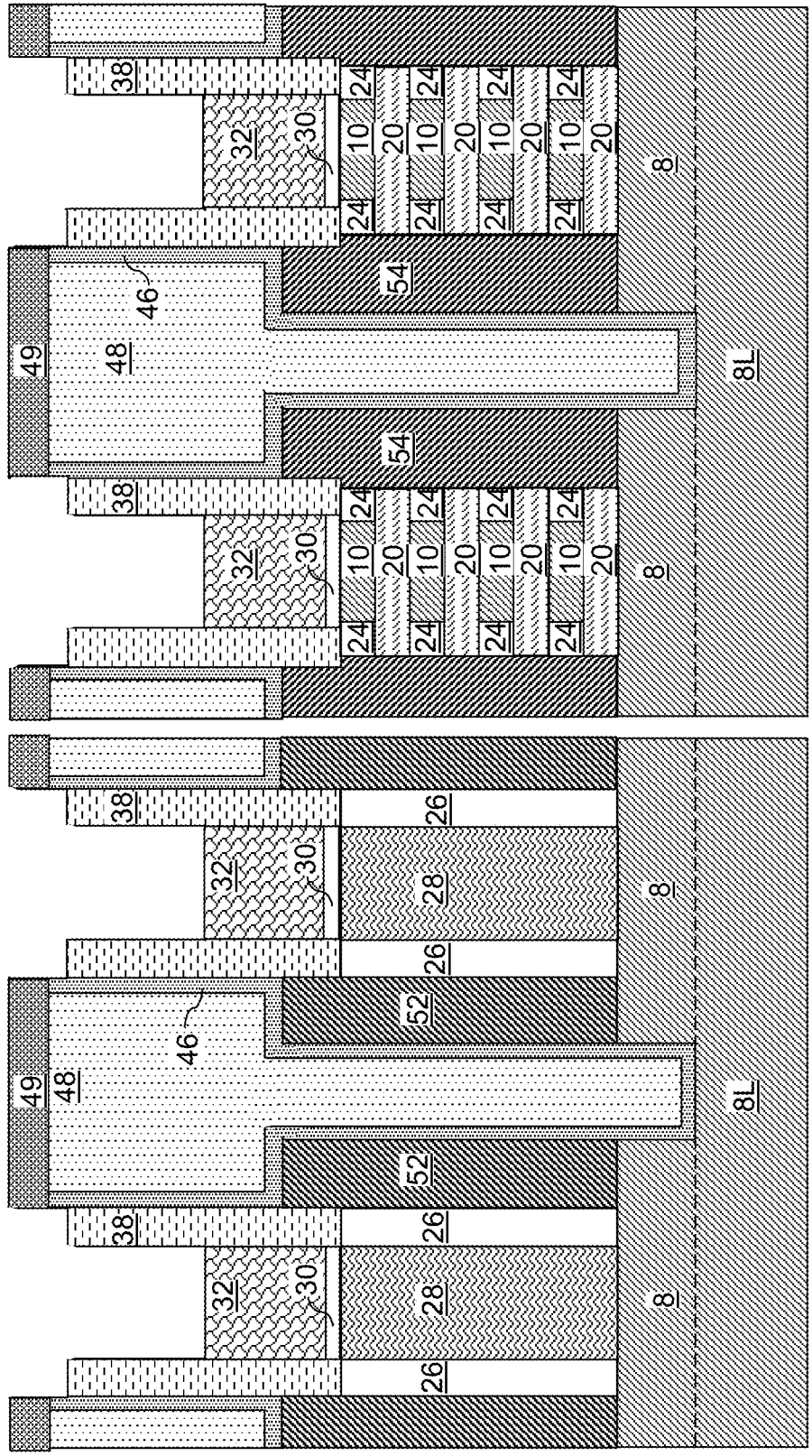
FIG. 23E is a vertical cross-sectional view along the vertical plane E-E' of FIG. 23B.
FIG. 23F is a vertical cross-sectional view along the vertical plane F-F' of FIG. 23B.

FIG. 23A is a vertical cross-sectional view of the exemplary structure after partially recessing the sacrificial gate structures according to an embodiment of the present disclosure. FIG. 23B is a top-down view of the exemplary structure of FIG. 23A. The vertical plane A-A' is the plane of the vertical cross-sectional view of FIG. 23A. FIG. 23C is a vertical cross-sectional view along the vertical plane C-C' of FIG. 23B. FIG. 23D is a vertical cross-sectional view along the vertical plane D-D' of FIG. 23B. FIG. 23E is a vertical cross-sectional view along the vertical plane E-E' of FIG. 23B. FIG. 23F is a vertical cross-sectional view along the vertical plane F-F' of FIG. 23B. Referring to FIGS. 23A-23F, an anisotropic etch process may be performed to partially etch physically exposed portions of the sacrificial gate structures 32 selective to the sacrificial gate liners 30.

FIG. 24A is a vertical cross-sectional view of the exemplary structure after removal of the etch barrier structures, the sacrificial gate structures, and the sacrificial gate liners according to an embodiment of the present disclosure. FIG. 24B is a top-down view of the exemplary structure of FIG. 24A. The vertical plane A-A' is the plane of the vertical cross-sectional view of FIG. 24A. FIG. 24C is a vertical cross-sectional view along the vertical plane C-C' of FIG. 24B. FIG. 24D is a vertical cross-sectional view along the vertical plane D-D' of FIG. 24B. FIG. 24E is a vertical cross-sectional view along the vertical plane E-E' of FIG. 24B. FIG. 24F is a vertical cross-sectional view along the vertical plane F-F' of FIG. 24B. Referring to FIGS. 24A-24F, the etch barrier structures 62 may be subsequently removed, for example, by ashing. The sacrificial gate structures 32 may be removed by an etch process. For example, a wet etch process using nitric acid, ammonium fluoride, potassium hydroxide, and/or hydrofluoric acid may be used. The sacrificial gate liners 30 may be subsequently removed by an isotropic etch process such as a wet etch process using dilute hydrofluoric acid. A gate cavity 31 is formed in each volume from which a sacrificial gate structure 32 and a sacrificial gate liner 30 are removed.

Figure 25F:
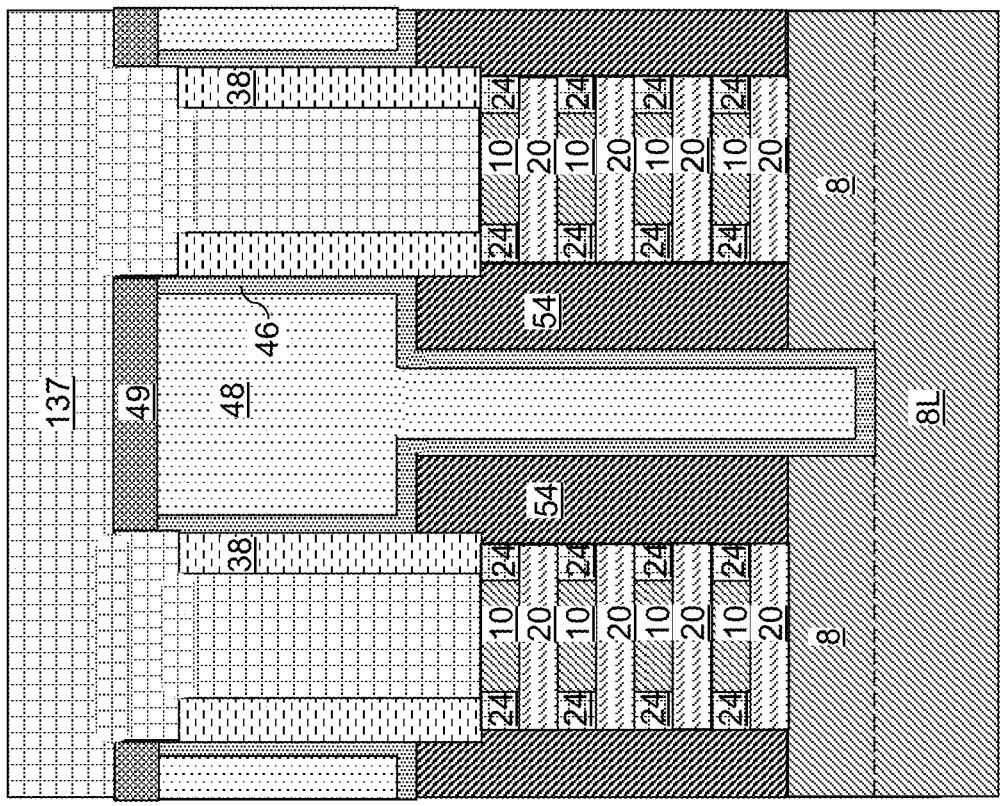
FIG. 25F is a vertical cross-sectional view along the vertical plane F-F' of FIG. 25B.
Figure 25E:
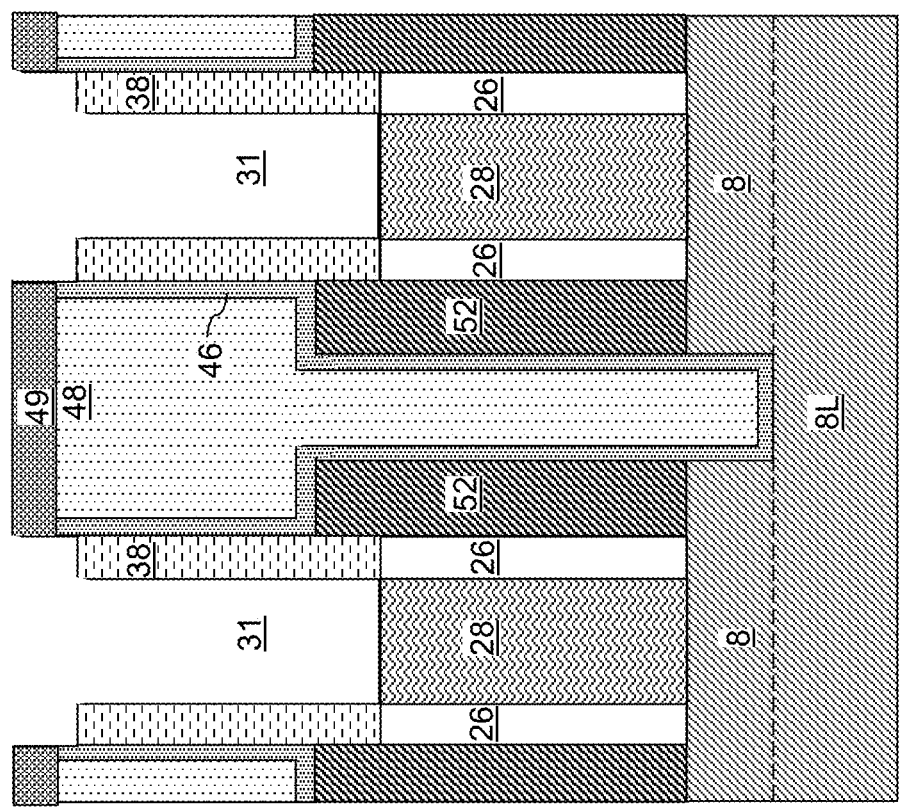
FIG. 25E is a vertical cross-sectional view along the vertical plane E-E' of FIG. 25B.

FIG. 25A is a vertical cross-sectional view of the exemplary structure after formation of a first etch mask layer and first gate cavities according to an embodiment of the present disclosure. FIG. 25B is a top-down view of the exemplary structure of FIG. 25A. The vertical plane A-A' is the plane of the vertical cross-sectional view of FIG. 25A. FIG. 25C is a vertical cross-sectional view along the vertical plane C-C' of FIG. 25B. FIG. 25D is a vertical cross-sectional view along the vertical plane D-D' of FIG. 25B. FIG. 25E is a vertical cross-sectional view along the vertical plane E-E' of FIG. 25B. FIG. 25F is a vertical cross-sectional view along the vertical plane F-F' of FIG. 25B. Referring to FIGS.

25A-25F, a first patterned etch mask 137 may be formed over the exemplary structure. The first patterned etch mask 137 may be a patterned photoresist layer that covers the second device region 200 and does not cover the first device region 100. A wet etch process that etches the material of the cladding silicon-germanium alloy structures 28 and the silicon-germanium plates 20 selective to the material of the silicon plates 10 may be performed. For example, if the silicon-germanium plates 20 include silicon-germanium plates, a wet etch process using a mixture of ammonium hydroxide and hydrogen peroxide may be used to remove the cladding silicon-germanium alloy structures 28 and the silicon-germanium plates 20. A plurality of suspended silicon plates 10 may be formed within each gate cavity 31. Each gate cavity 31 includes an empty volume formed by removal of the sacrificial gate structures 32, the sacrificial gate liners 30, the cladding silicon-germanium alloy structures 28, and the silicon-germanium plates 20 from the first device region 100, and underlies the horizontal plane including the top surfaces of the etch stop dielectric fins 18. Horizontal surfaces and vertical surfaces of the silicon plates 10 are physically exposed within each gate cavity 31 in the first device region 100. Each stack of silicon plates 10 located within a respective gate cavity 31 comprises channel portions of a first field effect transistor. The first patterned etch mask 137 may be subsequently removed, for example, by ashing.

Figure 26B:
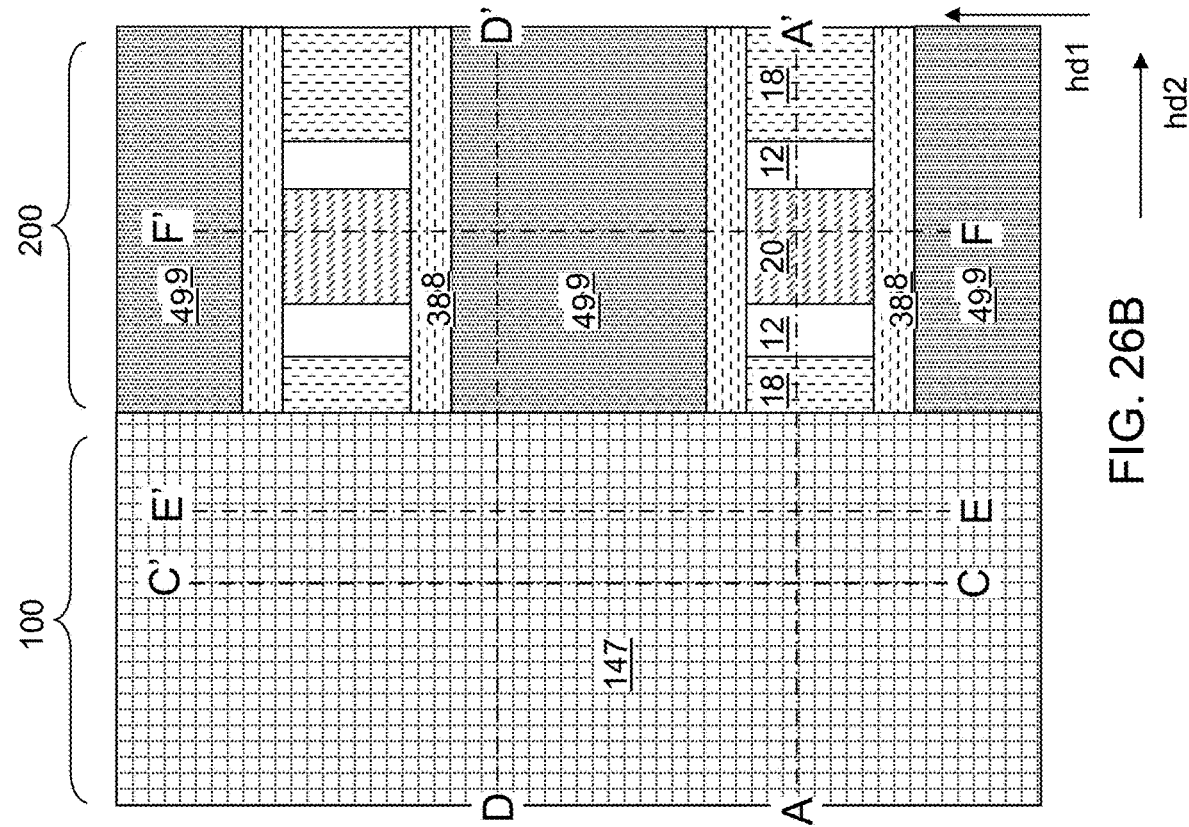
FIG. 26B is a top-down view of the exemplary structure of FIG. 26A. The vertical plane A-A' is the plane of the vertical cross-sectional view of FIG. 26A.
Figure 26A:
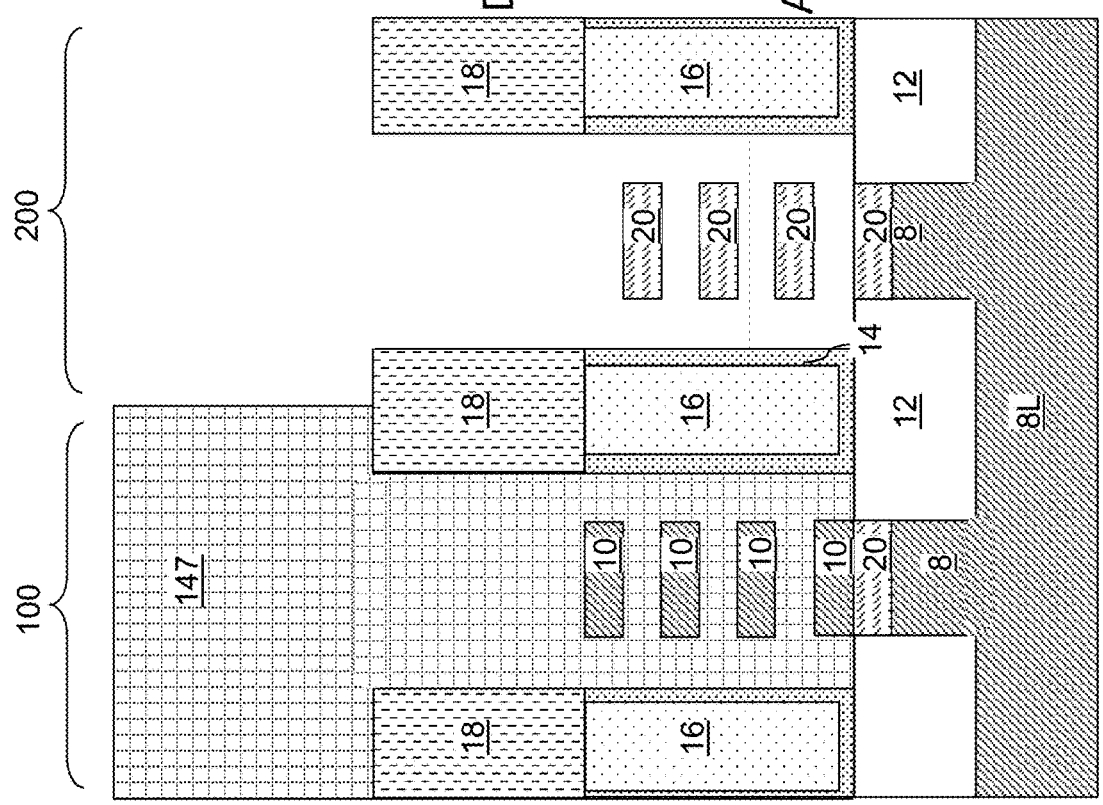
FIG. 26A is a vertical cross-sectional view of the exemplary structure after formation of a second etch mask layer and second gate cavities according to an embodiment of the present disclosure.
Figure 26D:
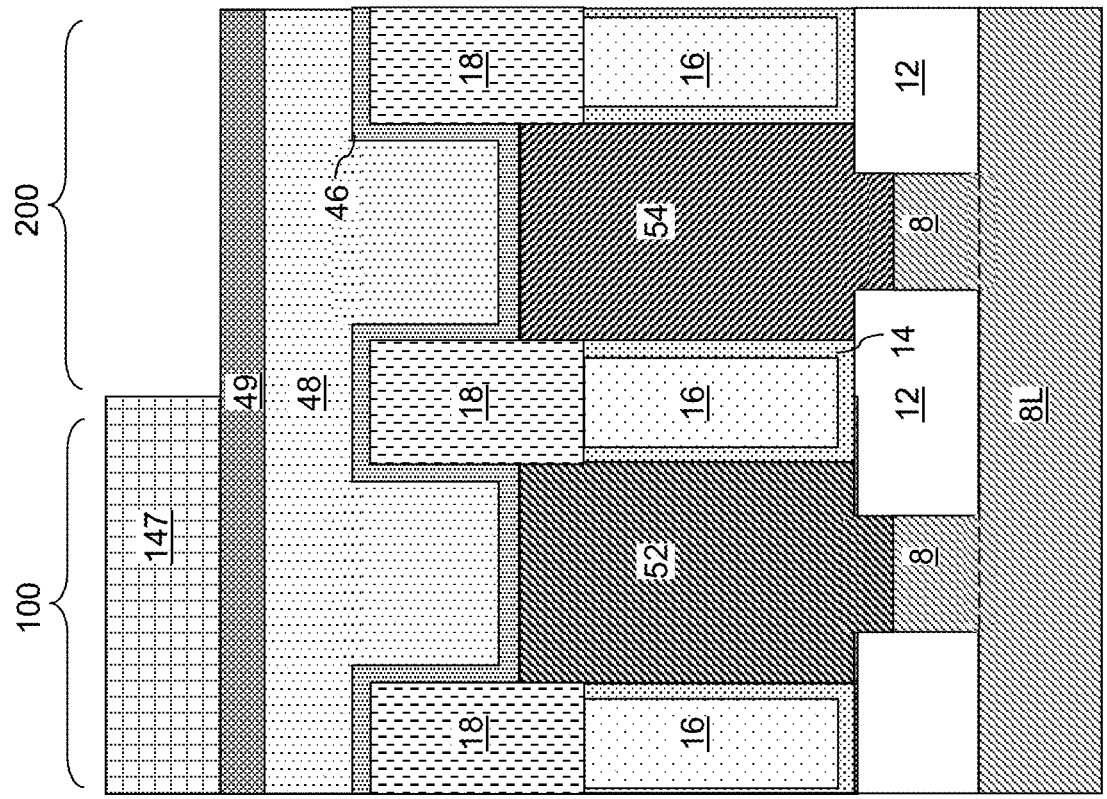
FIG. 26D is a vertical cross-sectional view along the vertical plane D-D' of FIG. 26B.
Figure 26C:
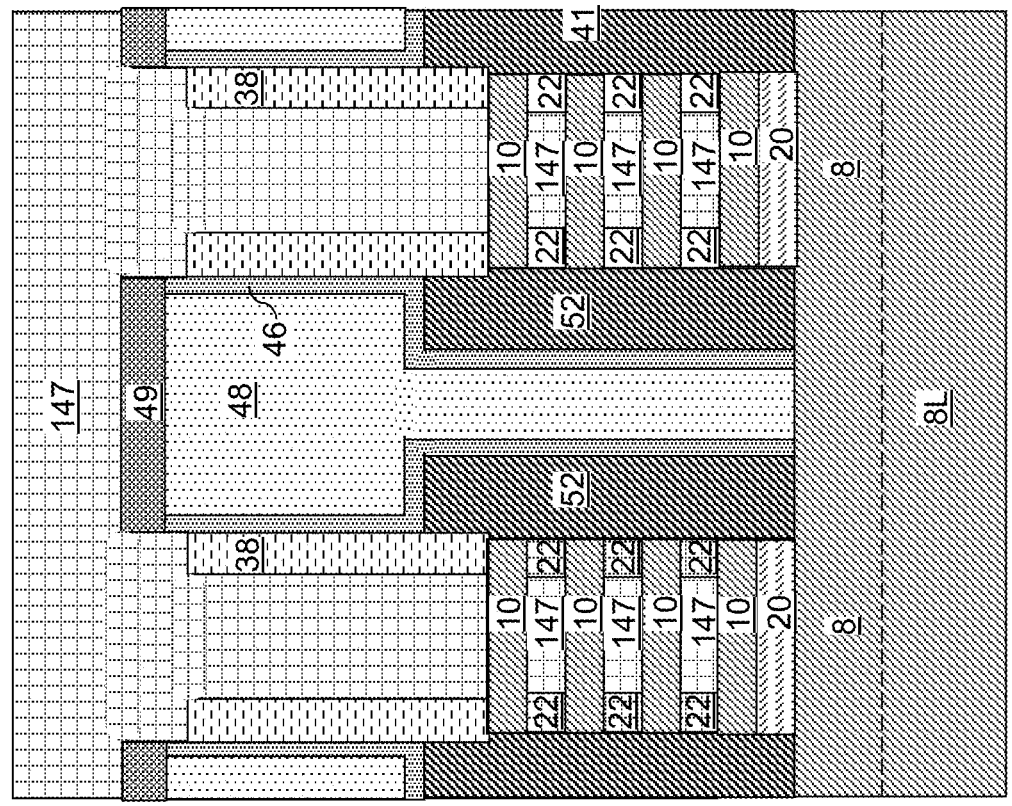
FIG. 26C is a vertical cross-sectional view along the vertical plane C-C' of FIG. 26B.

FIG. 26A is a vertical cross-sectional view of the exemplary structure after formation of a second etch mask layer and second gate cavities according to an embodiment of the present disclosure. FIG. 26B is a top-down view of the exemplary structure of FIG. 26A. The vertical plane A-A' is the plane of the vertical cross-sectional view of FIG. 26A. FIG. 26C is a vertical cross-sectional view along the vertical plane C-C' of FIG. 26B. FIG. 26D is a vertical cross-sectional view along the vertical plane D-D' of FIG. 26B. FIG. 26E is a vertical cross-sectional view along the vertical plane E-E' of FIG. 26B. FIG. 26F is a vertical cross-sectional view along the vertical plane F-F' of FIG. 26B. Referring to FIGS. 26A-25F, a second patterned etch mask 147 may be formed over the exemplary structure. The second patterned etch mask 147 may be a patterned photoresist layer that covers the first device region 100 and does not cover the second device region 200. A first wet etch process that etches the material of the cladding silicon-germanium alloy structures 28 selective to the materials of the silicon-germanium plates 20 and selective to the material of the silicon plates 10 may be performed. For example, a wet etch process using a mixture of dilute ammonium hydroxide and hydrogen peroxide may be used to remove the cladding silicon-germanium alloy structures 28 and the silicon-germanium plates 20. Subsequently, a second wet etch process may be performed to remove the silicon material of the second silicon plates 10 selective to the material of the second silicon-germanium plates 20. For example, a wet etch process using a mixture of nitric acid and ammonium fluoride and/or tetramethylammonium hydroxide (TMAH), and/or trimethyl-2 hydroxyethyl ammonium hydroxide (TMY). May be used. A plurality of suspended silicon-germanium plates 20 may be formed within each gate cavity 31. Each gate cavity 31 includes an empty volume formed by removal of the sacrificial gate structures 32, the sacrificial gate liners 30, the cladding silicon-germanium alloy structures 28, and the silicon plates 10 from the second device region 200, and underlies the horizontal plane including the top surfaces of the etch stop dielectric fins 18. Horizontal surfaces and vertical surfaces of the silicon-germanium plates 20 are physically exposed within each gate cavity 31 in the second device region 200. Each stack of silicon-germanium plates 20 located within a respective gate cavity 31 comprises channel portions of a second field effect transistor. The second patterned etch mask 147 may be subsequently removed, for example, by ashing.

Figure 27F:
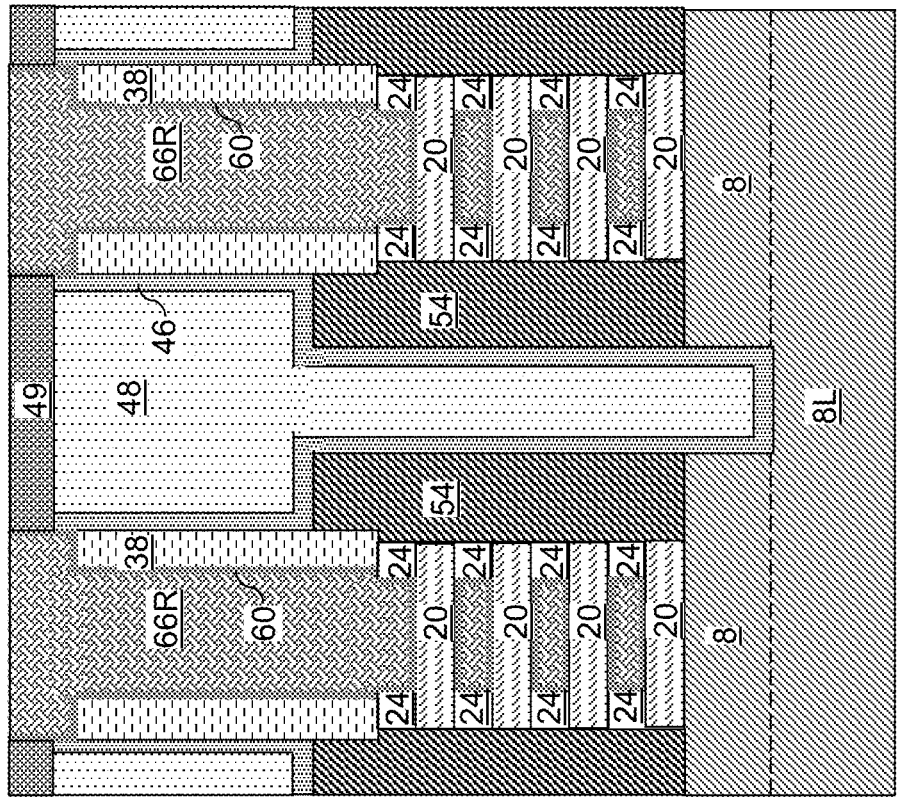
FIG. 27A is a vertical cross-sectional view of the exemplary structure after formation of gate dielectric layer and gate electrode rails according to an embodiment of the present disclosure.
FIG. 27B is a top-down view of the exemplary structure of FIG. 27A. The vertical plane A-A' is the plane of the vertical cross-sectional view of FIG. 27A.
FIG. 27C is a vertical cross-sectional view along the vertical plane C-C' of FIG. 27B.
FIG. 27D is a vertical cross-sectional view along the vertical plane D-D' of FIG. 27B.
FIG. 27E is a vertical cross-sectional view along the vertical plane E-E' of FIG. 27B.
Figure 27E:
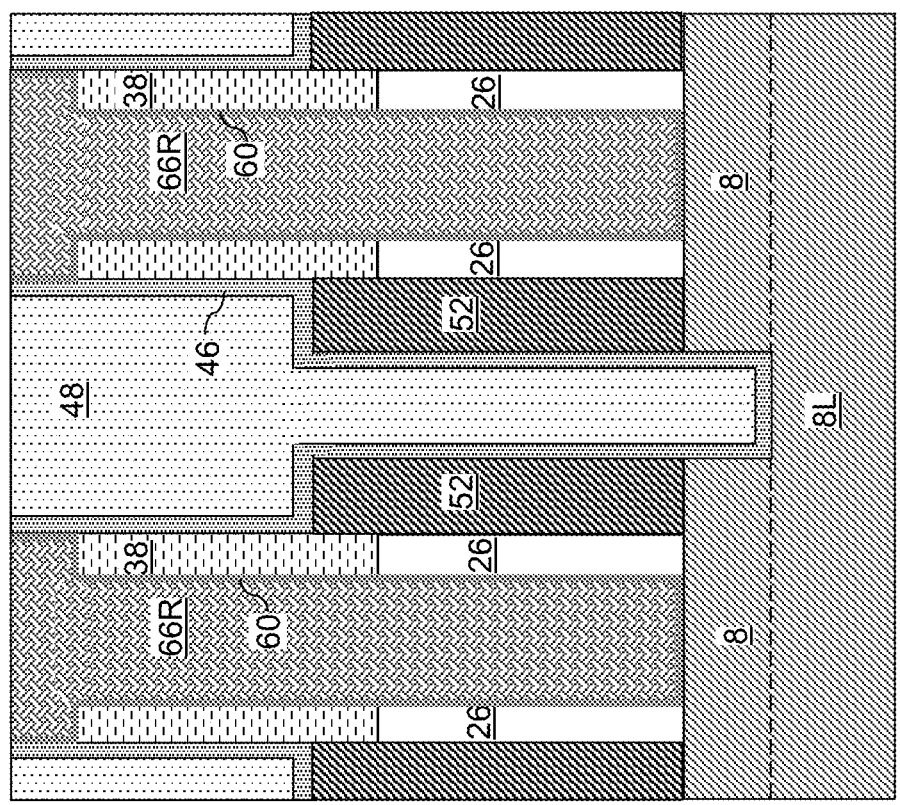

FIG. 27A is a vertical cross-sectional view of the exemplary structure after formation of gate dielectric layer and gate electrode rails according to an embodiment of the present disclosure. FIG. 27B is a top-down view of the exemplary structure of FIG. 27A. The vertical plane A-A' is the plane of the vertical cross-sectional view of FIG. 27A. FIG. 27C is a vertical cross-sectional view along the vertical plane C-C' of FIG. 27B. FIG. 27D is a vertical cross-sectional view along the vertical plane D-D' of FIG. 27B. FIG. 27E is a vertical cross-sectional view along the vertical plane E-E' of FIG. 27B. FIG. 27F is a vertical cross-sectional view along the vertical plane F-F' of FIG. 27B. Referring to FIGS. 27A-27F, a gate dielectric layer 60 and a gate electrode rail 66R may be formed within each gate cavity 31. For example, a continuous gate dielectric material layer may be conformally deposited, for example, by atomic layer deposition. The continuous gate dielectric material layer may include a dielectric metal oxide material having a dielectric constant greater than 7.9. Dielectric metal oxide materials having a dielectric constant greater than 7.9 are referred to high dielectric constant (high-k) metal oxide materials. Exemplary high-k dielectric metal oxide materials include, but are not limited to, aluminum oxide, hafnium oxide, yttrium oxide, lanthanum oxide, zirconium oxide, tantalum oxide, and strontium oxide. Optionally, the continuous gate dielectric material layer may additionally include a silicon oxide layer. The thickness of the continuous gate dielectric material layer may be in a range from 1 nm to 6 nm, such as from 1.5 nm to 3 nm, although lesser and greater thicknesses may also be used.

A continuous gate electrode metal layer may be deposited over the continuous gate dielectric material layer. The continuous gate electrode metal layer includes an optional metallic liner layer including a conductive metallic nitride material such as TiN, TaN, or WN, and a metallic fill material such as tungsten, ruthenium, molybdenum, cobalt, tantalum, or titanium.

Excess portions of the continuous gate electrode metal layer and the continuous gate dielectric material layer may be removed from above the horizontal plane including the top surfaces of the etch stop dielectric fins 18. A chemical mechanical planarization (CMP) process may be performed in which the top surfaces of the etch stop dielectric fins 18 are used as stopping surfaces. Each remaining portion of the continuous gate dielectric material layer comprises a gate dielectric layer 60. Each remaining portion of the continuous gate electrode material layer comprises a gate electrode rail 66R. Each gate dielectric layer 60 and each gate electrode rail 66R may laterally extend along the second horizontal direction hd2 over multiple stacks of silicon plates 10.

Generally, each combination of a sacrificial gate structures 32 and underlying middle portions of the silicon-germanium plates 20 is replaced with a combination of a gate dielectric layer 60 and a gate electrode rail 66R, which is subsequently divided into multiple gate electrodes.

Figure 28B:
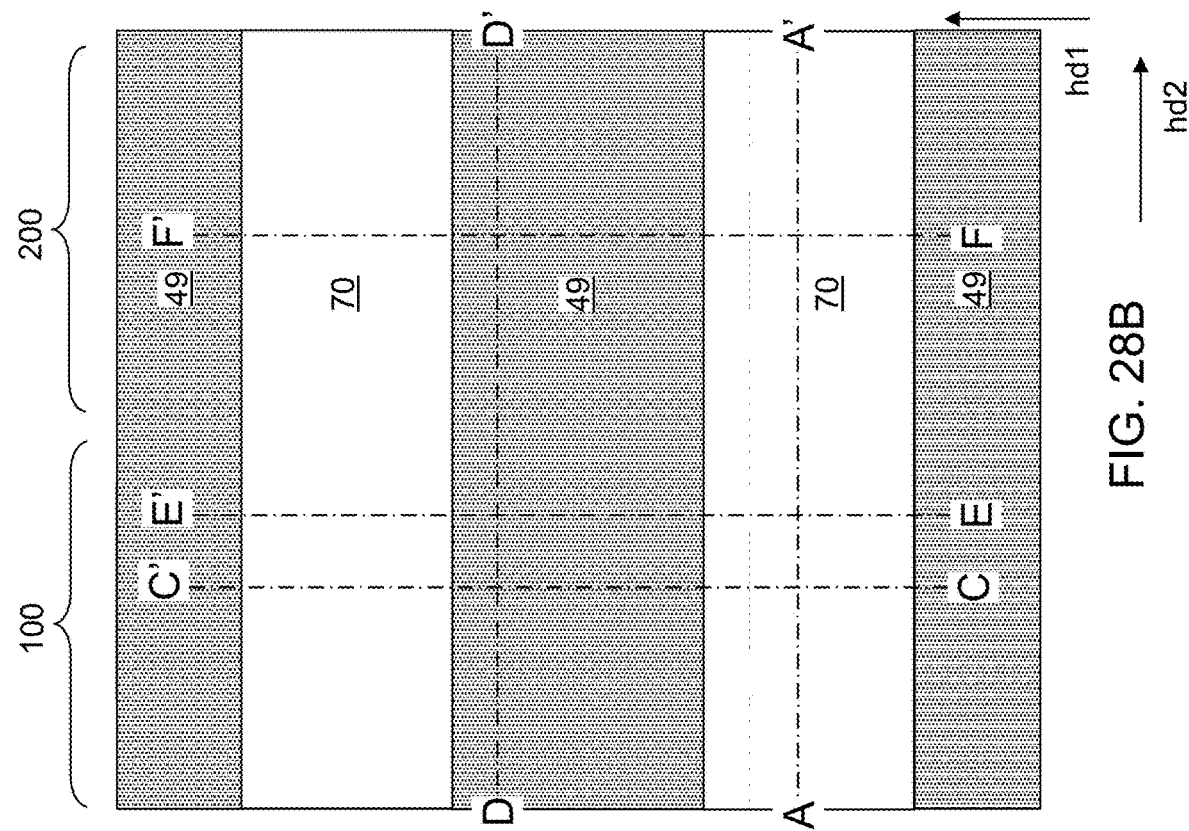
Figure 28A:
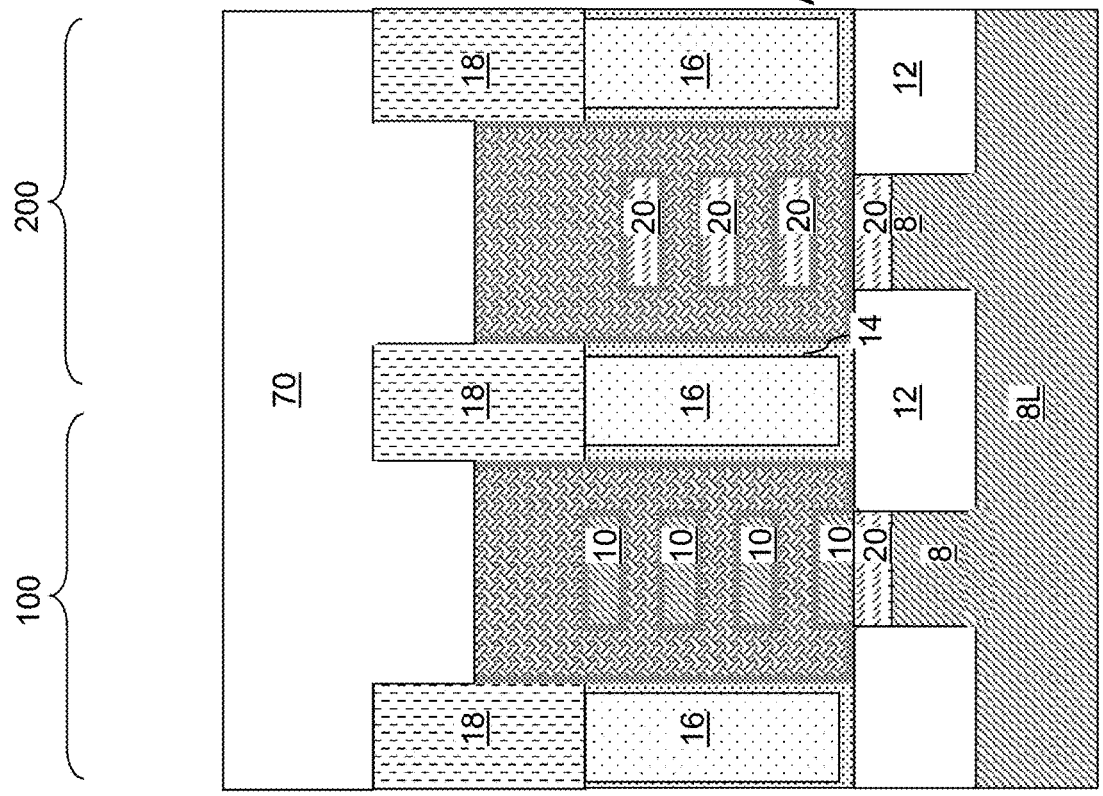

FIG. 28A is a vertical cross-sectional view of the exemplary structure after formation of gate stacks including a respective gate dielectric layer and a respective gate electrode and formation of a contact-level dielectric layer according to an embodiment of the present disclosure. FIG. 28B is a top-down view of the exemplary structure of FIG.

Figure 28F:
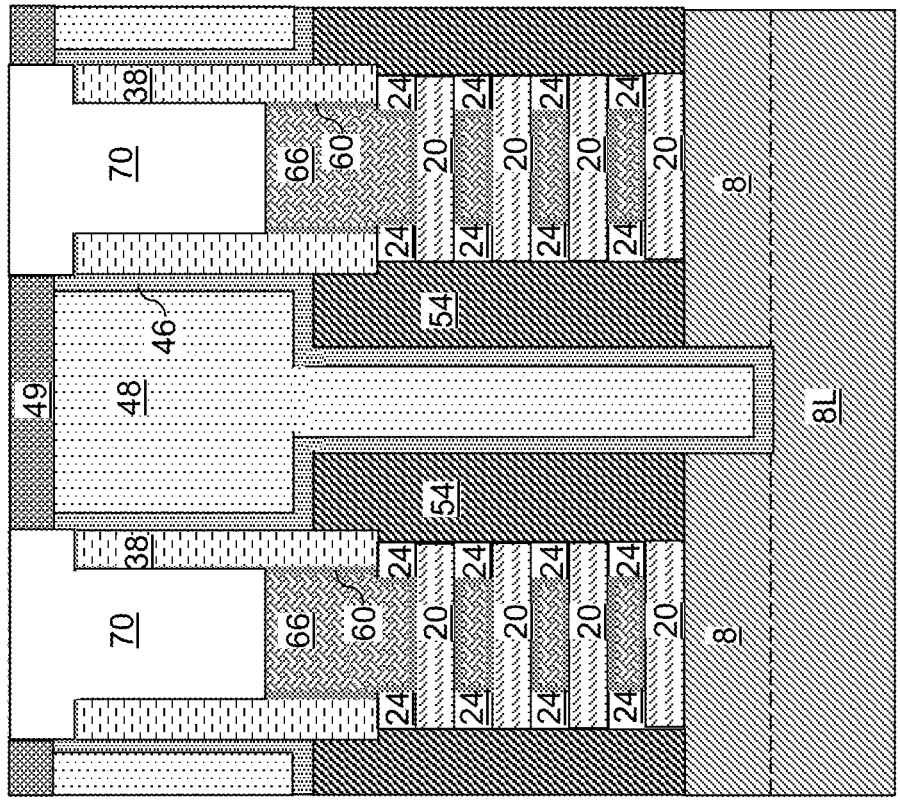
Figure 28E:
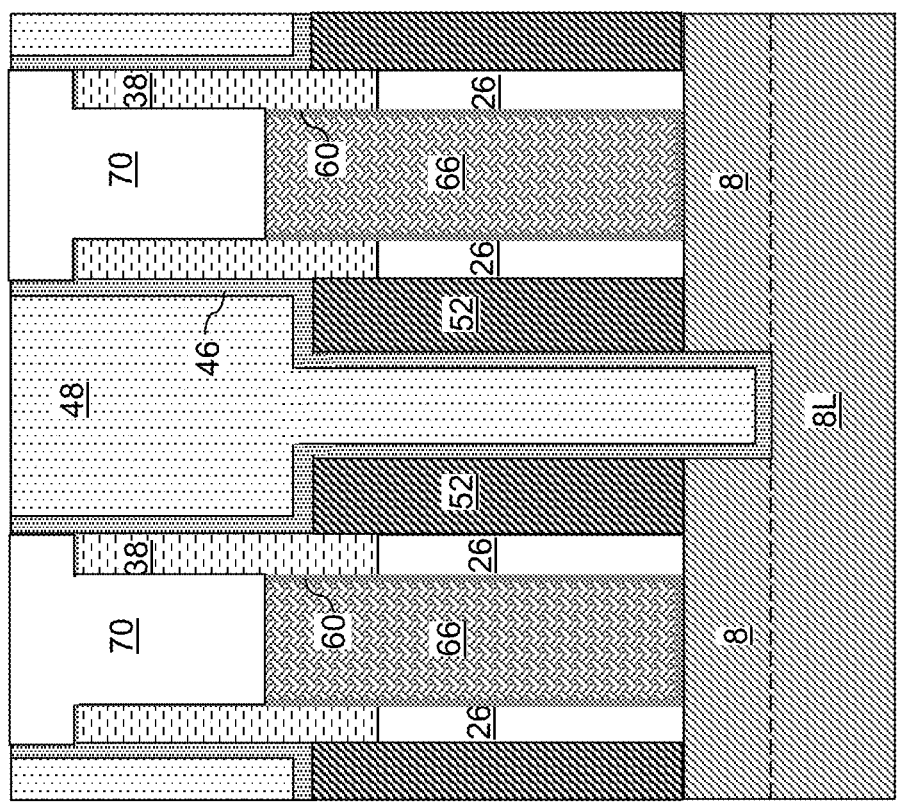

28A. The vertical plane A-A' is the plane of the vertical cross-sectional view of FIG. 28A. FIG. 28C is a vertical cross-sectional view along the vertical plane C-C' of FIG. 28B. FIG. 28D is a vertical cross-sectional view along the vertical plane D-D' of FIG. 28B. FIG. 28E is a vertical cross-sectional view along the vertical plane E-E' of FIG. 28B. FIG. 28F is a vertical cross-sectional view along the vertical plane F-F' of FIG. 28B. Referring to FIGS. 28A-28F, portions of the gate electrode rails 66R and the gate dielectric layers 60 that overlie the top surfaces of the inter-device isolation structures (46, 48, 49) may be removed by performing an etch back process. The etch back process may use an anisotropic etch process or an isotropic etch process. In one embodiment, top portions of the dielectric gate spacers 38 may be vertically recessed collaterally during the etch back process.

Each gate electrode rail 66R is divided into multiple gate electrodes 66. Each gate dielectric layer 60 may be divided into multiple gate dielectric layers 60. A combination of a gate dielectric layer 60 and a gate electrode 66 is formed in each gate cavity 31. Each gate dielectric layer 60 contacts, and surrounds, at least one silicon plate 10, which may include a plurality of silicon plates 10. A gate electrode 66 laterally surrounds each silicon plate 10 of a field effect transistor. Each first field effect transistor formed in a first device region 100 includes a respective subset of the silicon plates 10 having a doping of the first conductivity type and respective source/drain regions 52 having a doping of the second conductivity type. Each second field effect transistor formed in the second device region 200 includes a respective subset of the silicon plates 10 having a doping of the second conductivity type and respective source/drain regions 54 having a doping of the first conductivity type.

The top surfaces of the etch stop dielectric fins 18 are physically exposed after the etch back process. The etch back process vertically recesses top surfaces of the gate electrodes 66 below a horizontal plane including the top surfaces of the etch stop dielectric fins 18. The etch back process may vertically recess the top surface of each gate electrode by a vertical recess distance that is less than the height of the etch stop dielectric fins 18.

Each first field effect transistor formed in the first device region 100 may be a first semiconductor nanostructure. In one embodiment, the semiconductor nanostructure can include a GAA transistor. The semiconductor nanostructure (such as the GAA transistor), which includes a first gate structure (60-66). The first gate structure (60, 66) comprises a first gate dielectric layer 60 and a first gate electrode 66. Each second field effect transistor formed in the second device region 200 may be a second semiconductor nanostructure The semiconductor nanostructure (such as the GAA transistor), which includes a second gate structure (60, 66). The second gate structure (60, 66) comprises a second gate dielectric layer 60 and a second gate electrode 66. The first gate structure (60, 66) may be formed around middle portions of the first silicon plates 10 and the second gate structure (60, 66) may be formed around middle portions of the second silicon-germanium plates 20 by depositing and patterning a gate dielectric material layer and a gate electrode material layer. The first gate dielectric layer 60 and the second gate dielectric layer 60 may have the same material composition. The first gate electrode 66 and the second gate electrode 66 may have the same material composition.

A contact-level dielectric layer 70 may be deposited over the gate structures (60, 66). The contact-level dielectric layer 70 includes a dielectric fill material such as undoped silicate glass or a doped silicate glass. The dielectric fill material may be deposited by a conformal deposition process such as a chemical mechanical deposition process. Excess portions of the dielectric fill material may be removed from above the horizontal plane including the top surfaces of the inter-device isolation structures (46, 48, 49) by a planarization process such as a chemical mechanical planarization process. Subsequently, suitable contact via structures (not shown) and additional dielectric material layers (not shown) embedding metal interconnect structures (not shown) may be formed on the exemplary structure.

Referring to FIGS. 1A-28F and according to various embodiments of the present disclosure, a semiconductor structure is provided, which comprises: a first gate-all-around field effect transistor located over a substrate (which includes a substrate single crystalline semiconductor layer 8L) and comprising at least one silicon plate 10 (comprising a respective silicon channel), a first gate structure (60, 66) including a first gate dielectric layer 60 and a first gate electrode 66 and surrounding each middle portion of the at least one silicon plate 10, a first source region (which is one of the first source/drain regions 52) located on a first end of the at least one silicon plate 10, and a first drain region (which is another of the first source/drain regions 52) located on a second end of the at least one silicon plate 10; and a second gate-all-around field effect transistor located over the substrate, laterally spaced from the first gate-all-around field effect transistor, and comprising at least one silicon-germanium plate 20, a second gate structure (60, 66) including a second gate dielectric layer 60 and a second gate electrode 66 and surrounding each middle portion of the at least one silicon-germanium plate 20, a second source region (which is one of the second source/drain regions 54) located on a first end of the at least one silicon-germanium plate 20, and a second drain region (which is another of the second source/drain regions 54) located on a second end of the at least one silicon-germanium plate 20. The first gate electrode 66 and the second gate electrode 66 comprise a same conductive material.

In one embodiment, the at least one silicon plate 10 has a p-type doping, the first source region 52 and the first drain region 52 have an n-type doping, the at least one silicon-germanium plate 20 has an n-type doping, and the second source region 54 and the second drain region 54 have a p-type doping. In one embodiment, each of the at least one silicon plate 10 and each of the at least one silicon-germanium plate 20 is single crystalline, and each crystallographic orientation having a same Miller index is orientated along a same direction as the at least one silicon plate 10 and the at least one silicon-germanium plate 20.

In one embodiment, the first gate dielectric layer 60 of the first GAA field effect transistor and the second gate dielectric layer 60 of the second GAA field effect transistor comprise a same dielectric material and have a same thickness. In one embodiment, the same dielectric material comprises, and/or consists essentially of, a dielectric metal oxide having a dielectric constant greater than 7.9, and the same conductive material of the first gate electrode 66 of the first GAA field effect transistor and the second gate electrode 66 of the second GAA field effect transistor comprises a metallic material such as at least one elemental metal (such as W, Ti, Ta, Mo, Co, and/or Ru), at least one intermetallic alloy, or at least one conductive metallic nitride (such as TiN, TaN, and/or WN).

In one embodiment, each of the first source region 52 and the first drain region 52 of a first GAA field effect transistor is laterally spaced from the first gate structure (60, 66) by a respective dielectric channel spacer (22, 26). In this embodiment, the respective dielectric channel spacer (22, 26) has a lesser thickness (i.e., the thickness of a first inner dielectric channel spacer 22) in regions that overlie or underlie the at least one silicon plate 10 than in regions that do not overlie or underlie the at least one silicon plate 10 (which has the thickness of an outer dielectric channel spacer 26), for example, as illustrated in FIG. 17G. In one embodiment, each of the second source region 54 and the second drain region 54 of a second GAA field effect transistor is laterally spaced from the second gate structure (60, 66) by a respective dielectric channel spacer (24, 26). In this embodiment, the respective dielectric channel spacer (22, 26) has a lesser thickness (i.e., the thickness of a second inner dielectric channel spacer 24) in regions that overlie or underlie the at least one silicon-germanium plate 20 than in regions that do not overlie or underlie the at least one silicon-germanium plate 20 (which has the thickness of an outer dielectric channel spacer 26), for example, as illustrated in FIG. 17F.

In one embodiment, each bottom surface of the at least one silicon-germanium plate 20 may be located within a horizontal plane including a top surface of a respective one of the at least one silicon plate 10, and each top surface of the at least one silicon-germanium plate 20 may be located within a horizontal plane including a bottom surface of a respective one of the at least one silicon plate 10.

According to another embodiment of the present disclosure, a semiconductor structure is provided, which comprises: an n-type gate-all-around (GAA) field effect transistor (such as a first GAA field effect transistor) located over a substrate (which includes a substrate single crystalline semiconductor layer 8L) and comprising at least one p-doped plate (such as at least one silicon plate 10), a first gate structure (60, 66) including a first gate dielectric layer 60 and a first gate electrode 66 and surrounding each middle portion of the at least one p-doped plate, an n-doped source region (i.e., one of the first source/drain regions 52) located on a first end of the at least one p-doped plate (such as the at least one silicon plate 10), and an n-doped drain region (i.e., another of the first source/drain regions 52) located on a second end of the at least one p-doped plate (such as the at least one silicon plate 10. The semiconductor structure further comprises a p-type gate-all-around (GAA) field effect transistor located over the substrate, laterally spaced from the n-type gate-all-around (GAA) field effect transistor, and comprising at least one n-doped plate (such as at least one silicon-germanium plate 20), a second gate structure (60, 66) including a second gate dielectric layer 60 and a second gate electrode 66 and surrounding each middle portion of the at least one n-doped plate (such as the at least one silicon-germanium plate 20), a p-doped source region (i.e., one of the second source/drain regions 54) located on a first end of the at least one p-doped plate, and a p-doped drain region (i.e., another of the source/drain regions 54) located on a second end of the at least one p-doped plate. Each bottom surface of the at least one n-doped plate (such as the at least one silicon-germanium plate 20) is located within a horizontal plane including a top surface of a respective one of the at least one p-doped plate (such as the at least one silicon plate 10). And each top surface of the at least one n-doped plate (such as the at least one silicon-germanium plate 20) is located within a horizontal plane including a bottom surface of a respective one of the at least one p-doped plate (such as the at least one silicon plate 10).

In one embodiment, the at least one p-doped plate (such as the at least one silicon plate 10) comprises a p-doped single crystalline silicon material, and the n-doped source region (such as a first source/drain region 52) and the n-doped drain region (such as another first source/drain region 52) comprise an n-doped single crystalline semiconductor material. In one embodiment, the at least one n-doped plate (such as the at least one silicon-germanium plate 20) comprises an n-doped single crystalline silicon-germanium alloy, and the p-doped source region (such as a second source/drain region 54) and the p-doped drain region (such as another second source/drain region 54) comprise a p-doped single crystalline semiconductor material.

In one embodiment, each of the at least one p-doped plate (such as each silicon plate 10) and each of the at least one n-doped plate (such as each silicon-germanium plate 20) is single crystalline, and each crystallographic orientation having a same Miller index is orientated along a same direction as the at least one p-doped plate and the at least one n-doped plate. In one embodiment, the first gate dielectric layer 60 and the second gate dielectric layer 60 comprise a same dielectric material, and the first gate electrode 66 and the second gate electrode 66 comprise a same conductive material.

In one embodiment, the semiconductor structure comprises: an etch stop dielectric fin 18 located between the n-type gate-all-around field effect transistor and the p-type gate-all-around field effect transistor, and a hybrid dielectric fin (14, 16) underlying the etch stop dielectric fin 18 and comprising a dielectric fin liner 14 embedding a silicon oxide fill material portion 16 and located between the n-type gate-all-around field effect transistor and the p-type gate-all-around field effect transistor.

In one embodiment, the first gate structure (60, 66) contacts first sidewalls of the etch stop dielectric fin 18 and the hybrid dielectric fin (14, 16); the second gate structure (60, 66) contacts second sidewalls of the etch stop dielectric fin 18 and the hybrid dielectric fin (14, 16); and an interface between the etch stop dielectric fin 18 and the hybrid dielectric fin (14, 16) is located within a horizontal plane including a topmost surface of the at least one p-doped plate (such as the top surface of the topmost silicon plate 10) and is located above a horizontal plane including a topmost surface of the at least one n-doped plate (such as the top surface of the topmost silicon-germanium plate 20).

In one embodiment, each of the p-doped source region (i.e., one of the second source/drain region 54) and the p-doped drain region (i.e., another of the second source/drain region 54) is laterally spaced from the second gate structure (60, 66) by a respective dielectric channel spacer (24, 26); and the respective dielectric channel spacer (24, 26) has a lesser thickness in regions that overlie or underlie the at least one n-doped plate (such as the at least one silicon-germanium plate 20) than in regions that do not overlie or underlie the at least one n-doped plate (which has the thickness of an outer dielectric channel spacer 26), for example, as illustrated in FIG. 17F. In one embodiment, each of the n-doped source region (i.e., one of the first source/drain region 52) and the n-doped drain region (i.e., another of the first source/drain region 52) is laterally spaced from the first gate structure (60, 66) by a respective dielectric channel spacer (22, 26); and the respective dielectric channel spacer (22, 26) has a lesser thickness in regions that overlie or underlie the at least one p-doped plate (such as the at least one silicon plate 10) than in regions that do not overlie or underlie the at least one n-doped plate (which has the thickness of an outer dielectric channel spacer 26), for example, as illustrated in FIG. 17G.

Figure 29:
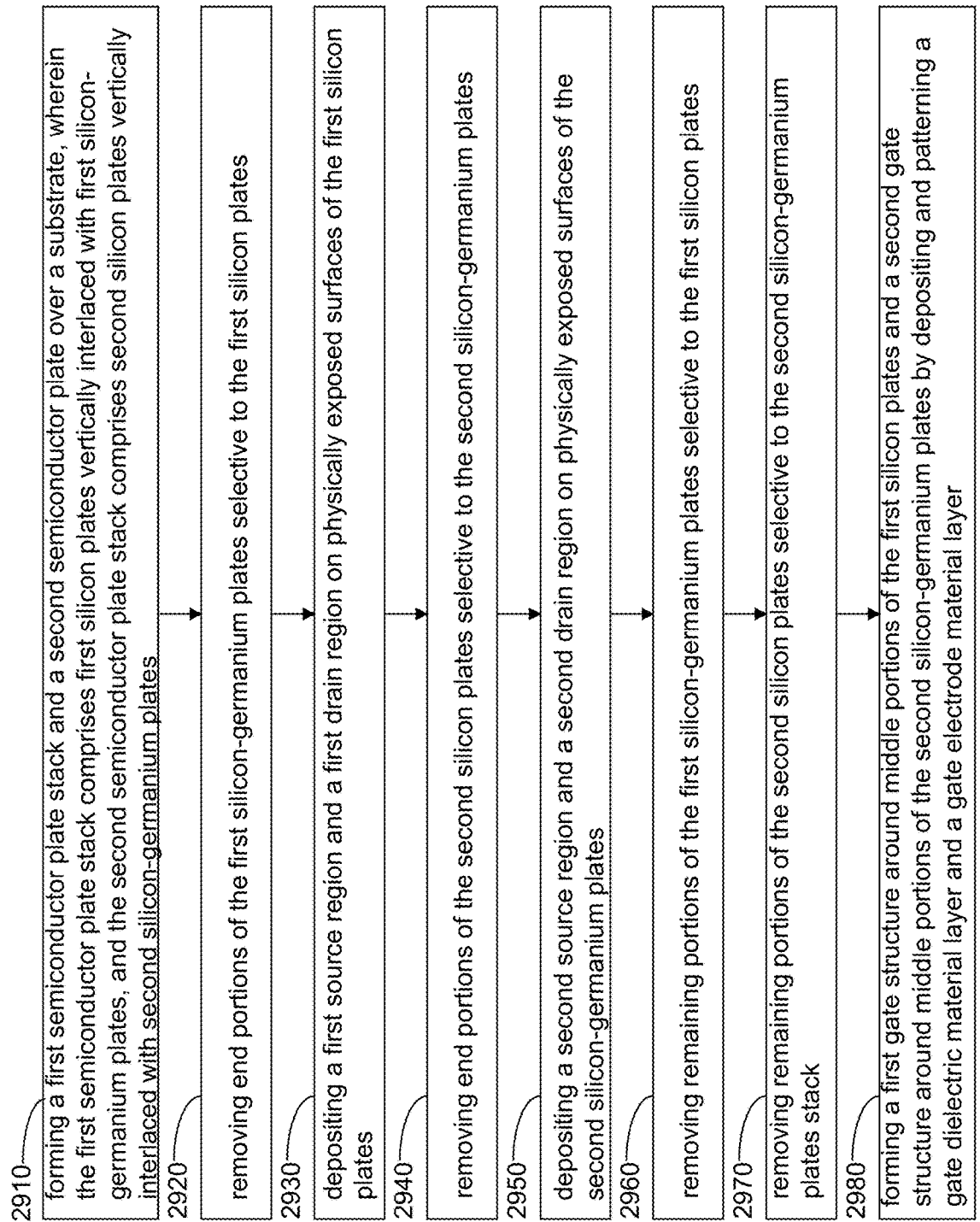

FIG. 29 is a flowchart illustrating steps for forming an exemplary structure of the present disclosure according to an embodiment of the present disclosure. Referring to step 2910 and FIGS. 1A-2B, a first semiconductor plate stack (10, 20) and a second semiconductor plate stack (10, 20) are formed over a substrate. The first semiconductor plate stack (10, 20) comprises first silicon plates 10 vertically interlaced with first silicon-germanium plates 20, and is formed in a first device region 100. The second semiconductor plate stack (10, 20) comprises second silicon plates 10 vertically interlaced with second silicon-germanium plates 20, and is formed in the second device region 200.

Referring to step 2920 and FIGS. 3A-15F, end portions of the first silicon-germanium plates 20 are removed selective to the first silicon plates 10 in the first device region 100. Referring to step 2930 and FIGS. 16A-16E, end portions of the second silicon plates 10 are removed selective to the second silicon-germanium plates 20 in the second device region 200. Referring to step 2940 and FIGS. 17A-18H, a first source region (such as one of the first source/drain regions 52) and a first drain region (such as another of the first source/drain regions 52) may be deposited on physically exposed surfaces of the first silicon plates 10. Referring to step 2950 and FIGS. 19A-19F, a second source region (such as one of the second source/drain regions 54) and a second drain region (such as another of the source/drain regions 54) may be grown on physically exposed surfaces of the second silicon-germanium plates 20.

Referring to step 2960 and FIGS. 20A-25F, remaining portions of the first silicon-germanium plates 20 may be removed selective to the first silicon plates 10 in the first device region 100. Referring to step 2970 and FIGS. 26A-26F, remaining portions of the second silicon plates 10 may be removed selective to the second silicon-germanium plates 20 in the second device region 200. Referring to step 2980 and FIGS. 27A-28F, a first gate structure (60, 66) may be formed around middle portions of the first silicon plates 10, and a second gate structure (60, 66) may be formed around middle portions of the second silicon-germanium plates 20. This step may be accomplished by depositing and patterning a gate dielectric material layer and a gate electrode material layer.

The various methods and structures of the present disclosure may be used to provide a combination of two types of gate-all-around (GAA) field effect transistors on a same substrate that have optimized gate work functions for each type of GAA field effect transistors while using a same gate dielectric material and a same gate electrode material. A first type GAA field effect transistor may use a silicon channel, and a second type GAA field effect transistor may use a silicon-germanium channel. Alternatively or additionally, a first type GAA field effect transistor may use an p-doped channel to provide an n-type field effect transistor, and a second type GAA field effect transistor may use an n-doped channel to provide a p-type field effect transistor. The simultaneous optimization of the work functions of the two types of GAA field effect transistor despite use of a common gate electrode metal may be accomplished by using different material compositions in the first semiconductor channels of the first type field effect transistors and the second semiconductor channels of the second type field effect transistor. For example, the first semiconductor channels may include silicon, and the second semiconductor channels may include a silicon-germanium alloy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a first gate-all-around field effect transistor located over a substrate and comprising:
  at least one silicon plate;
  a first gate structure including a first gate dielectric layer and a first gate electrode and surrounding each middle portion of the at least one silicon plate;
  a first source region located on a first end of the at least one silicon plate; and
  a first drain region contacting a second end of the at least one silicon plate at an interface that is located within a vertical plane that is perpendicular to a separation direction between the first source region and the first drain region; and
 a second gate-all-around field effect transistor located over the substrate, laterally spaced from the first gate-all-around field effect transistor, and comprising:
  at least one silicon-germanium plate;
  a second gate structure including a second gate dielectric layer and a second gate electrode and surrounding each middle portion of the at least one silicon-germanium plate;
  a second source region located on a first end of the at least one silicon-germanium plate; and
  a second drain region located on a second end of the at least one silicon-germanium plate.

2. The semiconductor structure of claim 1, wherein:
 the at least one silicon plate has a p-type doping;
 the first source region and the first drain region have an n-type doping;
 the at least one silicon-germanium plate has an n-type doping; and
 the second source region and the second drain region have a p-type doping.

3. The semiconductor structure of claim 1, wherein:
 each of the at least one silicon plate and each of the at least one silicon-germanium plate is single crystalline; and
 each crystallographic orientation having a same Miller index is orientated along a same direction as the at least one silicon plate and the at least one silicon-germanium plate.

4. The semiconductor structure of claim 1, wherein the first gate dielectric layer and the second gate dielectric layer comprise a same dielectric material and have a same thickness.

5. The semiconductor structure of claim 4, wherein:
 the same dielectric material comprises a dielectric metal oxide having a dielectric constant greater than 7.9; and
 the same conductive material of the first gate electrode and the second gate electrode comprises a metallic material.

6. The semiconductor structure of claim 1, wherein:
 each of the first source region and the first drain region is laterally spaced from the first gate structure by a respective dielectric channel spacer; and
 the respective dielectric channel spacer has a lesser thickness in regions that overlie or underlie the at least one silicon plate than in regions that do not overlie or underlie the at least one silicon plate.

7. The semiconductor structure of claim 1, wherein:
each bottom surface of the at least one silicon-germanium plate is located within a horizontal plane including a top surface of a respective one of the at least one silicon plate; and
each top surface of the at least one silicon-germanium plate is located within a horizontal plane including a bottom surface of a respective one of the at least one silicon plate.

8. A semiconductor structure comprising:
an n-type gate-all-around field effect transistor located over a substrate and comprising:
at least one p-doped plate;
a first gate structure including a first gate dielectric layer and a first gate electrode and surrounding each middle portion of the at least one p-doped plate;
an n-doped source region located on a first end of the at least one p-doped plate; and
an n-doped drain region located on a second end of the at least one p-doped plate; and
a p-type gate-all-around field effect transistor located over the substrate, laterally spaced from the n-type gate-all-around field effect transistor, and comprising:
at least one n-doped plate;
a second gate structure including a second gate dielectric layer and a second gate electrode and surrounding each middle portion of the at least one n-doped plate;
a p-doped source region located on a first end of the at least one p-doped plate; and
a p-doped drain region located on a second end of the at least one p-doped plate, wherein:
each bottom surface of the at least one n-doped plate is located within a horizontal plane including a top surface of a respective one of the at least one p-doped plate; and
each top surface of the at least one n-doped plate is located within a horizontal plane including a bottom surface of a respective one of the at least one p-doped plate.

9. The semiconductor structure of claim 8, wherein:
the at least one p-doped plate comprises a p-doped single crystalline silicon material;
the n-doped source region and the n-doped drain region comprise an n-doped single crystalline semiconductor material;
the at least one n-doped plate comprises an n-doped single crystalline silicon-germanium alloy; and
the p-doped source region and the p-doped drain region comprise a p-doped single crystalline semiconductor material.

10. The semiconductor structure of claim 8, wherein:
each of the at least one p-doped plate and each of the at least one n-doped plate is single crystalline; and
each crystallographic orientation having a same Miller index is orientated along a same direction as the at least one p-doped plate and the at least one n-doped plate.

11. The semiconductor structure of claim 8, wherein:
the first gate dielectric layer and the second gate dielectric layer comprise a same dielectric material; and
the first gate electrode and the second gate electrode comprise a same conductive material.

12. The semiconductor structure of claim 8, further comprising:
an etch stop dielectric fin located between the n-type gate-all-around field effect transistor and the p-type gate-all-around field effect transistor; and
a hybrid dielectric fin underlying the etch stop dielectric fin and comprising a dielectric fin liner embedding a silicon oxide fill material portion and located between the n-type gate-all-around field effect transistor and the p-type gate-all-around field effect transistor.

13. The semiconductor structure of claim 12, wherein:
the first gate structure contacts first sidewalls of the etch stop dielectric fin and the hybrid dielectric fin;
the second gate structure contacts second sidewalls of the etch stop dielectric fin and the hybrid dielectric fin; and
an interface between the etch stop dielectric fin and the hybrid dielectric fin is located within a horizontal plane including a topmost surface of the at least one p-doped plate and is located above a horizontal plane including a topmost surface of the at least one n-doped plate.

14. The semiconductor structure of claim 8, wherein:
each of the p-doped source region and the p-doped drain region is laterally spaced from the second gate structure by a respective dielectric channel spacer; and
the respective dielectric channel spacer has a lesser thickness in regions that overlie or underlie the at least one n-doped plate than in regions that do not overlie or underlie the at least one n-doped plate.

15. A method of forming a semiconductor structure, comprising:
forming a first semiconductor plate stack and a second semiconductor plate stack over a substrate, wherein the first semiconductor plate stack comprises first silicon plates vertically interlaced with first silicon-germanium plates, and the second semiconductor plate stack comprises second silicon plates vertically interlaced with second silicon-germanium plates;
removing end portions of the first silicon-germanium plates selective to the first silicon plates;
removing end portions of the second silicon plates selective to the second silicon-germanium plates;
depositing a first source region and a first drain region on physically exposed surfaces of the first silicon plates;
depositing a second source region and a second drain region on physically exposed surfaces of the second silicon-germanium plates;
removing remaining portions of the first silicon-germanium plates selective to the first silicon plates;
removing remaining portions of the second silicon plates selective to the second silicon-germanium plates; and
forming a first gate structure around middle portions of the first silicon plates and a second gate structure around middle portions of the second silicon-germanium plates by depositing and patterning a gate dielectric material layer and a gate electrode material layer.

16. The method of claim 15, further comprising:
epitaxially growing a vertically interlaced stack of silicon layers and silicon-germanium layers on a single crystalline semiconductor material of the substrate; and
patterning the vertically interlaced stack, wherein patterned portions of the vertically interlaced stack include the first semiconductor plate stack and the second semiconductor plate stack.

17. The method of claim 15, wherein:
the first source region and the first drain region are deposited by performing a first selective epitaxy process that grows first single crystalline semiconductor material portions from the physically exposed surfaces of the first silicon plates; and
the second source region and the second drain region are deposited by performing a second selective epitaxy process that grows second single crystalline semiconductor material portions from the physically exposed surfaces of the second silicon-germanium plates.

18. The method of claim 15, wherein:

the first gate structure comprises a first gate dielectric layer and a first gate electrode;

the second gate structure comprises a second gate dielectric layer and a second gate electrode;

the first gate dielectric layer and the second gate dielectric layer are formed on the first silicon plates and the second silicon-germanium plates, respectively; and the first gate electrode and the second gate electrode are formed on the first gate dielectric layer and the second gate dielectric layer, respectively.

19. The method of claim 15, further comprising:

forming a sacrificial gate structure and a dielectric gate spacer over a middle portion of the first semiconductor plate stack and over a middle portion of the second semiconductor plate stack prior to removing end portions of the first silicon-germanium plates and prior to removing end portions of the second silicon plates; and removing the sacrificial gate structure after formation of the first source region, the first drain region, the second source region, and the second drain region.

20. The method of claim 19, wherein:

removing the remaining portions of the first silicon-germanium plates selective to the first silicon plates comprises isotropically etching the remaining portions of the first silicon-germanium plates while masking a region including the second silicon-germanium plates with a first patterned etch mask layer; and removing the remaining portions of the second silicon plates selective to the second silicon-germanium plates comprises isotropically etching the remaining portions of the second silicon plates while masking a region including the first silicon plates with a second patterned etch mask layer.

\* \* \* \* \*